US011620938B2

(12) United States Patent
Shin et al.

(10) Patent No.: US 11,620,938 B2
(45) Date of Patent: Apr. 4, 2023

(54) DISPLAY DEVICE AND TILED DISPLAY INCLUDING THE SAME

(71) Applicant: Samsung Display Co., LTD., Yongin-si (KR)

(72) Inventors: Dong Hee Shin, Asan-si (KR); Na Hyeon Cha, Yongin-si (KR); Sun Kwun Son, Suwon-si (KR); Kye Uk Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/535,112

(22) Filed: Nov. 24, 2021

(65) Prior Publication Data

US 2022/0301493 A1    Sep. 22, 2022

(30) Foreign Application Priority Data

Mar. 16, 2021    (KR) .................. 10-2021-0033697

(51) Int. Cl.
*G09G 3/32*    (2016.01)

(52) U.S. Cl.
CPC .......... *G09G 3/32* (2013.01); *G09G 2300/026* (2013.01); *G09G 2300/0408* (2013.01); *G09G 2300/0426* (2013.01); *G09G 2310/0267* (2013.01); *G09G 2310/0275* (2013.01); *G09G 2310/08* (2013.01); *G09G 2320/0209* (2013.01)

(58) Field of Classification Search
CPC ....... G09G 3/32–3291; G09G 2300/02; G09G 2300/026; G09G 2300/0408; G09G 2300/0413; G09G 2300/0426; G09G 2300/043; G09G 2310/0202; G09G 2310/0243; G09G 2310/0262; G09G 2310/0267; G09G 2310/0275; G09G 2310/0286; G09G 2310/06; G09G 2310/067; G09G 2310/08; G09G 2320/02;

(Continued)

(56) References Cited

U.S. PATENT DOCUMENTS 5,250,931 A * 10/1993 Misawa ................ G09G 3/002
                                                      345/206
2012/0105396 A1 * 5/2012 Sakamoto ............ G09G 3/3677
                                                      345/55

(Continued)

FOREIGN PATENT DOCUMENTS

KR    10-2059454 B1    12/2019

*Primary Examiner* — Nathan Danielsen
(74) *Attorney, Agent, or Firm* — Lewis Roca Rothgerber Christie LLP

(57) ABSTRACT

A display device includes a display area including a pixel, a non-display area around the display area, and a display driver electrically connected to the non-display area. The display area includes a data line extending in a first direction and configured to supply data voltage received from the display driver to the pixel, a power line at one side of the pixel and extending in the first direction to supply a supply voltage received from the display driver to the pixel, a gate input line electrically connected to the display driver and extending in the first direction, the gate input line including a scan clock line and a scan clock bar line, and a gate driver connected to the gate input line and configured to receive a gate input signal from the gate input line. The scan clock line and the scan clock bar line cross at least once.

21 Claims, 24 Drawing Sheets

(58) Field of Classification Search
CPC .... G09G 2320/0233; G09G 2320/0209; G06F 3/14; G06F 3/1423; G06F 3/1446
See application file for complete search history.

(56) References Cited

U.S. PATENT DOCUMENTS

| | | | |
|---|---|---|---|
| 2015/0293546 A1* | 10/2015 | Tanaka | G02F 1/136227 327/541 |
| 2016/0111040 A1* | 4/2016 | Kim | G09G 3/2096 257/773 |
| 2017/0316730 A1* | 11/2017 | Cheng | G09G 3/2092 |
| 2018/0108309 A1* | 4/2018 | Tanaka | G09G 3/3648 |

* cited by examiner

DISPLAY DEVICE AND TILED DISPLAY INCLUDING THE SAME

CROSS-REFERENCE TO RELATED APPLICATION

This application claims priority to and the benefit of Korean Patent Application No. 10-2021-0033697 filed on Mar. 16, 2021, in the Korean Intellectual Property Office, the entire disclosure of which is incorporated by reference herein.

BACKGROUND

1. Field

The present disclosure relates to a display device and a tiled display having the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, a light-emitting display device includes a light-emitting element that can emit light on its own, so that each of the pixels of the display panel can emit light by themselves. Accordingly, a light-emitting display device can display images without a backlight unit that supplies light to the display panel.

A large-size display device may include a large number of pixels, and thus the defect rate of light-emitting elements may increase while productivity or reliability may deteriorate. To overcome such issues, a tiled display can provide a large screen by connecting a plurality of display devices having a relatively small size. Such a tiled display may include boundaries between the plurality of display devices, which are referred to as seams because there are the non-display areas or bezel areas between the plurality of display devices adjacent to each other. When a single image is displayed on the full screen, such boundaries between the display devices result in visible seams, hindering a viewer from getting immersed into the image.

SUMMARY

Aspects and features of embodiments of the present disclosure provide a display device in which a power line is coupled with a gate input line disposed in a display area to thereby prevent or reduce a ripple in supply voltage, and a tiled display including the same.

Aspects and features of embodiments of the present disclosure provide a tiled display that eliminates visible seams between a plurality of display devices by way of preventing the boundaries or non-display areas between the display devices from being recognized, allowing a viewer to get immersed into displayed images.

It should be noted that aspects and features of embodiments of the present disclosure are not limited to the above-mentioned aspects and features; and other aspects and features of the present disclosure will be apparent to those skilled in the art from the following descriptions.

According to one or more embodiments of the present disclosure, a display device includes a display area including a pixel, a non-display area around the display area, and a display driver electrically connected to the non-display area. The display area includes a data line extending in a first direction and configured to supply data voltage received from the display driver to the pixel, a power line at one side of the pixel and extending in the first direction to supply a supply voltage received from the display driver to the pixel, a gate input line electrically connected to the display driver and extending in the first direction, the gate input line including a scan clock line and a scan clock bar line, and a gate driver connected to the gate input line and configured to receive a gate input signal from the gate input line. The scan clock line and the scan clock bar line cross at least once.

The scan clock line may be configured to supply a scan clock signal to the gate driver. The scan clock bar line may be configured to supply a scan clock bar signal to the gate driver. The scan clock signal and the scan clock bar signal may have opposing phases.

The gate driver may include a first gate transistor configured to provide the scan clock signal to a gate signal output unit based on a voltage at a first node, and a second gate transistor configured to discharge the gate signal output unit based on the scan clock bar signal.

The scan clock line may include a first portion, a line connection electrode, and a second portion. The scan clock bar line may include a first portion corresponding to the first portion of the scan clock line, a bent portion crossing the line connection electrode, and a second portion corresponding to the second portion of the scan clock line. The line connection electrode may be at a layer different from the scan clock bar line and the first and second portions of the scan clock line.

The first portion of the scan clock line may be located closer to the power line than the first portion of the scan clock bar line is to the power line. The second portion of the scan clock bar line may be located closer to the power line than the second portion of the scan clock line is to the power line.

A length of the first portion of the scan clock line may be equal to a length of the second portion of the scan clock bar line.

The power line may include an initialization voltage line located at an outermost position of the pixel. A length of a portion of the scan clock line that directly faces the initialization voltage line may be equal to a length of a portion of the scan clock bar line that directly faces the initialization voltage line.

The first portion of the scan clock line may be colinear to the second portion of the scan clock bar line. The second portion of the scan clock line may be colinear to the first portion of the scan clock bar line.

The scan clock line may include a first portion, a first line connection electrode, a second portion, a second line connection electrode, and a third portion. The scan clock bar line may include a first portion corresponding to the first portion of the scan clock line, a first bent portion crossing the first line connection electrode, a second portion corresponding to the second portion of the scan clock line, a second bent portion crossing the second line connection electrode, and a third portion corresponding to the third portion of the scan clock line. The first and second line connection electrodes may be at a different layer from the scan clock bar line.

The first portion and the third portion of the scan clock line may be located closer to the power line than the first portion and the third portion of the scan clock bar line are to the power line. The second portion of the scan clock bar line may be located closer to the power line than the second portion of the scan clock line is to the power line.

A sum of lengths of the first portion and the third portion of the scan clock line may be equal to a length of the second portion of the scan clock bar line.

The power line may include an initialization voltage line located at an outermost position of the pixel. A sum of lengths of portions of the scan clock line that directly face the initialization voltage line may be equal to a length of a portion of the scan clock bar line that faces the initialization voltage line.

The first portion and the third portion of the scan clock line may be colinear to the second portion of the scan clock bar line. The second portion of the scan clock line may be colinear to the first portion and the third portion of the scan clock bar line.

The gate input line may further include a carry clock line configured to supply a carry clock signal to the gate driver, and a carry clock bar line configured to supply a carry clock bar signal to the gate driver. The carry clock signal and the carry clock bar signal may have opposing phases.

The carry clock line may include a first portion, a line connection electrode, and a second portion. The carry clock bar line include a first portion corresponding to the first portion of the carry clock line, a bent portion crossing the line connection electrode, and a second portion corresponding to the second portion of the carry clock line. The line connection electrode may be at a layer different from the carry clock bar line and the first and second portions of the carry clock line.

The first portion of the carry clock line may be located closer to the power line than the first portion of the carry clock bar line is to the power line. The second portion of the carry clock bar line may be located closer to the power line than the second portion of the carry clock line is to the power line.

A length of the first portion of the carry clock line may be equal to a length of the second portion of the carry clock bar line.

The carry clock line may include a first portion, a first line connection electrode, a second portion, a second line connection electrode, and a third portion. The carry clock bar line may include a first portion corresponding to the first portion of the carry clock line, a first bent portion crossing the first line connection electrode, a second portion corresponding to the second portion of the carry clock line, a second bent portion crossing the second line connection electrode, and a third portion corresponding to the third portion of the carry clock line. The first and second line connection electrodes may be at a different layer from the carry clock bar line.

The first portion and the third portion of the carry clock line may be located closer to the power line than the first portion and the third portion of the carry clock bar line are to the power line. The second portion of the carry clock bar line may be located closer to the power line than the second portion of the carry clock line is to the power line.

A sum of lengths of the first portion and the third portion of the carry clock line may be equal to a length of the second portion of the carry clock bar line.

According to one or more embodiments of the present disclosure, a tiled display device includes a plurality of display devices, each of the plurality of display devices including a display area including pixels, a non-display area around the display area, and a display driver electrically connected to the non-display area, and a coupling member coupling the plurality of display devices with one another. The display area includes a data line extending in a first direction and configured to supply data voltage received from the display driver to the pixel, a power line at one side of the pixel and extending in the first direction to supply a supply voltage received from the display driver to the pixel, a gate input line electrically connected to the display driver and extending in the first direction, the gate input line including a scan clock line and a scan clock bar line, and a gate driver configured to receive a gate input signal from the gate input line. The scan clock line and the scan clock bar line cross at least once.

According to one or more embodiments of the present disclosure, a length by which a power line and a scan clock line face each other directly may be substantially equal to a length by which the power line and a scan clock bar line face each other directly. The power line may be coupled with the scan clock line to generate a rising or falling ripple, and may be coupled with the scan clock bar line to generate a falling or rising ripple. Accordingly, the ripple of the power line by the scan clock line and the ripple of the power line by the scan clock bar line may cancel each other, so that the power line can hold a constant supply voltage. The display device may include a scan clock line and a scan clock bar line that cross at least once, thereby supplying a constant supply voltage to the pixel.

According to one or more embodiments of the present disclosure, a display device of a tiled display includes a gate input line and a gate driver disposed in the display area, so that the size of the non-display area can be reduced. Since the tiled display includes a plurality of display devices each having the reduced size of non-display area, a coupling area between the plurality of display devices may be so close that a user cannot recognize it. Accordingly, it is possible to prevent the coupling area between a plurality of display devices of the tiled display from being recognized by a user, thereby providing seamless images between the display devices and getting the user immersed into displayed images.

It should be noted that effects, aspects and features of embodiments of the present disclosure are not limited to those described above, and other effects, aspects and features of embodiments of the present disclosure will be apparent to those skilled in the art from the following descriptions.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

Figure 1:
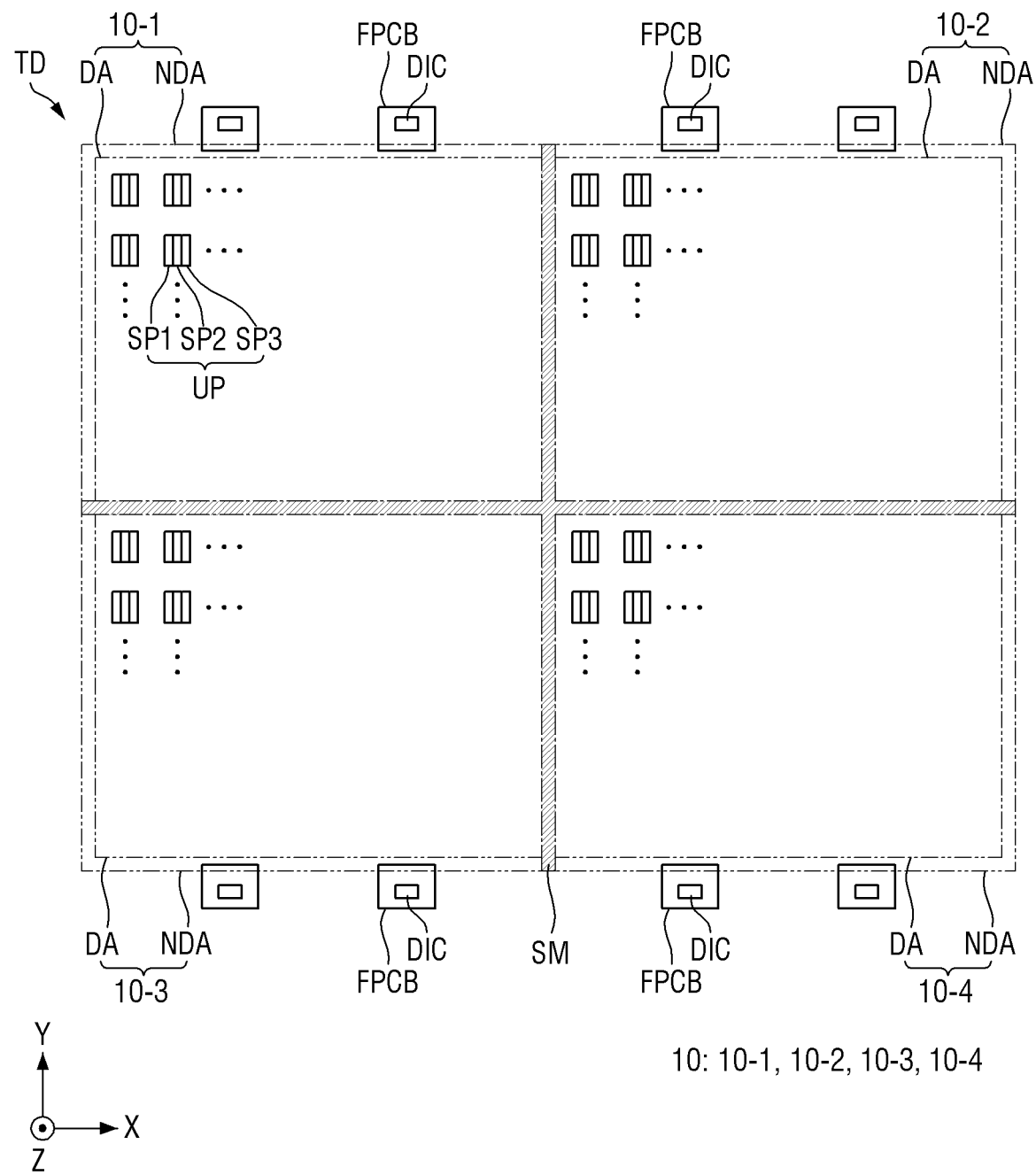
FIG. 1 is a plan view showing a tiled display according to one or more embodiments of the present disclosure.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the spirit and scope of the present disclosure.

Unless otherwise specified, the illustrated embodiments are to be understood as providing features of varying detail of some or a number of ways in which the present disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the spirit and scope of the present disclosure. Further, the blocks, units, and/or modules of some or a number of embodiments may be physically combined into more complex blocks, units, and/or modules without departing from the spirit and scope of the present disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view showing a tiled display according to one or more embodiments of the present disclosure.

Referring to FIG. 1, a tiled display TD may include a plurality of display devices 10. The plurality of display devices 10 may be arranged in, but is not limited to, a lattice pattern. The plurality of display devices 10 may be connected in a first direction (x-axis direction) or a second direction (y-axis direction), and the tiled display TD may have a certain shape. For example, the plurality of display devices 10 may all have the same size. It is, however, to be understood that the present disclosure is not limited thereto. For another example, the display devices 10 may have different sizes.

Each of the plurality of display devices 10 may have a rectangular shape including longer sides and shorter sides. The display devices 10 may be arranged such that the longer sides or the shorter sides of the display devices 10 are connected with one another. Some of the display devices 10 may be disposed on an edge of the tiled display TD to form one side of the tiled display TD. Some others of the display devices 10 may be disposed at a corner of the tiled display TD, and may form two adjacent sides of the tiled display TD. Still some others of the display devices 10 may be disposed on the inner side (or inner portion) of the tiled display TD and may be surrounded by the other display devices 10 (or may have other display devices 10 around that display device).

Each of the display devices 10 may include a display area DA and a non-display area NDA that is around an edge or periphery of the display area DA. The display area DA may include a plurality of unit pixels UP to display images. The non-display area NDA may be disposed around the display area DA to surround the display area DA, and may display no image.

The tiled display TD may have, but is not limited to, a generally planar shape. The tiled display TD may have a three-dimensional shape, giving a viewer a three-dimensional experience. For example, when the tiled display TD has a three-dimensional shape, at least some of the display devices 10 may have a curved shape. For another example, the display devices 10 may have a flat shape and are connected with one another at a suitable angle (e.g., a predetermined angle), so that the tiled display TD may have a three-dimensional shape.

The tiled display TD may include seams SM located between the plurality of display areas DA. The tiled display TD may be formed by connecting non-display areas NDA of the adjacent display devices 10 with one another. The plurality of display devices 10 may be connected with one another by coupling members or adhesive members disposed in the seams SM. The seams SM of the plurality of display devices 10 may include neither a pad area nor a flexible film attached to the pad area. Accordingly, the display areas DA of the display devices 10 may be so close to each other that the seams SM therebetween are not recognized by a viewer. The reflectance of external light at the display areas DA of the plurality of display devices 10 may be substantially equal to the reflectance of external light at the seams SM between the display devices 10. As used herein, when two distances or lengths are stated as being equal, it means that the distances or the lengths are equal or substantially equal. Accordingly, it is possible to prevent the seams SM between the display devices 10 of the tiled display TD from being recognized by a viewer, thereby improving the issue of visible seams and allowing the viewer to get immersed into the displayed images.

Each of the display devices 10 may include a plurality of unit pixels UP arranged in rows and columns in the display area DA. The plurality of unit pixels UP may include first to third pixels SP1, SP2, and SP3, and each of the first to third pixels SP1, SP2, and SP3 may emit light having a desired wavelength (e.g., a predetermined peak wavelength). The first pixel SP1 may emit light of a first color, the second pixel SP2 may emit light of a second color, and the third pixel SP3 may emit light of a third color. For example, the light of the first color may be red light having a peak wavelength in the range of 610 to 650 nm, the light of the second color may be green light having a peak wavelength in the range of 510 to 550 nm, and the light of the third color may be blue light having a peak wavelength in the range of 440 to 480 nm. It is, however, to be understood that the present disclosure is not limited thereto. The first to third pixels SP1, SP2 and SP3 may be arranged sequentially and repeatedly along the first direction (x-axis direction) of the display area DA, but the present disclosure is not limited thereto.

The tiled display TD may include first to fourth display devices 10-1, 10-2, 10-3, and 10-4. The number and coupling relationship of the display devices 10 are not limited by the embodiment according to FIG. 1. The number of the display devices 10 may be determined depending on the sizes of the display devices 10 and the tiled display TD. Each of the first to fourth display devices 10-1, 10-2, 10-3, and 10-4 may include a flexible film FPCB and a display driver DIC.

The flexible film FPCB may be disposed in the non-display area NDA on one side of the tiled display TD. The flexible film FPCB may be disposed on one side of the non-display area NDA adjacent to the seam SM. The flexible film FPCB may be disposed on the opposite side of the non-display area NDA disposed on the opposite side of the seam SM with respect to the display area DA. For example, the flexible film FPCB may be disposed in the non-display area NDA on the upper side of a first display device 10-1 and the non-display area NDA on the upper side of a second display device 10-2. The flexible film FPCB may be disposed in the non-display area NDA on the lower side of a third display device 10-3 and the non-display area NDA on the lower side of a fourth display device 10-4. One side of the flexible film FPCB may be connected to a pad on the substrate, while the opposite side of the flexible film FPCB may be connected to a source circuit board. The flexible film FPCB may transmit a source voltage or data voltage from the display driver DIC to the display device 10.

The display driver DIC may be disposed on the flexible film FPCB and may be connected to the first to third pixels SP1, SP2 and SP3 of the display device 10. For example, the display driver DIC may be an integrated circuit (IC). The display driver DIC may convert digital video data into analog data voltage based on a source control signal from a timing controller, and may supply the data voltage to a data line in the display area DA through the flexible film FPCB.

In one or more embodiments, the flexible film FPCB may be additionally disposed in the non-display area NDA on the left side of the first and third display devices 10-1 and 10-3, and the flexible film FPCB may be additionally disposed in the non-display area NDA on the right side of the second and fourth display devices 10-2 and 10-4. It is, however, to be understood that the present disclosure is not limited thereto.

Figure 2:
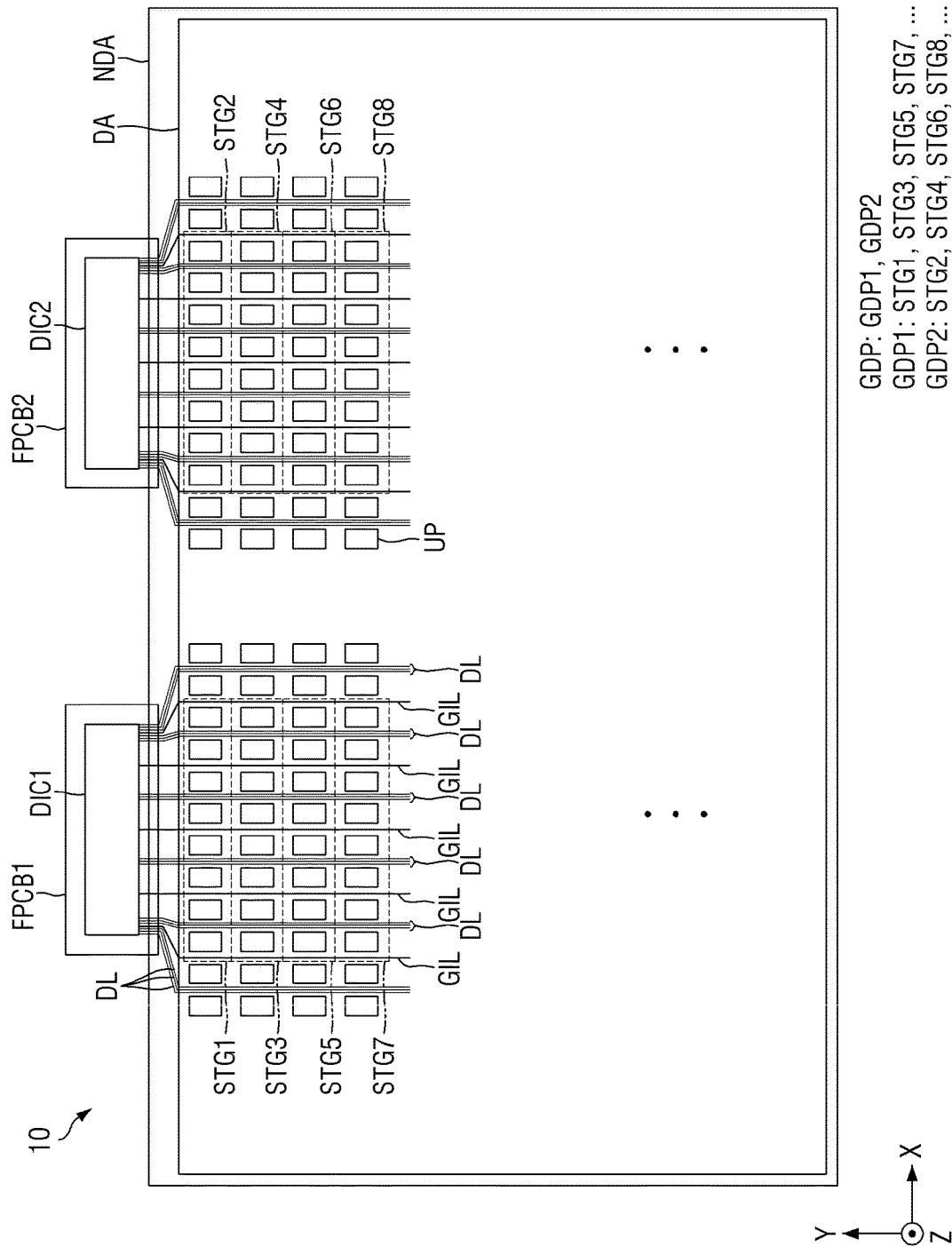
FIG. 2 is a plan view showing a display device according to one or more embodiments of the present disclosure.
Figure 3:
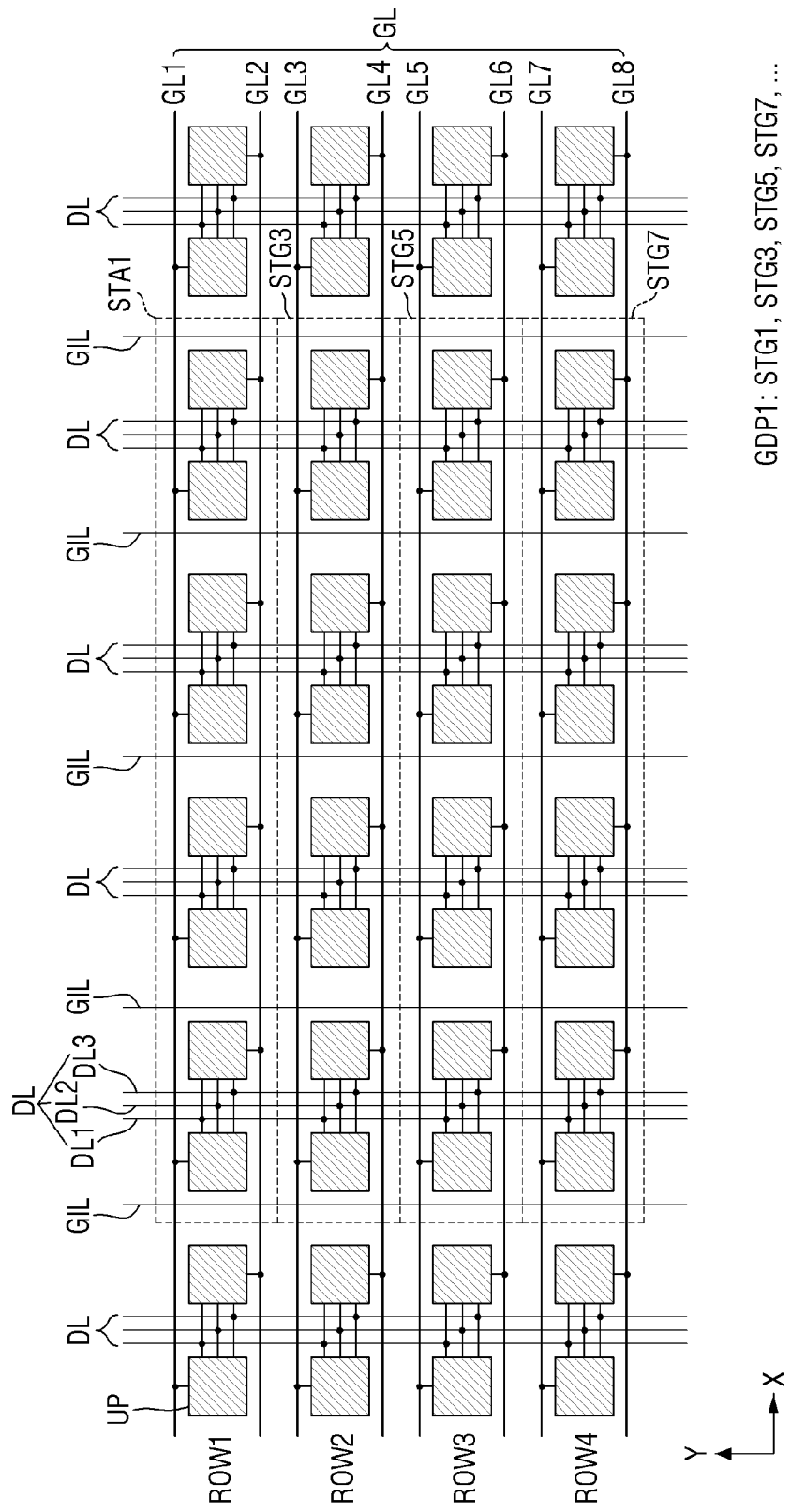
FIG. 3 is a diagram showing a first gate driver of a display device according to one or more embodiments of the present disclosure.

FIG. 2 is a plan view showing a display device according to one or more embodiments of the present disclosure. FIG. 3 is a diagram showing a first gate driver of a display device according to one or more embodiments of the present disclosure.

Referring to FIGS. 2 and 3, a display device 10 may include a display area DA and a non-display area NDA.

The display area DA may include a plurality of unit pixels UP, data lines DL, gate lines GL, gate drivers GDP, and gate input lines GIL.

The plurality of unit pixels UP may be connected to the data lines DL and the gate lines GL. Each of the unit pixels UP may include first to third pixels SP1, SP2 and SP3. Each of the first to third pixels SP1, SP2 and SP3 may include a pixel circuit and a light-emitting element. The pixel circuit may supply a driving current proportional to the data voltage of the data line DL to the light-emitting element. The light-emitting element may emit light having a luminance determined based on the magnitude of the driving current.

The data lines DL may be extended in the second direction (y-axis direction) and may be spaced from each other along the first direction (x-axis direction). The data lines DL may be disposed between two adjacent unit pixels UP, and two unit pixels UP may share one data line DL. The data lines DL may be connected between the display drivers DIC and the unit pixels UP. In one or more embodiments, the first to third data lines DL1, DL2, and DL3 may supply data voltages to the first to third pixels SP1, SP2 and SP3, respectively. The data voltage may determine the luminance of each of the first to third pixels SP1, SP2, and SP3.

The gate lines GL may be extended in the first direction (x-axis direction) and may be spaced from each other along the second direction (y-axis direction) crossing the first direction (x-axis direction). Each of the gate lines GL may be connected to the gate drivers GDP disposed in the display area DA. The gate lines GL may include first to eighth gate lines GL1 to GL8. Odd-numbered gate lines GL may be connected to a first gate driver GDP1, and even-numbered gate lines GL may be connected to a second gate driver GDP2. It should be understood that the present disclosure is not limited thereto. Two gate lines GL may be connected to the unit pixels UP arranged in one row. For example, the first gate line GL1 may be connected to the unit pixels UP arranged in odd-numbered columns of a first row ROW1, and the second gate line GL2 may be connected to the unit pixels UP arranged in even-numbered columns of the first row ROW1. The third gate line GL3 may be connected to the unit pixels UP arranged in odd-numbered columns of a second row ROW2, and the fourth gate line GL4 may be connected to the unit pixels UP arranged in even-numbered columns of the second row ROW2.

The gate drivers GDP may be disposed in the display area DA to supply gate signals to the gate lines GL. The gate drivers GDP may be disposed in every row in which a plurality of unit pixels UP is disposed. The gate drivers GDP may include first and second gate drivers GDP1 and GDP2. The first gate driver GDP1 may be disposed on one side of the display area DA in line with the first display driver DIC1, and the second gate driver GDP2 may be disposed on the opposite side of the display area DA in line with the second display driver DIC2. The first gate driver GDP1 may receive a gate input signal from the first display driver DIC1, and the second gate driver GDP2 may receive a gate input signal from the second display driver DIC2.

The first gate driver GDP1 may include a plurality of odd stages STG1, STG3, STG5, STG7, . . . , and the second gate driver GDP2 may include a plurality of even stages STG2, STG4, STG6, STG8, . . . . The first to eighth stages STG1 to STG8 may generate gate signals supplied to the first to eighth gate lines GL1 to GL8 based on the gate input signal. The plurality of odd stages STG1, STG3, STG5, STG7, may be disposed in the same column on one side of the display area DA and may be connected to the same gate input line GIL. The plurality of odd stages STG1, STG3, STG5, STG7, . . . may share the gate input line GIL connected to the first display driver DIC1. The plurality of even stages STG2, STG4, STG6, STG8, . . . may be disposed in the same column on the opposite side of the display area DA and may be connected to the same gate input line GIL. The plurality of even stages STG2, STG4, STG6, STG8, . . . may share the gate input line GIL connected to the second display driver DIC2. Accordingly, each of the first and second gate drivers GDP1 and GDP2 receives the same gate input signal, thereby reducing the number of gate input lines GIL.

Each of the first to eighth stages STG1 to STG8 may be disposed across a plurality of unit pixels UP in one row. Each of the first to eighth stages STG1 to STG8 may be disposed in a location of the unit pixel UP where the pixel circuit is not disposed. For example, a gate transistor or a gate capacitor forming each of the first to eighth stages STG1 to STG8 may be disposed between adjacent unit pixels UP. Each of the first to eighth stages STG1 to STG8 includes a plurality of gate transistors and a plurality of gate capacitors, and accordingly may be disposed across several or tens of unit pixels UP. Each of the first to eighth stages STG1 to STG8 may be disposed across several or tens of unit pixels UP depending on its size.

The gate input lines GIL may be extended in the second direction (y-axis direction) and may be spaced from one another in the first direction (x-axis direction). Each of the gate input lines GIL may be disposed between adjacent unit pixels UP. The gate input lines GIL may be connected between the first display driver DIC1 and the first gate driver GDP1, and may be connected between the second display driver DIC2 and the second gate driver GDP2. Each of the gate input lines GIL may supply a gate input signal to the first to eighth stages STG1 to STG8. For example, the gate input line GIL connected to the first display driver DIC1 may supply a gate input signal to the plurality of odd stages STG1, STG3, STG5, STG7, . . . , and the gate input line GIL connected to the second display driver DIC2 may supply a gate input signal to the plurality of even stages STG2, STG4, STG6, STG8, . . . . The plurality of gate input lines GIL may each be disposed between some of the pixel columns of the display area DA, and one gate input line GIL may be connected to a plurality of stages disposed in the same column. In this manner, it is possible to generate a plurality of gate signals in the display device 10 by using the gate input lines GIL that are fewer in number than the gate lines GL. Each of the plurality of gate input lines GIL may be disposed between the plurality of data lines DL, but the present disclosure is not limited thereto.

Accordingly, the display device 10 includes the gate input lines GIL and the gate drivers GDP disposed in the display area DA, thereby reducing the size of the non-display area NDA. The size of the non-display area NDA of the display device 10 can be reduced compared to the size of the non-display area NDA of a display device in which the gate driver is disposed in the non-display area NDA or the gate driver is disposed on a separate flexible film. As the tiled display TD includes the plurality of display devices 10 each having reduced non-display area NDA, the seams SM between the display devices 10 may be so close to one another that a viewer cannot recognize them. Accordingly, it is possible to prevent the seams SM between the display devices 10 of the tiled display TD from being recognized by a viewer, thereby improving the issue of visible seams and allowing the viewer to get immersed into the displayed images.

The non-display area NDA may be around (or surround) the display area DA. The non-display area NDA may include fan-out lines and pads. The fan-out lines may connect the display driver DIC with the data lines DL and the gate input lines GIL. The pads may be connected to the first or second flexible films FPCB1 and FPCB2.

The first and second flexible films FPCB1 and FPCB2 may be disposed in the non-display area NDA. One side of each of the first and second flexible films FPCB1 and FPCB2 may be connected to the pads on the substrate, and the opposite side of each of the first and second flexible films FPCB1 and FPCB2 may be connected to a source circuit board. The first flexible film FPCB1 may supply a source voltage or a data voltage from the first display driver DIC1 to the data lines DL, and the second flexible film FPCB2 may provide a source voltage or a data voltage from the second display driver DIC2 to the data lines DL.

The first and second display drivers DIC1 and DIC2 may convert digital video data into analog data voltages and supply the converted voltages to the data lines DL through the fan-out lines. The first and second display drivers DIC1 and DIC2 may generate a gate input signal based on a data control signal and may supply the gate input signal to the gate input lines GIL.

Figure 4:
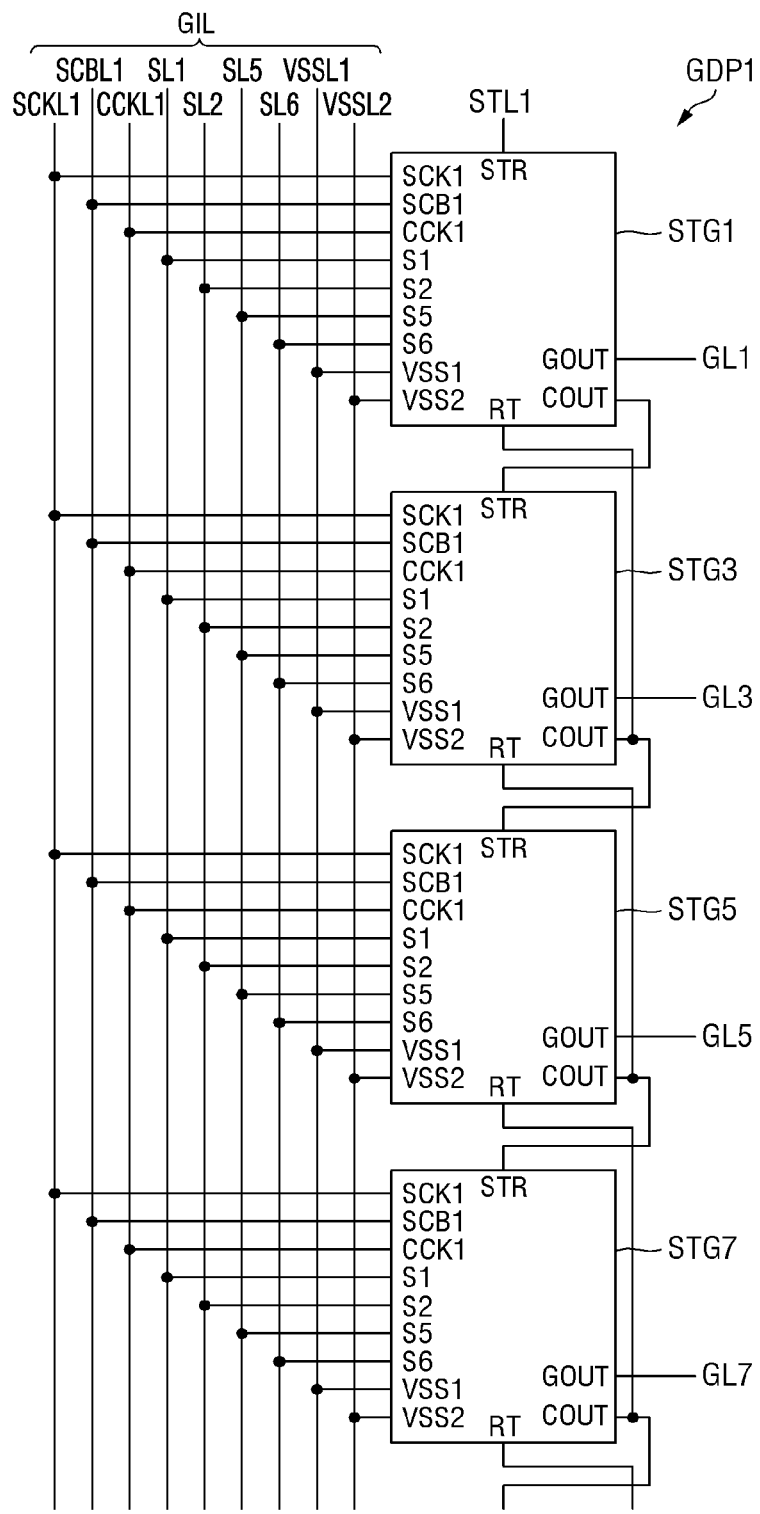
FIG. 4 is a diagram showing a plurality of stages of a first gate driver in a display device according to one or more embodiments of the present disclosure.

FIG. 4 is a diagram showing a plurality of stages of a first gate driver in a display device according to one or more embodiments of the present disclosure.

Referring to FIG. 4, a plurality of gate input lines GIL may be extended in the second direction (y-axis direction) and may be spaced from one another along the first direction (x-axis direction). The gate input lines GIL may be connected between the first display driver DIC1 and the first gate driver GDP1. The first gate driver GDP1 may include a plurality of odd stages STG1, STG3, STG5, STG7, . . . . The gate input lines GIL may supply gate input signals to the plurality of odd stages STG1, STG3, STG5, STG7, . . . . The plurality of gate input lines GIL may include a first scan clock line SCKL1, a first scan clock bar line SCBL1, a first carry clock line CCKL1, a first signal line SL1, a second signal line SL2, a fifth signal line SL5, a sixth signal line SL6, a first low-level line VSSL1, and a second low-level line VSSL2. The gate input signals may include a first scan clock signal SCK1, a first scan clock bar signal SCB1, a first carry clock signal CCK1, a first input signal S1, a second input signal S2, a fifth input signal S5, a sixth input signal S6, a first low-level voltage VSS1, and a second low-level voltage VSS2, which are associated with the plurality of gate input lines GIL, respectively. It should be noted that the first scan clock signal SCK1 and the first scan clock bar signal SCB1 may be in anti-phase. Accordingly, the plurality of gate input lines GIL may supply the first scan clock signal SCK1, the first scan clock bar signal SCB1, the first carry clock signal CCK1, the first input signal S1, the second input signal S2, the fifth input signal S5, the sixth input signal S6, the first low-level voltage VSS1 and the second low-level voltage VSS2 to a plurality of odd stages STG1, STG3, STG5, STG7, . . . .

The plurality of gate input lines GIL may be disposed between the plurality of data lines DL. The plurality of gate input lines GIL may be arranged alternately with the plurality of data lines DL. For example, the first scan clock line SCKL1 may be disposed between the plurality of data lines DL. The first scan clock bar line SCBL1 may be disposed between the plurality of data lines DL and may be spaced from the first scan clock line SCKL1 with the plurality of data lines DL therebetween. The first signal line SL1 may be disposed between the plurality of data lines DL and may be spaced from the first scan clock bar line SCBL1 with the plurality of data lines DL therebetween.

A start signal input unit STR of the first stage STG1 may be connected to a first start line STL1. The start signal input unit STR of each of the third, fifth and seventh stages STG3, STG5 and STG7 may be connected to a carry signal output unit COUT of the respective previous stage. For example, the start signal input unit STR of the third stage STG3 may be connected to the carry signal output unit COUT of the first stage STG1. A reset signal input unit RT of the first, third, fifth, and seventh stages STG1, STG3, STG5, and STG7 may be connected to the carry signal output unit COUT of the subsequent stage. For example, the reset signal input unit RT of the first stage STG1 may be connected to the carry signal output unit COUT of the third stage STG3.

Gate signal output units GOUT of the first, third, fifth, and seventh stages STG1, STG3, STG5, and STG7 may be connected to the first, third, fifth and seventh gate lines GL1, GL3, GL5, and GL7, respectively. Accordingly, the first, third, fifth, and seventh stages STG1, STG3, STG5, and STG7 may supply the gate signals to the first, third, fifth, and seventh gate lines GL1, GL3, GL5, and GL7.

Figure 5:
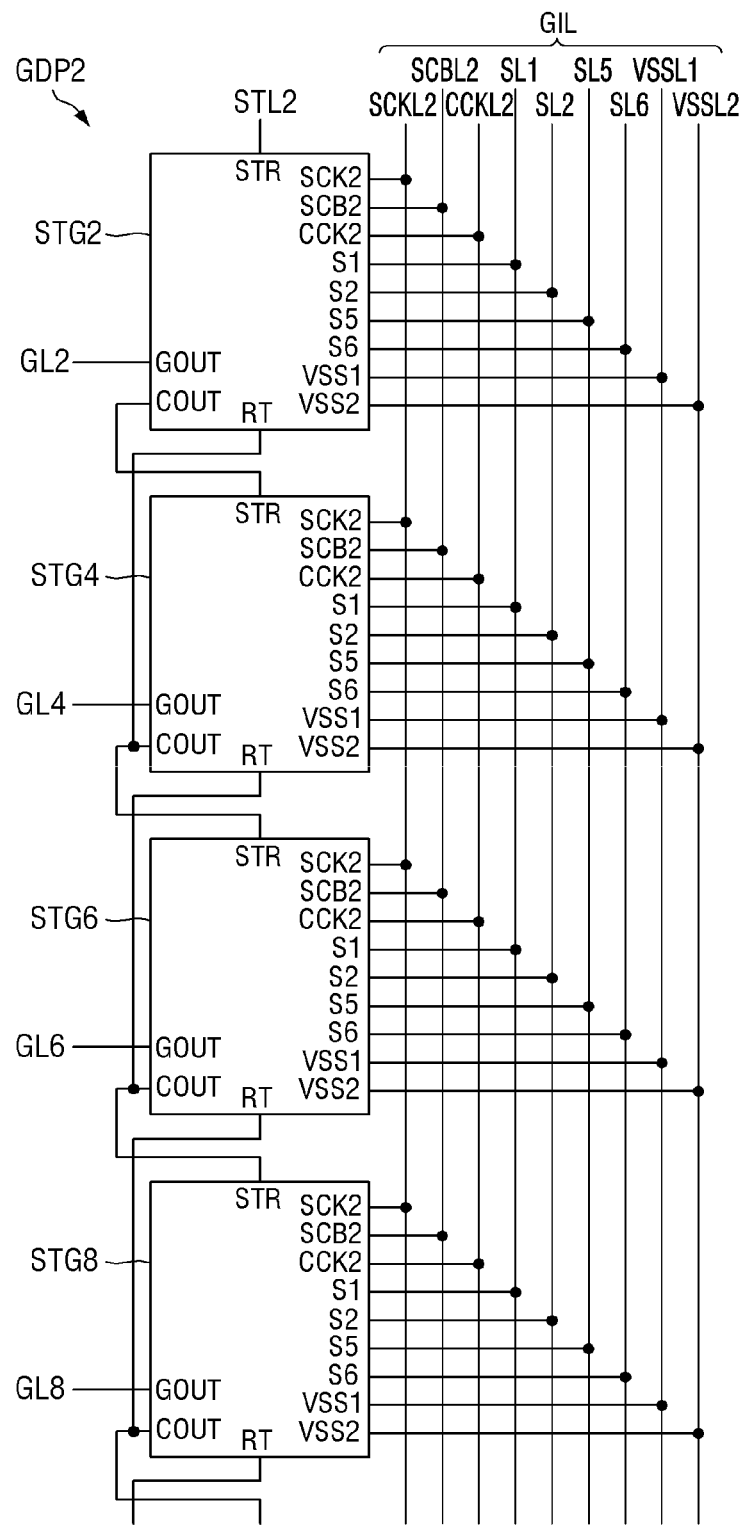
FIG. 5 is a diagram showing a plurality of stages of a second gate driver in a display device according to one or more embodiments of the present disclosure.

FIG. 5 is a diagram showing a plurality of stages of a second gate driver in a display device according to one or more embodiments of the present disclosure.

Referring to FIG. 5, a plurality of gate input lines GIL may be extended in the second direction (y-axis direction) and may be spaced from one another along the first direction (x-axis direction). The gate input lines GIL may be connected between the second display driver DIC2 and the second gate driver GDP2. The second gate driver GDP2 may include a plurality of even stages STG2, STG4, STG6, STG8, . . . . The gate input lines GIL may supply gate input signals to the plurality of even stages STG2, STG4, STG6, STG8, . . . . The plurality of gate input lines GIL may include a second scan clock line SCKL2, a second scan clock bar line SCBL2, a second carry clock line CCKL2, a first signal line SL1, a second signal line SL2, a fifth signal line SL5, a sixth signal line SL6, a first low-level line VSSL1, and a second low-level line VSSL2. The gate input signals may include a second scan clock signal SCK2, a second scan clock bar signal SCB2, a second carry clock signal CCK2, a first input signal S1, a second input signal S2, a fifth input signal S5, a sixth input signal S6, a first low-level voltage VSS1, and a second low-level voltage VSS2, which are associated with the plurality of gate input lines GIL, respectively. It should be noted that the second scan clock signal SCK2 and the second scan clock bar signal SCB2 may be in anti-phase. Accordingly, the plurality of gate input lines GIL may supply the second scan clock signal SCK2, the second scan clock bar signal SCB2, the second carry clock signal CCK2, the first input signal S1, the second input signal S2, the fifth input signal S5, the sixth input signal S6, the first low-level voltage VSS1, and the second low-level voltage VSS2 to a plurality of even stages STG2, STG4, STG6, STG8, . . . .

The plurality of gate input lines GIL may be disposed between the plurality of data lines DL. The plurality of gate input lines GIL may be arranged alternately with the plurality of data lines DL. For example, the second scan clock line SCKL2 may be disposed between the plurality of data lines DL. The second scan clock bar line SCBL2 may be disposed between the plurality of data lines DL and may be spaced from the second scan clock line SCKL2 with the plurality of data lines DL therebetween. The first signal line SL1 may be disposed between the plurality of data lines DL and may be spaced from the second scan clock bar line SCBL2 with the plurality of data lines DL therebetween.

A start signal input unit STR of the second stage STG2 may be connected to a second start line STL2. The start signal input unit STR of the fourth, sixth, and eighth stages STG4, STG6, and STG8 may be connected to a carry signal output unit COUT of the previous stage. For example, a start signal input unit STR of the fourth stage STG4 may be connected to the carry signal output unit COUT of the second stage STG2. A reset signal input unit RT of each of the first, third, fifth, and seventh stages STG1, STG3, STG5, and STG7 may be connected to the carry signal output unit COUT of the respective subsequent stage. For example, the reset signal input unit RT of the second stage STG2 may be connected to the carry signal output unit COUT of the fourth stage STG4.

The gate signal output units GOUT of the second, fourth, sixth, and eighth stages STG2, STG4, STG6, and STG8 may be connected to the second, fourth, sixth, and eighth gate lines GL2, GL4, GL6, and GL9, respectively. Accordingly, the second, fourth, sixth, and eighth stages STG2, STG4, STG6, and STG8 may supply the gate signals to second, fourth, sixth, and eighth gate lines GL2, GL4, GL6, and GL8.

Figure 6:
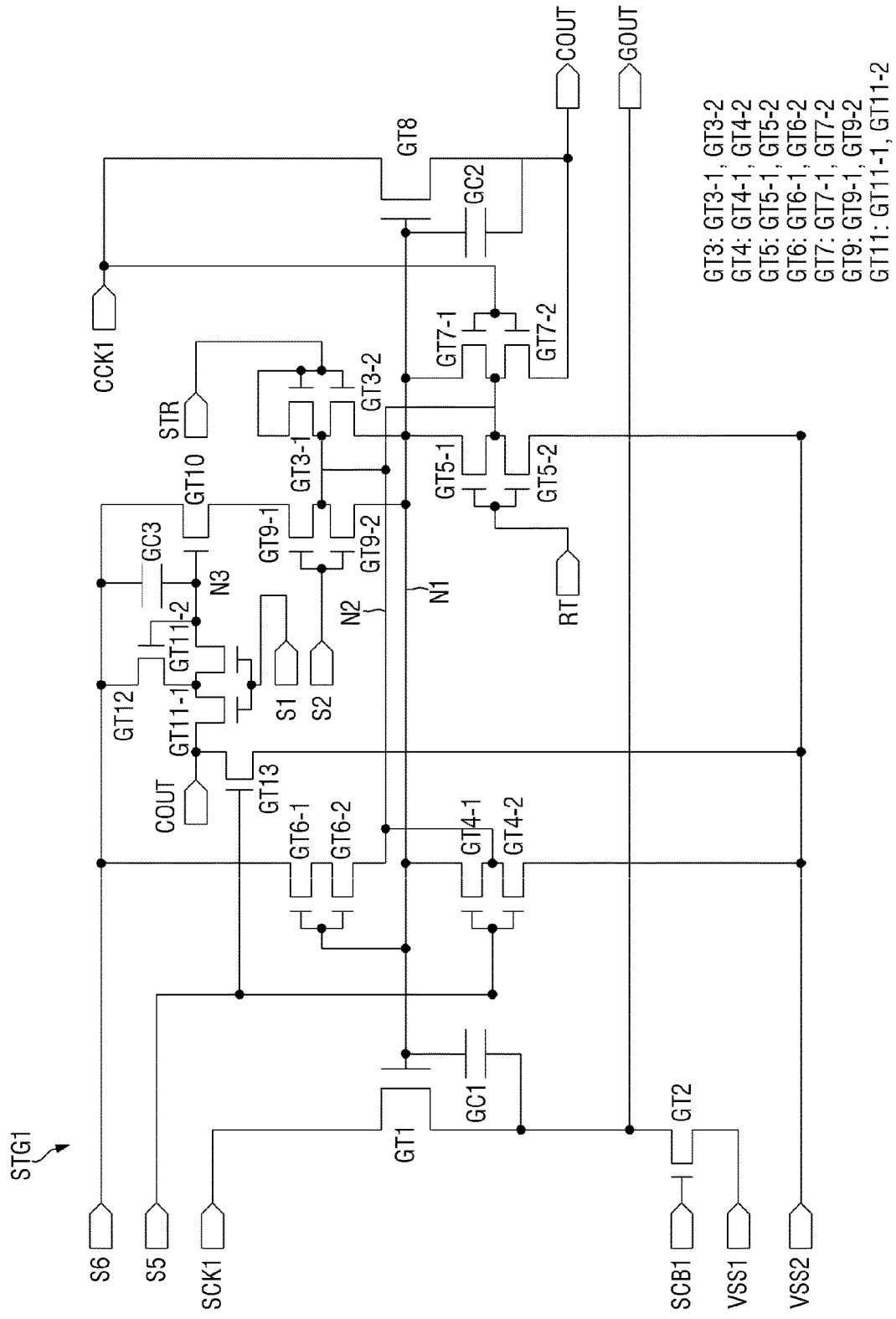
FIG. 6 is a circuit diagram showing the first stage of FIG. 4.

FIG. 6 is a circuit diagram showing the first stage of FIG. 4.

Referring to FIG. 6, the first stage STG1 may receive a plurality of gate input signals and output a gate signal. For example, the first stage STG1 may receive the first scan clock signal SCK1, the first scan clock bar signal SCB1, the first carry clock signal CCK1, the first input signal S1, the second input signal S2, the fifth input signal S5, the sixth input signal S6, the first low-level voltage VSS1, and the second low-level voltage VSS2. It should be understood that the number and the type of the gate input signals are not limited thereto.

The first stage STG1 may include a plurality of gate transistors and a plurality of gate capacitors. The first stage STG1 may include first to thirteenth gate transistors GT1 to GT13 and first to third gate capacitors GC1 to GC3.

The first gate transistor GT1 may be turned on based on the voltage at the first node N1 to provide the first scan clock signal SCK1 to the gate signal output unit GOUT. For example, the first gate transistor GT1 may be, but is not limited to, a pull-up transistor of the first stage STG1. The gate signal output unit GOUT of the first stage STG1 may be connected to the first gate line GL1. The gate electrode of the first gate transistor GT1 may be connected to the first node N1, the drain electrode of the first gate transistor GT1 may be connected to an input terminal of the first scan clock signal SCK1, and the source electrode of the first gate transistor GT1 may be connected to the gate signal output unit GOUT. Accordingly, the first gate transistor GT1 may be turned on based on the voltage at the first node N1 to provide a gate signal to the gate signal output unit GOUT.

The first gate capacitor GC1 may be connected between the first node N1 and the gate signal output unit GOUT. The first gate capacitor GC1 may be connected between the gate electrode of the first gate transistor GT1 and the source electrode of the first gate transistor GT1. Accordingly, the first gate capacitor GC1 may hold a potential difference between the gate electrode and the source electrode (or a gate to source voltage) of the first gate transistor GT1.

The second gate transistor GT2 may be turned on based on the first scan clock bar signal SCB1 to discharge the gate signal output unit GOUT. For example, the second gate transistor GT2 may be, but is not limited to, a pull-down transistor of the first stage STG1. The gate electrode of the second gate transistor GT2 may be connected to an input terminal of the first scan clock bar signal SCB1, the drain electrode of the second gate transistor GT2 may be connected to the gate signal output unit GOUT, and the source electrode of the second gate transistor GT2 may be connected to an input terminal of the first low-level voltage VSS1. Accordingly, the second gate transistor GT2 may be turned on based on the first scan clock bar signal SCB1 to initialize the gate signal output unit GOUT to the first low-level voltage VSS1.

The third gate transistor GT3 may be turned on based on the first start signal to provide the first start signal to the first node N1. The third gate transistor GT3 may be a dual transistor including a (3-1) gate transistor GT3-1 and a (3-2) gate transistor GT3-2. The gate electrode of the (3-1) gate transistor GT3-1 may be connected to the start signal input unit STR, the drain electrode of the (3-1) gate transistor GT3-1 may be connected to the start signal input unit STR via the gate electrode of the (3-1) gate transistor GT3-1, and the source electrode of the (3-1) gate transistor GT3-1 may be connected to the drain electrode of the (3-2) gate transistor GT3-2. The gate electrode of the (3-2) gate transistor GT3-2 may be connected to the start signal input unit STR, the drain electrode of the (3-2) gate transistor GT3-2 may be connected to the source electrode of the (3-1) gate transistor GT3-1, and the source electrode of the (3-2) gate transistor GT3-2 may be connected to the first node N1. The source electrode of the (3-1) gate transistor GT3-1 and the drain electrode of the (3-2) gate transistor GT3-2 are connected to the second node N2, so that leakage current between the (3-1) gate transistor GT3-1 and the (3-2) gate transistor GT3-2 can be suppressed. Accordingly, the third gate transistor GT3 may control the voltage at the first node N1 based on the first start signal.

The fourth gate transistor GT4 may be turned on based on the fifth input signal S5 to discharge the first node N1. The fourth gate transistor GT4 may be a dual transistor including a (4-1) gate transistor GT4-1 and a (4-2) gate transistor GT4-2. The gate electrode of the (4-1) gate transistor GT4-1 may be connected to an input terminal of the fifth input signal S5, the drain electrode of the (4-1) gate transistor GT4-1 may be connected to the first node N1, and the source electrode of the (4-1) gate transistor GT4-1 may be connected to the drain electrode of the (4-2) gate transistor GT4-2. The gate electrode of the (4-2) gate transistor GT4-2 may be connected to the input terminal of the fifth input signal S5, the drain electrode of the (4-2) gate transistor GT4-2 may be connected to the source electrode of the (4-1) gate transistor GT4-1, and the source electrode of the (4-2) gate transistor GT4-2 may be connected to the input terminal of the second low-level voltage VSS2. The source electrode of the (4-1) gate transistor GT4-1 and the drain electrode of the (4-2) gate transistor GT4-2 are connected to the second node N2, so that leakage current between the (4-1) gate transistor GT4-1 and the (4-2) gate transistor GT4-2 can be suppressed. Accordingly, the fourth gate transistor GT4 may be turned on based on the fifth input signal S5 to initialize the first node N1 to the second low-level voltage VSS2.

The fifth gate transistor GT5 may be turned on based on a reset signal to discharge the first node N1. The reset signal may be a carry signal of the third stage STG3. The fifth gate transistor GT5 may be a dual transistor including a (5-1) gate transistor GT5-1 and a (5-2) gate transistor GT5-2. The gate electrode of the (5-1) gate transistor GT5-1 may be connected to the rest signal input unit RT, the drain electrode of the (5-1) gate transistor GT5-1 may be connected to the first node N1, and the source electrode of the (5-1) gate transistor GT5-1 may be connected to the drain electrode of the (5-2) gate transistor GT5-2. The gate electrode of the (5-2) gate transistor GT5-2 may be connected to the rest signal input unit RT, the drain electrode of the (5-2) gate transistor GT5-2 may be connected to the source electrode of the (5-1) gate transistor GT5-1, and the source electrode of the (5-2) gate transistor GT5-2 may be connected to an input terminal of the second low-level voltage VSS2. The source electrode of the (5-1) gate transistor GT5-1 and the drain electrode of the (5-2) gate transistor GT5-2 are connected to the second node N2, so that leakage current between the (5-1) gate transistor GT5-1 and the (5-2) gate transistor GT5-2 can be suppressed. Accordingly, the fifth gate transistor GT5 may be turned on based on the reset signal to initialize the first node N1 to the second low-level voltage VSS2.

The sixth gate transistor GT6 may be turned on based on the voltage at the first node N1 to provide the sixth input signal S6 to the second node N2. The sixth gate transistor GT6 may be a dual transistor including a (6-1) gate transistor GT6-1 and a (6-2) gate transistor GT6-2. The gate electrode of the (6-1) gate transistor GT6-1 may be connected to the first node N1, the drain electrode of the (6-1) gate transistor GT6-1 may be connected to an input terminal of the sixth input signal S6, and the source electrode of the (6-1) gate transistor GT6-1 may be connected to the drain electrode of the (6-2) gate transistor GT6-2. The gate electrode of the (6-2) gate transistor GT6-2 may be connected to the first node N1, the drain electrode of the (6-2) gate transistor GT6-2 may be connected to the source electrode of the (6-1) gate transistor GT6-1, and the source electrode of the (6-2) gate transistor GT6-2 may be connected to the second node N2. Accordingly, the sixth gate transistor GT6 may control the voltage at the second node N2 based on the sixth input signal S6.

The seventh gate transistor GT7 may be turned on based on the first carry clock signal CCK1 to provide the voltage at the first node N1 to the carry signal output unit COUT. The seventh gate transistor GT7 may be a dual transistor including a (7-1) gate transistor GT7-1 and a (7-2) gate transistor GT7-2. The gate electrode of the (7-1) gate transistor GT7-1 may be connected to an input terminal of the first carry clock signal CCK1, the drain electrode of the (7-1) gate transistor GT7-1 may be connected to the first node N1, and the source electrode of the (7-1) gate transistor GT7-1 may be connected to the drain electrode of the (7-2) gate transistor GT7-2. The gate electrode of the (7-2) gate transistor GT7-2 may be connected to an input terminal of the first carry clock signal CCK1, the drain electrode of the (7-2) gate transistor GT7-2 may be connected to the source electrode of the (7-1) gate transistor GT7-1, and the source electrode of the (7-2) gate transistor GT7-2 may be connected to the carry signal output unit COUT. The source electrode of the (7-1) gate transistor GT7-1 and the drain electrode of the (7-2) gate transistor GT7-2 are connected to the second node N2, so that leakage current between the (7-1) gate transistor GT7-1 and the (7-2) gate transistor GT7-2 can be suppressed. Accordingly, the seventh gate transistor GT7 may be turned on based on the first carry clock signal CCK1 to provide a carry signal to the carry signal output unit COUT.

The eighth gate transistor GT8 may be turned on based on the voltage at the first node N1 to provide the first carry clock signal CCK1 to the carry signal output unit COUT. The gate electrode of the eighth gate transistor GT8 may be connected to the first node N1, the drain electrode of the eighth gate transistor GT8 may be connected to an input terminal of the first carry clock signal CCK1, and the source electrode of the eighth gate transistor GT8 may be connected to the carry signal output unit COUT. Accordingly, the eighth gate transistor GT8 may be turned on based on the voltage at the first node N1 to provide a carry signal (e.g., the first carry clock signal CCK1) to the carry signal output unit COUT.

The second gate capacitor GC2 may be connected between the first node N1 and the carry signal output unit COUT. The second gate capacitor GC2 may be connected between the gate electrode of the eighth gate transistor GT8 and the source electrode of the eighth gate transistor GT8. Accordingly, the second gate capacitor GC2 may hold a potential difference between the gate electrode and the source electrode (or a gate to source voltage) of the eighth gate transistor GT8.

The ninth gate transistor GT9 may be turned on based on the second input signal S2 to connect the source electrode of the tenth gate transistor GT10 with the first node N1. The ninth gate transistor GT9 may be a dual transistor including a (9-1) gate transistor GT9-1 and a (9-2) gate transistor GT9-2. The gate electrode of the (9-1) gate transistor GT9-1 may be connected to an input terminal of the second input signal S2, the drain electrode of the (9-1) gate transistor GT9-1 may be connected to the tenth gate transistor GT10, and the source electrode of the (9-1) gate transistor GT9-1 may be connected to the drain electrode of the (9-2) gate transistor GT9-2. The gate electrode of the (9-2) gate transistor GT9-2 may be connected to the input terminal of the second input signal S2, the drain electrode of the (9-2) gate transistor GT9-2 may be connected to the source electrode of the (9-1) gate transistor GT9-1, and the source electrode of the (9-2) gate transistor GT9-2 may be connected to the first node N1. The source electrode of the (9-1) gate transistor GT9-1 and the drain electrode of the (9-2) gate transistor GT9-2 are connected to the second node N2, so that leakage current between the (9-1) gate transistor GT9-1 and the (9-2) gate transistor GT9-2 can be suppressed. Accordingly, the ninth gate transistor GT9 may control the voltage at the first node N1 based on the second input signal S2.

The tenth gate transistor GT10 may be turned on based on the voltage at a third node N3 to provide the sixth input signal S6 to the drain electrode of the (9-1) gate transistor GT9-1. The gate electrode of the tenth gate transistor GT10 may be connected to the third node N3, the drain electrode of the tenth gate transistor GT10 may be connected to the input terminal of the sixth input signal S6, and the source electrode of the tenth gate transistor GT10 may be connected to the drain electrode of the (9-1) gate transistor GT9-1. Accordingly, the tenth gate transistor GT10 may provide the sixth input signal S6 to the ninth gate transistor GT9 based on the voltage at the third node N3.

A third gate capacitor GC3 may be connected between the third node N3 and the input terminal of the sixth input signal S6. The third gate capacitor GC3 may be connected between the drain electrode of the tenth gate transistor GT10 and the gate electrode of the tenth gate transistor GT10. Accordingly, the third gate capacitor GC3 may hold a potential difference between the drain electrode and the gate electrode of the tenth gate transistor GT10.

The eleventh gate transistor GT11 may be turned on based on the first input signal S1 to provide a carry signal CR(n) to the third node N3. The eleventh gate transistor GT11 may be a dual transistor including a (11-1) gate transistor GT11-1 and a (11-2) gate transistor GT11-2. The gate electrode of the (11-1) gate transistor GT11-1 may be connected to an input terminal of the first input signal S1, the drain electrode of the (11-1) gate transistor GT11-1 may be connected to the carry signal output unit COUT, and the source electrode of the (11-1) gate transistor GT11-1 may be connected to the drain electrode of the (11-2) gate transistor GT11-2. The gate electrode of the (11-2) gate transistor GT11-2 may be connected to the input terminal of the first input signal S1, the drain electrode of the (11-2) gate transistor GT11-2 may be connected to the source electrode of the (11-1) gate transistor GT11-1, and the source electrode of the (11-2) gate transistor GT11-2 may be connected to the third node N3. The source electrode of the (11-1) gate transistor GT11-1 and the drain electrode of the (11-2) gate transistor GT11-2 are connected to the source electrode of a twelfth gate transistor GT12, so that leakage current between the (11-1) gate transistor GT11-1 and the (11-2) gate transistor GT11-2 can be suppressed. Accordingly, the eleventh gate transistor GT11 may control the voltage at the third node N3 based on the first input signal S1.

The twelfth gate transistor GT12 may be turned on based on the voltage at the third node N3 to provide the sixth input signal S6 to the source electrode of the (11-1) gate transistor GT11-1 or the drain electrode of the (11-2) gate transistor GT11-2. The gate electrode of the twelfth gate transistor GT12 may be connected to the third node N3, the drain electrode of the twelfth gate transistor GT12 may be connected to the input terminal of the sixth input signal S6, and the source electrode of the twelfth gate transistor GT12 may be connected to the source electrode of the (11-1) gate transistor GT11-1 and the drain electrode of the (11-2) gate transistor GT11-2. Accordingly, the twelfth gate transistor GT12 can reduce the leakage current between the (11-1) gate transistor GT11-1 and the (11-2) gate transistor GT11-2.

The thirteenth gate transistor GT13 may be turned on based on the fifth input signal S5 to provide a carry signal to the input terminal of the second low-level voltage VSS2. The gate electrode of the thirteenth gate transistor GT13 may be connected to the input terminal of the fifth input signal S5, the drain electrode of the thirteenth gate transistor GT13 may be connected to the carry signal output unit COUT, and the source electrode of the thirteenth gate transistor GT13 may be connected to the input terminal of the second low-level voltage VSS2.

Accordingly, the first stage STG1 may receive the first scan clock signal SCK1, the first scan clock bar signal SCB1, the first carry clock signal CCK1, the first input signal S1, the second input signal S2, the fifth input signal S5, the sixth input signal S6, the first low-level voltage VSS1, and the second low-level voltage VSS2 from the plurality of gate input lines GIL disposed in the display area DA. As the first stage STG1 includes the first to thirteenth gate transistors GT1 to GT13 and the first to third gate capacitors GC1 to GC3, a gate signal can be output through the gate signal output unit GOUT, and a carry signal can be output through the carry signal output unit COUT.

Figure 7:
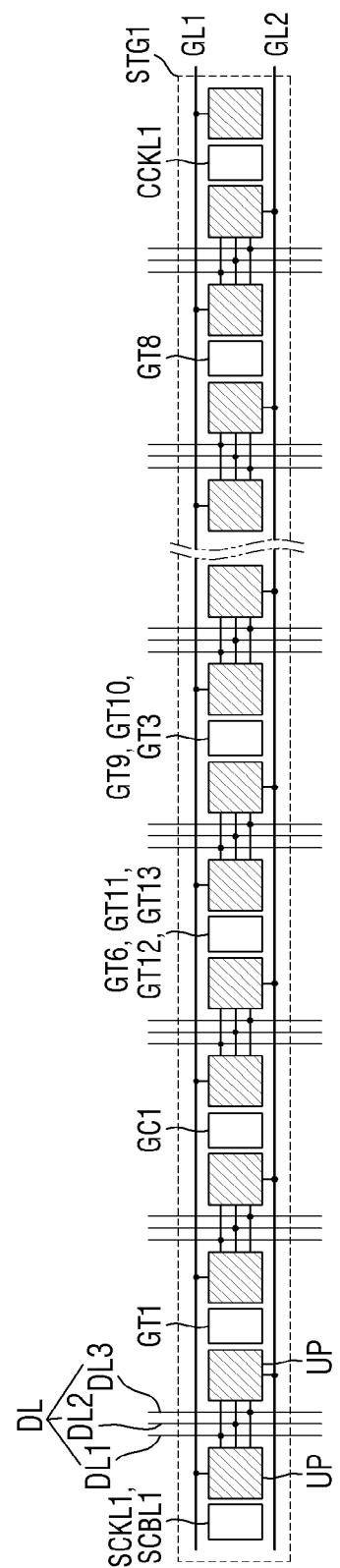
FIG. 7 is a diagram illustrating the first stage of FIG. 6 and a plurality of pixels.

FIG. 7 is a diagram illustrating the first stage of FIG. 6 and a plurality of pixels.

Referring to FIG. 7, the plurality of gate transistors and the plurality of gate capacitors of the first stage STG1 may be disposed at locations where the pixel circuits of the unit pixels UP are not disposed. For example, each of the first to thirteenth gate transistors GT1 to GT13 and the first to third gate capacitors GC1 to GC3 of the first stage STG1 may be disposed between unit pixels UP adjacent to each other in the first direction (x-axis direction). For another example, each of the first to thirteenth gate transistors GT1 to GT13 and the first to third gate capacitors GC1 to GC3 may be disposed between unit pixels UP adjacent to each other in the second direction (y-axis direction).

Each of the gate input lines GIL may be disposed on one side of the unit pixels UP or may be disposed between adjacent unit pixels UP. The gate input lines GIL may be extended in the second direction (y-axis direction) between the unit pixels UP. For example, the first scan clock signal line SCKL1 and the first scan clock bar signal line SCBL1 may be disposed on one side of the unit pixels UP or between adjacent unit pixels UP. The first carry clock signal line CCKL1 may be disposed on one side of the unit pixels UP or between adjacent unit pixels UP.

The first gate transistor GT1 may be disposed between the unit pixels UP adjacent to each other in the first direction (x-axis direction). The first gate capacitor GC1 may be disposed between the unit pixels UP adjacent to each other in the first direction (x-axis direction) and may be spaced from the first gate transistor GT1 with the unit pixels UP therebetween. The sixth, eleventh, twelfth, and thirteenth gate transistors GT6, GT11, GT12, and GT13 may be disposed between the unit pixels UP adjacent to each other in the first direction (x-axis direction), and may be spaced from the first gate capacitor GC1 with the unit pixels UP therebetween. The third, ninth, and tenth gate transistors GT3, GT9, and GT10 may be disposed between the unit pixels UP adjacent to each other in the first direction (x-axis direction), and may be spaced from the sixth, eleventh, twelfth, and thirteenth gate transistors GT6, GT11, GT12, and GT13 with the unit pixels UP therebetween. The eighth gate transistor GT8 may be disposed between the unit pixels UP adjacent to each other in the first direction (x-axis direction) and may be spaced from the first carry clock line CCKL1 with the unit pixels UP therebetween. The first stage STG1 may be appropriately distributed in spaces between the plurality of unit pixels UP.

Accordingly, the display device 10 includes the gate input lines GIL and the gate drivers GDP disposed in the display area DA, thereby reducing the size of the non-display area NDA. The non-display area NDA of the display device 10 can be reduced compared to the size of the non-display area NDA of a display device in which the gate driver is disposed in the non-display area NDA or the gate driver is disposed on a separate flexible film. As the tiled display TD includes the plurality of display devices 10 each having reduced non-display area NDA, the seams SM between the display devices 10 may be so close to one another that a viewer cannot recognize them. Accordingly, it is possible to prevent the seams SM between the display devices 10 of the tiled display TD from being recognized by a viewer, thereby improving the issue of visible seams and allowing the viewer to get immersed into the displayed images.

Figure 8:
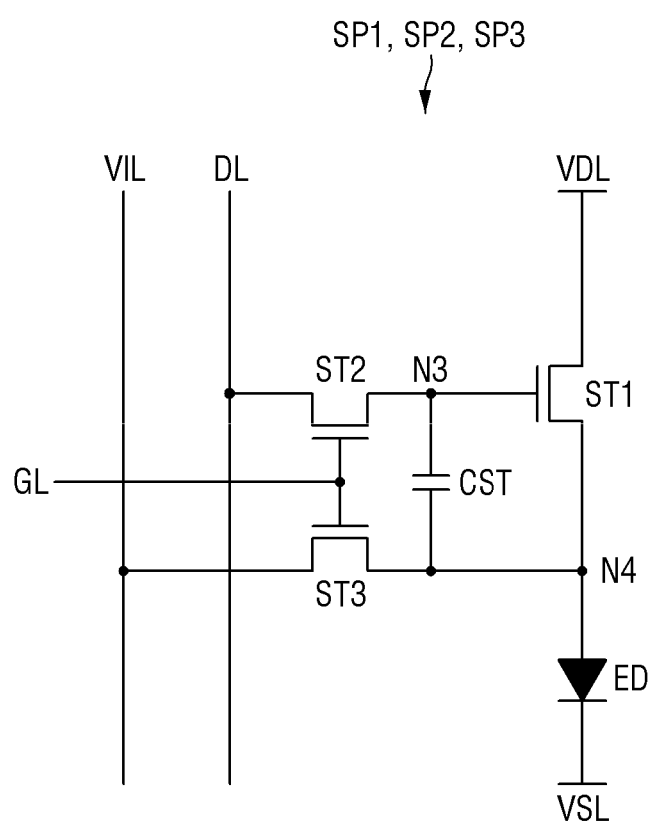
FIG. 8 is a circuit diagram showing a pixel of a display device according to one or more embodiments of the present disclosure.

FIG. 8 is a circuit diagram showing a pixel of a display device according to one or more embodiments of the present disclosure.

Referring to FIG. 8, each of the first to third pixels SP1, SP2, and SP3 may be connected to a gate line GL, a first voltage line VDL, a data line DL, an initialization voltage line VIL, and a second voltage line VSL.

Each of the first to third pixels SP1, SP2, and SP3 may include a pixel circuit and a light-emitting diode ED. The pixel circuit may include first to third transistors ST1, ST2, and ST3 and a storage capacitor CST.

The first transistor ST1 may control a driving current supplied to the light-emitting diode ED. The first transistor ST1 may supply a driving voltage to the light-emitting diode ED based on the voltage at the third node N3. The gate electrode of the first transistor ST1 may be connected to the third node N3, the drain electrode of the first transistor ST1 may be connected to the first voltage line VDL, and the source electrode of the first transistor ST1 may be connected to a fourth node N4 that is a first electrode of the light-emitting diode ED. The first voltage line VDL may supply a driving voltage or a high-level voltage to the first transistor ST1. Accordingly, the first transistor ST1 may control a driving current (or a source-drain current) based on the voltage at the third node N3.

The light-emitting diode ED may receive the driving current to emit light. The amount or the brightness of the light emitted from the light-emitting diodes ED may be proportional to the magnitude of the driving current. Each of the light-emitting diodes ED may be, but is not limited to, an inorganic light-emitting element including a first electrode, a second electrode, and an inorganic semiconductor disposed between the first electrode and the second electrode. The first electrode of the light-emitting diode ED may be connected to the fourth node N4, and a second electrode of the light-emitting diode ED may be connected to the second voltage line VSL. The second voltage line VSL may be a low-level voltage line that supplies a low-level voltage to the second electrode of the light-emitting diode ED.

The second transistor ST2 may be turned on by a gate signal from the gate line GL to connect the data line DL with the third node N3, which is the gate electrode of the first transistor ST1. The gate electrode of the second transistor ST2 may be connected to the gate line GL, the drain electrode of the second transistor ST2 may be connected to the data line DL, and the source electrode of the second transistor ST2 may be connected to the third node N3. Accordingly, the second transistor ST2 may be turned on in response to the gate signal to apply data voltage to the third node N3.

The third transistor ST3 may be turned on by a gate signal of a gate line GL to connect the initialization voltage line VIL with the fourth node N4, which is the source electrode of the first transistor ST1. The gate electrode of the third transistor ST3 may be connected to the gate line GL, the drain electrode of the third transistor ST3 may be connected to the initialization voltage line VIL, and the source electrode of the third transistor ST3 may be connected to the fourth node N4. Accordingly, the third transistor ST3 may be turned on in response to the gate signal to apply the initialization voltage to the fourth node N4.

The storage capacitor CST may be connected between the third node N3 and the fourth node N4. The storage capacitor CST may be connected between the gate electrode of the first transistor ST1 and the source electrode of the first transistor ST1. Accordingly, the storage capacitor CST may hold a potential difference between the gate electrode and the source electrode (or the gate to source voltage) of the first transistor ST1.

Figure 9:
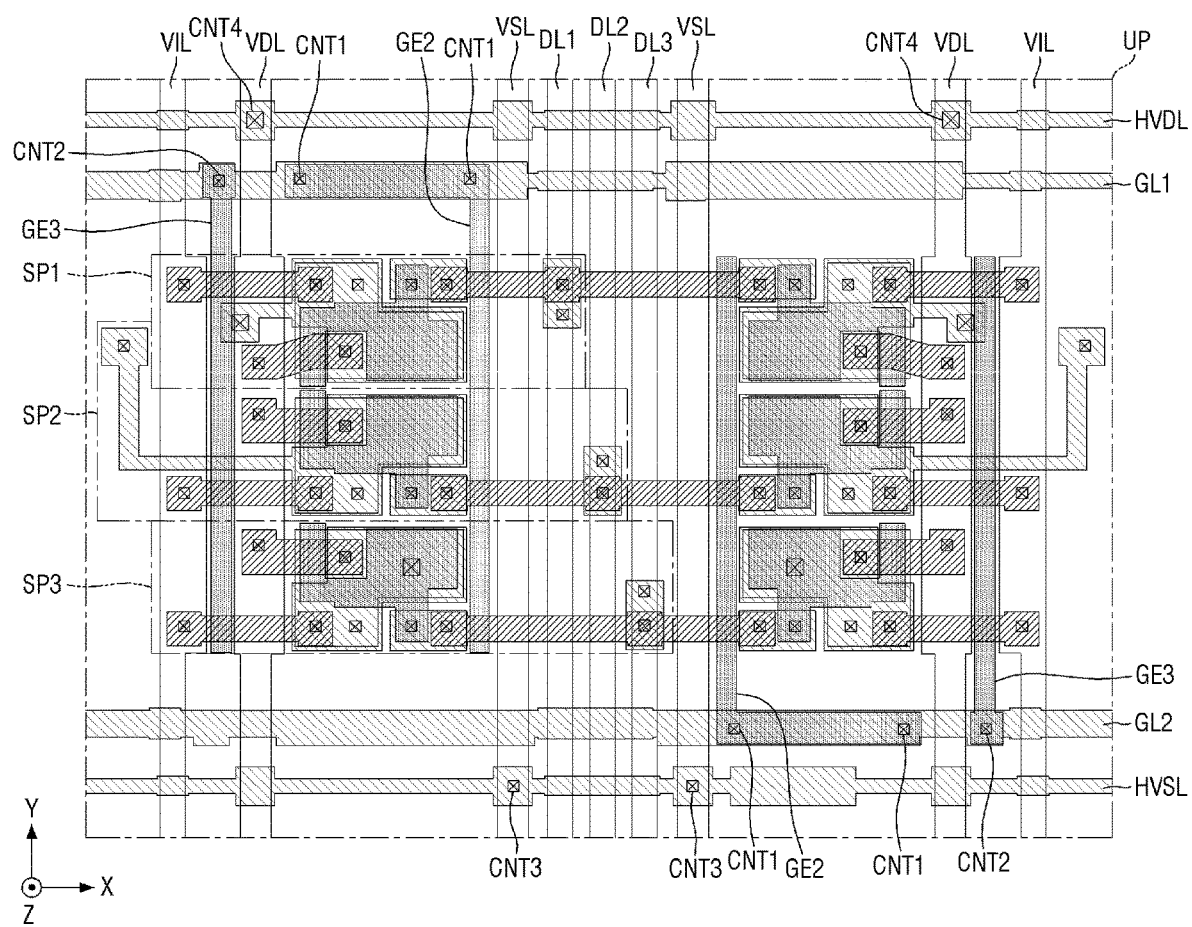
FIG. 9 is a layout diagram showing a plurality of unit pixels of a display device according to one or more embodiments of the present disclosure.
Figure 10:
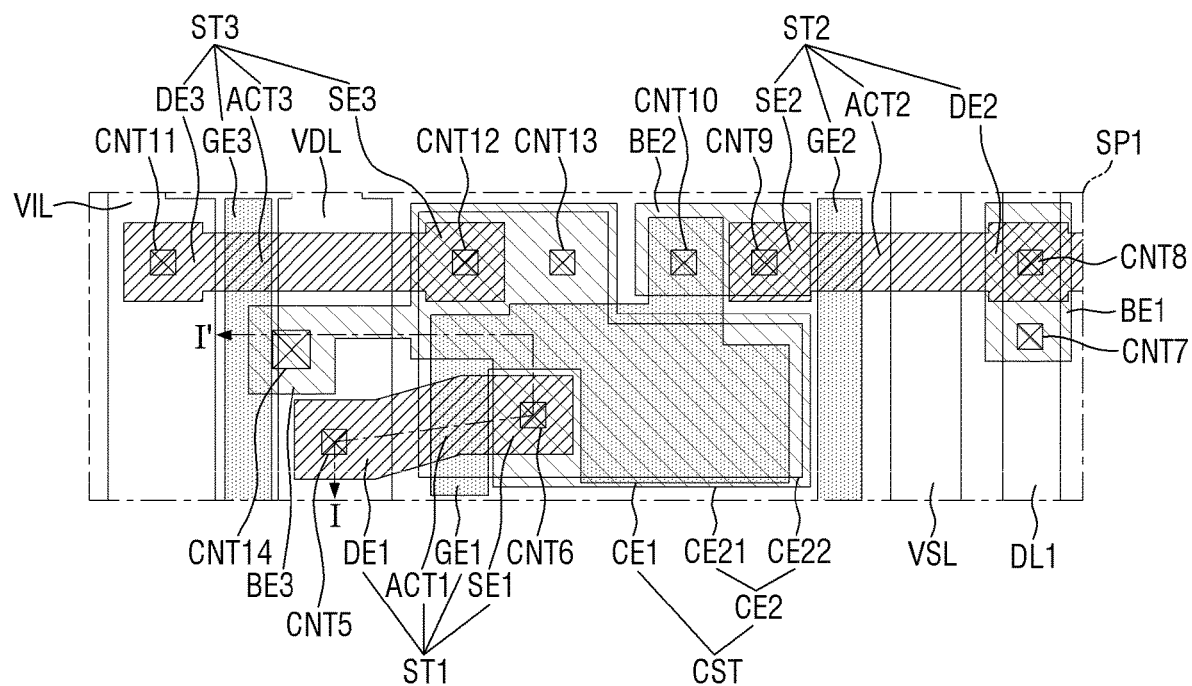
FIG. 10 is a layout diagram showing a first pixel of FIG. 9.
Figure 11:
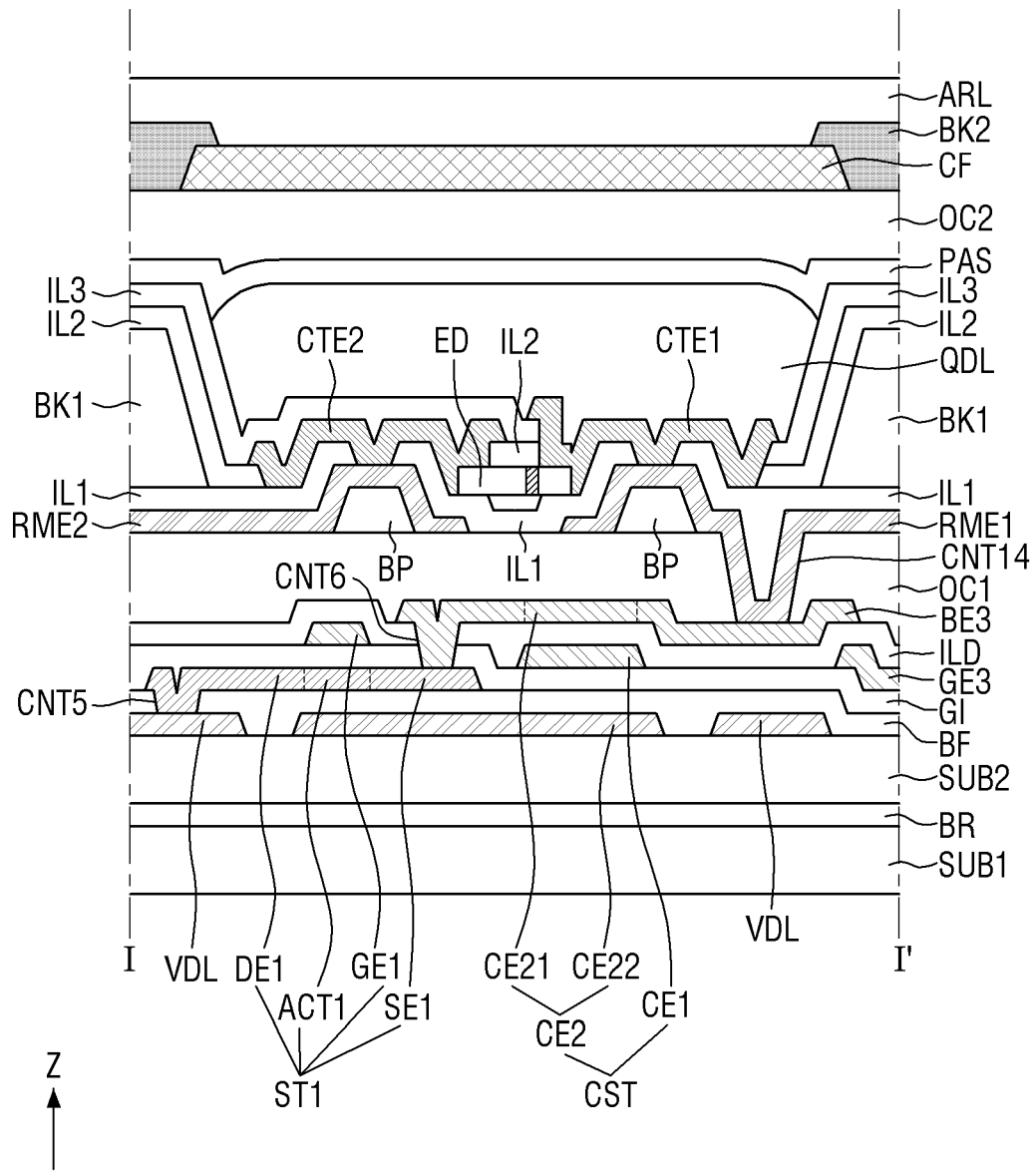
FIG. 11 is a cross-sectional view, taken along the line I-I' of FIG. 10.
Figure 12:
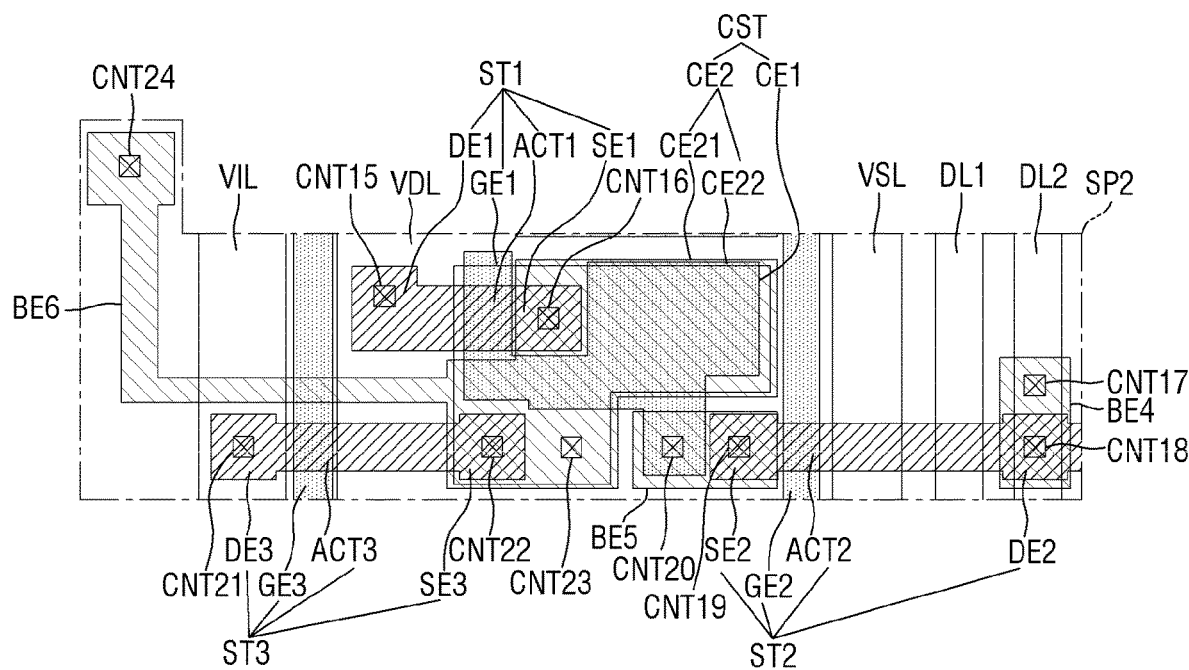
FIG. 12 is a layout diagram showing a second pixel of FIG. 9.
Figure 13:
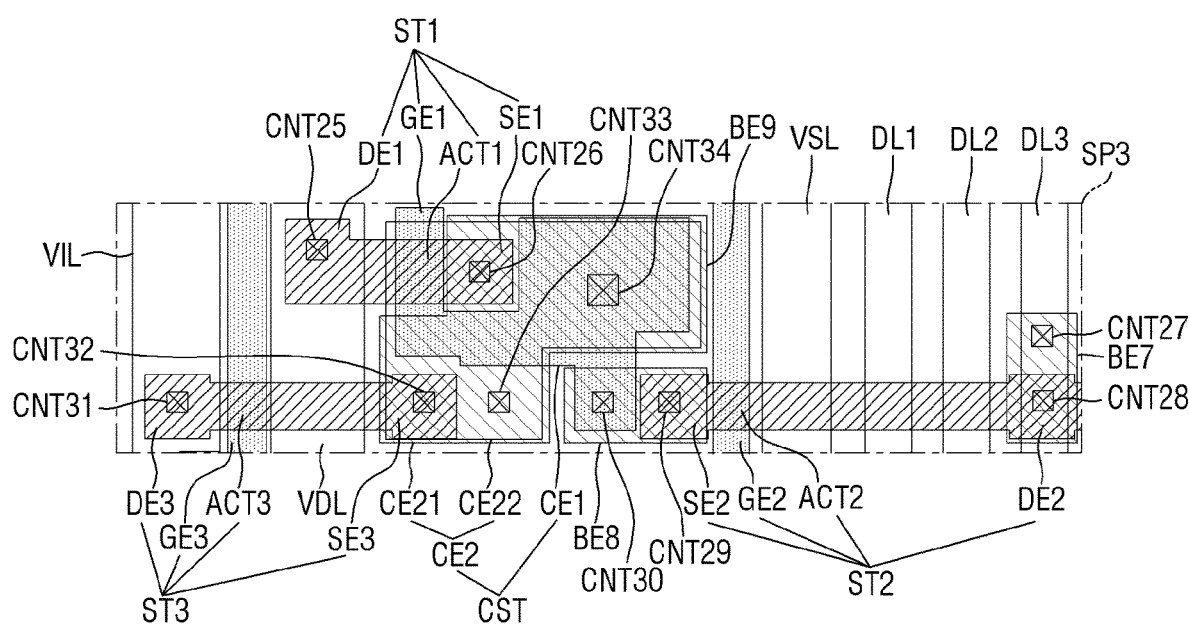
FIG. 13 is a layout diagram showing a third pixel of FIG. 9.

FIG. 9 is a layout diagram showing a plurality of unit pixels of a display device according to one or more embodiments of the present disclosure. FIG. 10 is a layout diagram showing a first pixel of FIG. 9. FIG. 11 is a cross-sectional view, taken along the line I-I' of FIG. 10. FIG. 12 is a layout diagram showing a second pixel of FIG. 9. FIG. 13 is a layout diagram showing a third pixel of FIG. 9.

Referring to FIGS. 9-13, the unit pixel UP may include first to third pixels SP1, SP2, and SP3. The pixel circuit of the first pixel SP1, the pixel circuit of the second pixel SP2, and the pixel circuit of the third pixel SP3 may be arranged along the direction opposite to the second direction (y-axis direction).

The first gate line GL1 may be extended in the first direction (x-axis direction). The first gate line GL1 may be disposed on the upper side of the pixel circuit of the first pixel SP1. The first gate line GL1 may be connected to the gate electrode GE2 of the second transistor ST2 through a plurality of first contact holes CNT1. The gate electrode GE2 of the second transistor ST2 may be extended in a direction opposite to the second direction (y-axis direction) from the first gate line GL1. The gate electrode GE2 of the second transistor ST2 may be disposed between the first capacitor electrode CE1 of the storage capacitor CST and the second voltage line VSL.

The first gate line GL1 may be connected to the gate electrode GE3 of the third transistor ST3 through a second contact hole CNT2. The gate electrode GE3 of the third transistor ST3 may be extended in the direction opposite to the second direction (y-axis direction) from the first gate line GL1. The gate electrode GE3 of the third transistor ST3 may be disposed between the initialization voltage line VIL and the first voltage line VDL.

The plurality of power lines may supply the supply voltage received from the display driver DIC to the first to third pixels SP1, SP2, and SP3. The plurality of power lines may include, but is not limited to, a first voltage line VDL, an initialization voltage line VIL, and a second voltage line VSL.

The first voltage line VDL may be extended in the second direction (y-axis direction). The first voltage line VDL may be connected to a first horizontal voltage line HVDL through a fourth contact hole CNT4. The first voltage line VDL may be disposed on one side or the left side of the pixel circuit of the first pixel SP1. The first voltage line VDL may be disposed between the first capacitor electrode CE1 of the storage capacitor CST and the gate electrode GE3 of the third transistor ST3. The first voltage line VDL may be connected to the drain electrode DE1 of the first transistor ST1 of the first pixel SP1 through a fifth contact hole CNT5. The first voltage line VDL may be connected to the drain electrode DE1 of the first transistor ST1 of the second pixel SP2 through a fifteenth contact hole CNT15. The first voltage line VDL may be connected to the drain electrode DE1 of the first transistor ST1 of the third pixel SP3 through a twenty-fifth contact hole CNT25. Accordingly, the first voltage line VDL may supply a driving voltage or a high-level voltage to the first transistor ST1 of each of the first to third pixels SP1, SP2, and SP3.

The initialization voltage line VIL may be extended in the second direction (y-axis direction). The initialization voltage line VIL may be disposed on one side or the left side of the first voltage line VDL. The initialization voltage line VIL may be spaced from the first voltage line VDL with the gate electrode GE3 of the third transistor ST3 therebetween. The initialization voltage line VIL may be connected to the drain electrode DE3 of the third transistor ST3 of the first pixel SP1 through an eleventh contact hole CNT11. The initialization voltage line VIL may be connected to the drain electrode DE3 of the third transistor ST3 of the second pixel SP2 through a twenty-first contact hole CNT21. The initialization voltage line VIL may be connected to the drain electrode DE3 of the third transistor ST3 of the third pixel SP3 through a thirty-first contact hole CNT31. Accordingly, the initialization voltage line VIL may supply the initialization voltage to the third transistor ST3 of each of the first to third pixels SP1, SP2, and SP3.

The second voltage line VSL may be extended in the second direction (y-axis direction). The second voltage line VSL may be connected to a second horizontal voltage line HVSL through a third contact hole CNT3. The second voltage line VSL may be disposed on the opposite side or the right side of the pixel circuit of the first pixel SP1. The second voltage line VSL may be disposed between the gate electrode GE2 of the second transistor ST2 and the first data line DL1. The second voltage line VSL may supply a low-level voltage to the second electrodes of the light-emitting diodes ED of each of the first to third pixels SP1, SP2, and SP3.

The first data line DL1 may be extended in the second direction (y-axis direction). The first data line DL1 may be disposed on the opposite side or the right side of the second voltage line VSL. The first data line DL1 may be connected to a first connection electrode BE1 through a seventh contact hole CNT7, and the first connection electrode BE1 may be connected to the drain electrode DE2 of the second transistor ST2 of the first pixel SP1 through an eighth contact hole CNT8. Accordingly, the first data line DL1 may supply the data voltage to the second transistor ST2 of the first pixel SP1.

The second data line DL2 may be extended in the second direction (y-axis direction). The second data line DL2 may be disposed on the opposite side or the right side of the first data line DL1. The second data line DL2 may be connected to a fourth connection electrode BE4 through a seventeenth contact hole CNT17, and the fourth connection electrode BE4 may be connected to the drain electrode DE2 of the second transistor ST2 of the second pixel SP2 through an eighteenth contact hole CNT18. Accordingly, the second data line DL2 may supply the data voltage to the second transistor ST2 of the second pixel SP2.

The third data line DL3 may be extended in the second direction (y-axis direction). The third data line DL3 may be disposed on the opposite side or the right side of the second data line DL2. The third data line DL3 may be connected to a seventh connection electrode BE7 through a twenty-seventh contact hole CNT27, and the seventh connection electrode BE7 may be connected to the drain electrode DE2 of the second transistor ST2 of the third pixel SP3 through a twenty-eighth contact hole CNT28. Accordingly, the third data line DL3 may supply the data voltage to the second transistor ST2 of the third pixel SP3.

In FIGS. 10 and 11, the pixel circuit of the first pixel SP1 may include the first to third transistors ST1, ST2, and ST3. The first transistor ST1 of the first pixel SP1 may include a semiconductor region ACT1, a gate electrode GE1, a drain electrode DE1, and a source electrode SE1. The semiconductor region ACT1 of the first transistor ST1 may be disposed on the buffer layer BF, and may overlap with the gate electrode GE1 of the first transistor ST1 in the thickness direction of a first substrate SUB1 (z-axis direction).

The gate electrode GE1 of the first transistor ST1 may be disposed on the gate insulator GI. The gate electrode GE1 of the first transistor ST1 may be a portion of the first capacitor electrode CE1 of the storage capacitor CST. The first capacitor electrode CE1 may be connected to a second connection electrode BE2 through a tenth contact hole CNT10, and the second connection electrode BE2 may be connected to the source electrode SE2 of the second transistor ST2 through a ninth contact hole CNT9.

The drain electrode DE1 and the source electrode SE1 of the first transistor ST1 may be disposed on the buffer layer BF. The drain electrode DE1 of the first transistor ST1 may be connected to the first voltage line VDL through the fifth contact hole CNT5. The drain electrode DE1 of the first transistor ST1 may receive a driving voltage from the first voltage line VDL.

The source electrode SE1 of the first transistor ST1 may be connected to the third connection electrode BE3 through a sixth contact hole CNT6. The third connection electrode BE3 may include the first sub-electrode CE21 of the second capacitor electrode CE2. The third connection electrode BE3 may be connected to the second sub-electrode CE22 of the second capacitor electrode CE2 through a thirteenth contact hole CNT13. Accordingly, the storage capacitor CST may be formed between the first capacitor electrode CE1 and the first sub-electrode CE21 of the second capacitor electrode CE2 as well as between the first capacitor electrode CE1 and the second sub-electrodes CE22 of the second capacitor electrode CE2.

The third connection electrode BE3 may be connected to the source electrode SE3 of the third transistor ST3 through a twelfth contact hole CNT12. The third connection electrode BE3 may be connected to the first electrode RME1 disposed on the first planarization layer OC1 through a fourteenth contact hole CNT14.

The second transistor ST2 of the first pixel SP1 may include the semiconductor region ACT2, the gate electrode GE2, the drain electrode DE2, and the source electrode SE2. The semiconductor region ACT2 of the second transistor ST2 may be disposed on the buffer layer BF, and may overlap with the gate electrode GE2 of the second transistor ST2 in the thickness direction of the first substrate SUB1 (z-axis direction).

The gate electrode GE2 of the second transistor ST2 may be disposed on the gate insulator GI. The gate electrode GE2 of the second transistor ST2 may be extended in a direction opposite to the second direction (y-axis direction) from the first gate line GL1. The gate electrode GE2 of the second transistor ST2 may be disposed between the first capacitor electrode CE1 of the storage capacitor CST and the second voltage line VSL.

The drain electrode DE2 of the second transistor ST2 may be connected to the first connection electrode BE1 through the eighth connection contact hole CNT8, and the first connection electrode BE1 may be connected to the first data line DL1 through the seventh contact hole CNT7. The drain electrode DE2 of the second transistor ST2 may receive a data voltage of the first pixel SP1 from the first data line DL1.

The source electrode SE2 of the second transistor ST2 may be connected to the second connection electrode BE2 through the ninth contact hole CNT9, and the second connection electrode BE2 may be connected to the first capacitor electrode CE1 through the tenth contact hole CNT10. The second connection electrode BE2 may be connected to the first capacitor electrode CE1, and connected to the gate electrode GE1 of the first transistor ST1.

The third transistor ST3 of the first pixel SP1 may include a semiconductor region ACT3, a gate electrode GE3, a drain electrode DE3, and a source electrode SE3. The semiconductor region ACT3 of the third transistor ST3 may be disposed on the buffer layer BF, and may overlap with the gate electrode GE3 of the third transistor ST3 in the thickness direction of the first substrate SUB1 (z-axis direction).

The gate electrode GE3 of the third transistor ST3 may be disposed on the gate insulator GI. The gate electrode GE3 of the third transistor ST3 may be extended in the direction opposite to the second direction (y-axis direction) from the first gate line GL1. The gate electrode GE3 of the third transistor ST3 may be disposed between the initialization voltage line VIL and the first voltage line VDL.

The drain electrode DE3 of the third transistor ST3 may be connected to the initialization voltage line VIL through the eleventh contact hole CNT11. The drain electrode DE3 of the third transistor ST3 may receive an initialization voltage from the initialization voltage line VIL.

The source electrode SE3 of the third transistor ST3 may be connected to the third connection electrode BE3 through the twelfth contact hole CNT12. The third connection electrode BE3 may be connected to the source electrode SE1 of the first transistor ST1 through the sixth contact hole CNT6, may be connected to the second sub-electrode CE22 of the second capacitor electrode CE2 through the thirteenth contact hole CNT13, and may be connected to the first electrode RME1 disposed on the first planarization layer OC1 through the fourteenth contact hole CNT14.

In FIG. 11, the display device 10 may include a first substrate SUB1, a barrier layer BR, a second substrate SUB2, a first voltage line VDL, a storage capacitor CST, a buffer layer BF, a first transistor ST1, a gate insulator GI, an interlayer dielectric film ILD, a third connection electrode BE3, a first planarization layer OC1, protrusion patterns BP, a first electrode RME1, a second electrode RME2, a first insulating layer IL1, a light-emitting diode ED, a second insulating layer IL2, a first contact electrode CTE1, a second contact electrode CTE2, a first light-blocking member BK1, a third insulating layer IL3, a wavelength conversion layer QDL, a passivation layer PAS, a second planarization layer OC2, a color filter CF, a second light-blocking member BK2, and an anti-reflection layer ARL.

The first substrate SUB1 may support the display device 10. The first substrate SUB1 may be a base substrate or a base member. The first substrate SUB1 may be a flexible substrate that can be bent, folded, and/or rolled. For example, the first substrate SUB1 may include, but is not limited to, an insulating material such as a polymer resin, like polyimide (PI).

The barrier layer BR may be disposed on the first substrate SUB1. The barrier layer BR may include an inorganic material that can prevent the permeation of air or moisture. For example, the barrier layer BR may include at least one of: silicon nitride, aluminum nitride, zirconium nitride, titanium nitride, hafnium nitride, tantalum nitride, silicon oxide, aluminum oxide, titanium oxide, tin oxide, cerium oxide and silicon oxynitride.

The second substrate SUB2 may be disposed on the barrier layer BR. The second substrate SUB2 may be a base substrate or a base member. The second substrate SUB2 may be a flexible substrate that can be bent, folded, and/or rolled. For example, the second substrate SUB2 may include, but is not limited to, an insulating material such as a polymer resin, like polyimide (PI).

The first voltage line VDL may be disposed on the second substrate SUB2. The first voltage line VDL may be extended in the second direction (y-axis direction). The first voltage line VDL may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second sub-electrode CE22 of the second capacitor electrode CE2 of the storage capacitor CST may be disposed on the second substrate SUB2 to be spaced from the first voltage line VDL. The second sub-electrode CE22 of the second capacitor electrode CE2 may be made of the same material as that of the first voltage line VDL at the same layer. The second sub-electrode CE22 of the second capacitor electrode CE2 may overlap with the first capacitor electrode CE1 and the first sub-electrode CE21 of the second capacitor electrode CE2 in the thickness direction of the first substrate SUB1 (z-axis direction).

The buffer layer BF may cover the first voltage line VDL, the second sub-electrode CE22 of the second capacitor electrode CE2, and the second substrate SUB2. The buffer layer BF may include the fifth contact hole CNT5 into which the drain electrode DE1 of the first transistor ST1 is inserted. The buffer layer BF may include an inorganic material that can prevent or reduce the permeation of air or moisture. For example, the buffer layer BF may include a plurality of inorganic films stacked on one another alternately.

The first transistor ST1 may be disposed on the buffer layer BF. The first transistor ST1 may include a semiconductor region ACT1, a gate electrode GE1, a drain electrode DE1, and a source electrode SE1.

The semiconductor region ACT1, the drain electrode DE1 and the source electrode SE1 may be disposed on the buffer layer BF. The semiconductor region ACT1 may overlap the gate electrode GE1 in the thickness direction of the first substrate SUB1 (z-axis direction) and may be insulated from the gate electrode GE1 by the gate insulator GI. The drain electrode DE1 and the source electrode SE1 may be formed by making the material of the semiconductor region ACT1 conductive.

The gate electrode GE1 may be disposed on the gate insulator GI. The gate electrode GE1 may overlap the semiconductor region ACT1 in the thickness direction of the first substrate SUB1 (z-axis direction) with the gate insulator GI interposed therebetween.

The gate insulator GI may be disposed on the semiconductor region ACT1, the drain electrode DE1, the source electrode SE1, and the buffer layer BF. For example, the gate insulator GI may cover the semiconductor region ACT1, the drain electrode DE1, the source electrode SE1 and the buffer layer BF, and may insulate the semiconductor region ACT1 from the gate electrode GE1. The gate insulator GI may include a sixth contact hole CNT6 into which the third connection electrode BE3 is inserted.

The first capacitor electrode CE1 of the storage capacitor CST may be disposed on the gate insulator GI. The first capacitor electrode CE1 may be made of the same material as the gate electrode GE1 at the same layer. The first capacitor electrode CE1 may overlap in the thickness direction of the first substrate SUB1 (z-axis direction) with each of the first sub-electrode CE21 of the second capacitor electrode CE2 disposed thereon, and the second sub-electrode CE22 of the second capacitor electrode CE2 disposed thereunder.

The interlayer dielectric film ILD may be disposed on the gate electrode GE1, the first capacitor electrode CE1, and the gate insulator GI. The interlayer dielectric film ILD may include a sixth contact hole CNT6 into which the third connection electrode BE3 is inserted. Accordingly, the sixth contact hole CNT6 may penetrate through the interlayer dielectric film ILD and the gate insulator GI.

The third connection electrode BE3 may be disposed on the interlayer dielectric film ILD. The third connection electrode BE3 may be made of the same material at the same layer as the first, second, and fourth to ninth connection electrodes BE1, BE2, and BE4 to BE9. The third connection electrode BE3 may connect the first electrode RME1 with the source electrode SE1 of the first transistor ST1. The third connection electrode BE3 may come in contact with the source electrode SE1 through the contact hole CNT6 formed in the gate insulator GI and the interlayer dielectric film ILD. The third connection electrode BE3 may include the first sub-electrode CE21 of the second capacitor electrode CE2.

The first planarization layer OC1 may be disposed on the third connection electrode BE3 to provide a flat surface over the first transistor ST1. For example, the first planarization layer OC1 may include a fourteenth contact hole CNT14 into which the first electrode RME1 is inserted. The first planarization layer OC1 may include an organic insulating material such as polyimide (PI).

The protrusion patterns BP may be disposed on the first planarization layer OC1. The protrusion patterns BP may protrude from the upper surface of the first planarization layer OC1. The protrusion patterns BP may be disposed in an emission area or an opening area of each of the plurality of pixels. The plurality of light-emitting diodes ED may be disposed between the plurality of protrusion patterns BP. The protrusion patterns BP may have inclined side surfaces, and light emitted from the plurality of light-emitting diodes ED may be reflected by the first and second electrodes RME1 and RME2 disposed on the protrusion patterns BP. For example, the protrusion patterns BP may include an organic insulating material such as polyimide (PI).

The first electrode RME1 may be disposed on the first planarization layer OC1 and the protrusion pattern BP. The first electrode RME1 may be disposed on the protrusion pattern BP disposed on one side of the plurality of light-emitting diodes ED. The first electrode RME1 may be disposed on the inclined side surface of the protrusion pattern BP to reflect light emitted from the light-emitting diodes ED. The first electrode RME1 may be inserted into the fourteenth contact hole CNT14 formed in the first planarization layer OC1 to be connected to the third connection electrode BE3. The first electrode RME1 may be electrically connected to one ends of the light-emitting diodes ED through the first contact electrode CTE1. For example, the first electrode RME1 may receive a voltage proportional to the luminance of the light-emitting diodes ED from the pixel circuit of the pixel.

The second electrode RME2 may be disposed on the first planarization layer OC1 and the protrusion pattern BP. The second electrode RME2 may be disposed on the protrusion pattern BP disposed on the other side of the plurality of light-emitting diodes ED. The second electrode RME2 may be disposed on the inclined side surface of the protrusion pattern BP to reflect light emitted from the light-emitting diodes ED. The second electrode RME2 may be electrically connected to the other ends of the light-emitting diodes ED through the second contact electrode CTE2. For example, the second electrode RME2 may receive a low-level voltage supplied to all pixels from the second voltage line VSL.

The first and second electrodes RME1 and RME2 may include a conductive material with high reflectivity. For example, the first and second electrodes RME1 and RME2 may include at least one of silver (Ag), copper (Cu), aluminum (Al), nickel (Ni) and lanthanum (La). For another example, the first and second electrodes RME1 and RME2 may include a material such as ITO, IZO, and ITZO. As another example, the first and second electrodes RME1 and RME2 may include a plurality of layers having a transparent conductive material layer and a highly reflective metal layer, or may include a single layer including a transparent conductive material and a highly reflective metal. The first and second electrodes RME1 and RME2 may have a stack structure such as ITO/Ag/ITO/, ITO/Ag/IZO, and ITO/Ag/ITZO/IZO.

The first insulating layer IL1 may be disposed on the first planarization layer OC1, and the first and second electrodes RME1 and RME2. The first insulating layer IL1 can protect the first and second electrodes RME1 and RME2 and insulate from each other. The first insulating layer IL1 can prevent or protect the light-emitting diodes ED from being damaged by direct contact with the first and second electrodes RME1 and RME2 during the process of aligning the light-emitting diodes ED.

The first light-blocking member BK1 may be disposed on the first insulating layer IL1. The first light-blocking member BK1 may define an emission area or an opening area of each of the first to third pixels SP1, SP2, and SP3. The first light-blocking member BK1 may be disposed at the boundaries between the first to third pixels SP1, SP2, and SP3 to distinguish the light-emitting diodes ED of one of the plurality of pixels from those of another one. The first light-blocking member BK1 may have a suitable height (e.g., a predetermined height) and may include an organic insulating material such as polyimide (PI).

The plurality of light-emitting diodes ED may be disposed on the first insulating layer IL1. The plurality of light-emitting diodes ED may be aligned in parallel with one another between the first and second electrodes RME1 and RME2. The light-emitting diodes ED may be longer than the distance between the first and second electrodes RME1 and RME2. The light-emitting diodes ED may include a plurality of semiconductor layers. One end and the other end opposite to the one end may be defined with respect to one of the semiconductor layers. First ends of the light-emitting diodes ED may be disposed on the first electrode RME1, and second ends of the light-emitting diodes ED may be disposed on the second electrode RME2. The first ends of the light-emitting diodes ED may be electrically connected to the first electrode RME1 through the first contact electrode CNE1, and the second ends thereof may be electrically connected to the second electrode RME2 through the second contact electrode CTE2.

The light-emitting diodes ED may have a size of a micro-meter or a nano-meter, and may be inorganic light-emitting diodes containing an inorganic material. The inorganic light-emitting diodes may be aligned between the first and second electrodes RME1 and RME2 according to an electric field formed in a specific direction between the first and second electrodes RME1 and RME2 facing (or opposing) each other.

For example, the plurality of light-emitting diodes ED may include active layers having the same material so that they may emit light of the same wavelength or light of the same color. The light emitted from an emission area of each of the first to third pixels SP1, SP2 and SP3 of the emission material layer EML may have the same color. For example, the plurality of light-emitting diodes ED may emit light of the third color or blue light having a peak wavelength in the range of 440 nm to 480 nm. It should be understood that the present disclosure is not limited thereto.

The second insulating layer IL2 may be disposed on the plurality of light-emitting diodes ED and the first light-blocking member BK1. For example, the second insulating layer IL2 may partially cover the plurality of light-emitting diodes ED and may not cover both ends of each of the plurality of light-emitting diodes ED. The second insulating layer IL2 can protect the plurality of light-emitting diodes ED and can fix the plurality of light-emitting diodes ED during the process of fabricating the display device 10. The space between the light-emitting diodes ED and the first insulating layer IL1 may be filled with the second insulating layer IL2.

The first contact electrode CTE1 may be disposed on the first insulating layer IL1, and may be inserted into a contact hole formed in the first insulating layer IL1 to be connected to the first electrode RME1. For example, the contact hole of the first insulating layer IL1 may be formed on the protrusion pattern BP, but the present disclosure is not limited thereto. One end of the first contact electrode CTE1 may be connected to the first electrode RME1 on the protrusion pattern BP, and the other end of the first contact electrode CTE1 may be connected to the first ends of the light-emitting diodes ED.

The second contact electrode CTE2 may be disposed on the first insulating layer IL1, and may be inserted into a contact hole formed in the first insulating layer IL1 to be connected to the second electrode RME2. For example, the contact hole of the first insulating layer IL1 may be formed on the protrusion pattern BP, but the present disclosure is not limited thereto. One end of the second contact electrode CTE2 may be connected to the second end of the light-emitting diode ED, and the other end of the second contact electrode CTE2 may be connected to the second electrode RME2 on the protruding pattern BP.

The third insulating layer IL3 may be disposed on the second contact electrode CTE2 and the second insulating layer IL2. The third insulating layer IL3 may cover the second contact electrode CTE2 and may insulate the first and second contact electrodes CTE1 and CTE2.

The wavelength conversion layer QDL may be disposed on the first and second contact electrodes CTE1 and CTE2 and partially disposed on the third insulating layer IL3. The wavelength conversion layer QDL may be disposed in an emission area or an opening area of each of the first to third pixels SP1, SP2, and SP3. The wavelength conversion layer QDL may be surrounded by the first light-blocking member BK1 when viewed from the top. In other words, the first light-blocking member BK1 may be around the wavelength conversion layer QDL. The wavelength conversion layer QDL may convert or shift the peak wavelength of incident light. For example, the wavelength conversion layer QDL may convert blue light provided from the plurality of light-emitting diodes ED into red light or green light, so that the converted light exits. As another example, the wavelength conversion layer QDL may transmit blue light provided from the plurality of light-emitting diodes ED.

The passivation layer PAS may be disposed on the wavelength conversion layer QDL and the third insulating layer IL3. The passivation layer PAS may seal the wavelength conversion layer QDL to prevent damage or contamination of the wavelength conversion layer QDL. For example, the passivation layer PAS may include an inorganic material.

The second planarization layer OC2 may be disposed on the passivation layer PAS to provide a flat surface over the wavelength conversion layer QDL. For example, the second planarization layer OC2 may include an organic insulating material such as polyimide (PI).

The color filter CF may be disposed in an emission area or an opening area on the second planarization layer OC2. The color filter CF may be surrounded by the second light-blocking member BK2. The color filter CF may overlap with the wavelength conversion layer QDL in the thickness direction of the first substrate SUB 1 (z-axis direction). The color filter CF may selectively transmit a specific color while blocking or absorbing other colors. For example, the color filter CF may include a red, green, or blue colorant.

The second light-blocking member BK2 may be disposed on the second planarization layer OC2 to cover an edge of the color filter CF. The second light-blocking member BK2 may overlap with the first light-blocking member BK1 in the thickness direction of the first substrate SUB 1 (z-axis direction). The second light-blocking member BK2 can block the transmission of light. The second light-blocking member BK2 can improve the color gamut of the display devices 10 by preventing lights from intruding and mixing among the first to third pixels SP1, SP2, and SP3. The second light-blocking member BK2 may be disposed in a lattice shape surrounding the first to third pixels SP1, SP2, and SP3 when viewed from the top.

The anti-reflection layer ARL may be disposed on the color filter CF and the second light-blocking member BK2. The anti-reflection layer ARL may include a first inorganic film, an organic film, and a second inorganic film. The organic film may be disposed on the first inorganic film, and the second inorganic film may be disposed on the organic film. The first inorganic film and the second inorganic film may include different materials. For example, the first inorganic film may include SiON, and the second inorganic film may include SiOx. The light reflected at the interface between the first inorganic film and the organic film and the light reflected at the interface between the organic film and the second inorganic film may be canceled by destructive interference. In this manner, the anti-reflection layer ARL can prevent visibility from deteriorating due to reflection of external light. In one or more embodiments. the anti-reflection layer ARL may be eliminated. As another example, the anti-reflection layer ARL may be replaced with a polarizing film.

In FIG. 12, the pixel circuit of the second pixel SP2 may include first to third transistors ST1, ST2, and ST3. The first transistor ST1 of the second pixel SP2 may include a semiconductor region ACT1, a gate electrode GE1, a drain electrode DE1, and a source electrode SE1. The semiconductor region ACT1 of the first transistor ST1 may be disposed on the buffer layer BF, and may overlap with the gate electrode GE1 of the first transistor ST1 in the thickness direction of the first substrate SUB1 (z-axis direction).

The gate electrode GE1 of the first transistor ST1 may be disposed on the gate insulator GI. The gate electrode GE1 of the first transistor ST1 may be a portion of the first capacitor electrode CE1 of the storage capacitor CST. The first capacitor electrode CE1 may be connected to a fifth connection electrode BE5 through a twentieth contact hole CNT20, and the fifth connection electrode BE5 may be connected to the source electrode SE2 of the second transistor ST2 through a nineteenth contact hole CNT19.

The drain electrode DE1 and the source electrode SE1 of the first transistor ST1 may be disposed on the buffer layer BF. The drain electrode DE1 of the first transistor ST1 may be connected to the first voltage line VDL through the fifteenth contact hole CNT15. The drain electrode DE1 of the first transistor ST1 may receive a driving voltage from the first voltage line VDL.

The source electrode SE1 of the first transistor ST1 may be connected to a sixth connection electrode BE6 through a sixteenth contact hole CNT16. The sixteen connection electrode BE6 may include the first sub-electrode CE21 of the second capacitor electrode CE2. The sixth connection electrode BE6 may be connected to the second sub-electrode CE22 of the second capacitor electrode CE2 through a twenty-third contact hole CNT23. Accordingly, the storage capacitor CST may be formed between the first capacitor electrode CE1 and the first sub-electrode CE21 of the second capacitor electrode CE2 as well as between the first capacitor electrode CE1 and the second sub-electrodes CE22 of the second capacitor electrode CE2.

The sixth connection electrode BE6 may be connected to the source electrode SE3 of the third transistor ST3 through a twenty-second contact hole CNT22. The sixth connection electrode BE6 may be connected to the first electrode RME1 disposed on the first planarization layer OC1 through a twenty-fourth contact hole CNT24.

The second transistor ST2 of the second pixel SP2 may include a semiconductor region ACT2, a gate electrode GE2, a drain electrode DE2, and a source electrode SE2. The semiconductor region ACT2 of the second transistor ST2 may be disposed on the buffer layer BF, and may overlap with the gate electrode GE2 of the second transistor ST2 in the thickness direction of the first substrate SUB1 (z-axis direction).

The gate electrode GE2 of the second transistor ST2 may be disposed on the gate insulator GI. The gate electrode GE2 of the second transistor ST2 may be extended in a direction opposite to the second direction (y-axis direction) from the first gate line GL1. The gate electrode GE2 of the second transistor ST2 may be disposed between the first capacitor electrode CE1 of the storage capacitor CST and the second voltage line VSL.

The drain electrode DE2 of the second transistor ST2 may be connected to the fourth connection electrode BE4 through the eighteenth contact hole CNT18, and the fourth connection electrode BE4 may be connected to the second data line DL2 through the seventeenth contact hole CNT17. The drain electrode DE2 of the second transistor ST2 may receive a data voltage of the second pixel SP2 from the second data line DL2.

The source electrode SE2 of the second transistor ST2 may be connected to the fifth connection electrode BE5 through the nineteenth contact hole CNT19, and the fifth connection electrode BE5 may be connected to the first capacitor electrode CE1 through a twentieth contact hole CNT20. The fifth connection electrode BE5 may be connected to the first capacitor electrode CE1, and connected to the gate electrode GE1 of the first transistor ST1.

The third transistor ST3 of the second pixel SP2 may include a semiconductor region ACT3, a gate electrode GE3, a drain electrode DE3, and a source electrode SE3. The semiconductor region ACT3 of the third transistor ST3 may be disposed on the buffer layer BF, and may overlap with the gate electrode GE3 of the third transistor ST3 in the thickness direction of the first substrate SUB1 (z-axis direction).

The gate electrode GE3 of the third transistor ST3 may be disposed on the gate insulator GI. The gate electrode GE3 of the third transistor ST3 may be extended in the direction opposite to the second direction (y-axis direction) from the first gate line GL1. The gate electrode GE3 of the third transistor ST3 may be disposed between the initialization voltage line VIL and the first voltage line VDL.

The drain electrode DE3 of the third transistor ST3 may be connected to the initialization voltage line VIL through the twenty-first contact hole CNT21. The drain electrode DE3 of the third transistor ST3 may receive an initialization voltage from the initialization voltage line VIL.

The source electrode SE3 of the third transistor ST3 may be connected to the sixth connection electrode BE6 through the twenty-second contact hole CNT22. The sixth connection electrode BE6 may be connected to the source electrode SE1 of the first transistor ST1 through the sixteenth contact hole CNT16, may be connected to the second sub-electrode CE22 of the second capacitor electrode CE2 through the twenty-third contact hole CNT23, and may be connected to the first electrode RME1 disposed on the first planarization layer OC1 through the twenty-fourth contact hole CNT24.

In FIG. 13, the pixel circuit of the third pixel SP3 may include the first to third transistors ST1, ST2, and ST3. The first transistor ST1 of the third pixel SP3 may include a semiconductor region ACT1, a gate electrode GE1, a drain electrode DE1, and a source electrode SE1. The semiconductor region ACT1 of the first transistor ST1 may be disposed on the buffer layer BF, and may overlap with the gate electrode GE1 of the first transistor ST1 in the thickness direction of the first substrate SUB1 (z-axis direction).

The gate electrode GE1 of the first transistor ST1 may be disposed on the gate insulator GI. The gate electrode GE1 of the first transistor ST1 may be a portion of the first capacitor electrode CE1 of the storage capacitor CST. The first capacitor electrode CE1 may be connected to an eighth connection electrode BE8 through a thirtieth contact hole CNT30, and the eighth connection electrode BE8 may be connected to the source electrode SE2 of the second transistor ST2 through a twenty-ninth contact hole CNT29.

The drain electrode DE1 and the source electrode SE1 of the first transistor ST1 may be disposed on the buffer layer BF. The drain electrode DE1 of the first transistor ST1 may be connected to the first voltage line VDL through the twenty-fifth contact hole CNT25. The drain electrode DE1 of the first transistor ST1 may receive a driving voltage from the first voltage line VDL.

The source electrode SE1 of the first transistor ST1 may be connected to a ninth connection electrode BE9 through a twenty-sixth contact hole CNT26. The ninth connection electrode BE9 may include the first sub-electrode CE21 of the second capacitor electrode CE2. The ninth connection electrode BE9 may be connected to the second sub-electrode CE22 of the second capacitor electrode CE2 through a thirty-third contact hole CNT33. Accordingly, the storage capacitor CST may be formed between the first capacitor electrode CE1 and the first sub-electrode CE21 of the second capacitor electrode CE2 as well as between the first capacitor electrode CE1 and the second sub-electrodes CE22 of the second capacitor electrode CE2.

The ninth connection electrode BE9 may be connected to the source electrode SE3 of the third transistor ST3 through a thirty-second contact hole CNT32. The ninth connection electrode BE9 may be connected to the first electrode RME1 disposed on the first planarization layer OC1 through a thirty-fourth contact hole CNT34.

The second transistor ST2 of the third pixel SP3 may include a semiconductor region ACT2, a gate electrode GE2, a drain electrode DE2, and a source electrode SE2. The semiconductor region ACT2 of the second transistor ST2 may be disposed on the buffer layer BF, and may overlap with the gate electrode GE2 of the second transistor ST2 in the thickness direction of the first substrate SUB1 (z-axis direction).

The gate electrode GE2 of the second transistor ST2 may be disposed on the gate insulator GI. The gate electrode GE2 of the second transistor ST2 may be extended in a direction opposite to the second direction (y-axis direction) from the first gate line GL1. The gate electrode GE2 of the second transistor ST2 may be disposed between the first capacitor electrode CE1 of the storage capacitor CST and the second voltage line VSL.

The drain electrode DE2 of the second transistor ST2 may be connected to the seventh connection electrode BE7 through the twenty-eighth contact hole CNT28, and the seventh connection electrode BE7 may be connected to the third data line DL3 through the twenty-seventh contact hole CNT27. The drain electrode DE2 of the second transistor ST2 may receive a data voltage of the third pixel SP3 from the third data line DL3.

The source electrode SE2 of the second transistor ST2 may be connected to the eighth connection electrode BE8 through the twenty-ninth contact hole CNT29, and the eighth connection electrode BE8 may be connected to the first capacitor electrode CE1 through the thirtieth contact hole CNT30. The eighth connection electrode BE8 may be connected to the first capacitor electrode CE1, and connected to the gate electrode GE1 of the first transistor ST1.

The third transistor ST3 of the third pixel SP3 may include a semiconductor region ACT3, a gate electrode GE3, a drain electrode DE3, and a source electrode SE3. The semiconductor region ACT3 of the third transistor ST3 may be disposed on the buffer layer BF, and may overlap with the gate electrode GE3 of the third transistor ST3 in the thickness direction of the first substrate SUB1 (z-axis direction).

The gate electrode GE3 of the third transistor ST3 may be disposed on the gate insulator GI. The gate electrode GE3 of the third transistor ST3 may be extended in the direction opposite to the second direction (y-axis direction) from the first gate line GL1. The gate electrode GE3 of the third transistor ST3 may be disposed between the initialization voltage line VIL and the first voltage line VDL.

The drain electrode DE3 of the third transistor ST3 may be connected to the initialization voltage line VIL through the thirty-first contact hole CNT31. The drain electrode DE3 of the third transistor ST3 may receive an initialization voltage from the initialization voltage line VIL.

The source electrode SE3 of the third transistor ST3 may be connected to the ninth connection electrode BE9 through the thirty-second contact hole CNT32. The ninth connection electrode BE9 may be connected to the source electrode SE1 of the first transistor ST1 through the twenty-sixth contact hole CNT26, may be connected to the second sub-electrode CE22 of the second capacitor electrode CE2 through the thirty-third contact hole CNT33, and may be connected to the first electrode RME1 disposed on the first planarization layer OC1 through the thirty-fourth contact hole CNT34.

Figure 14:
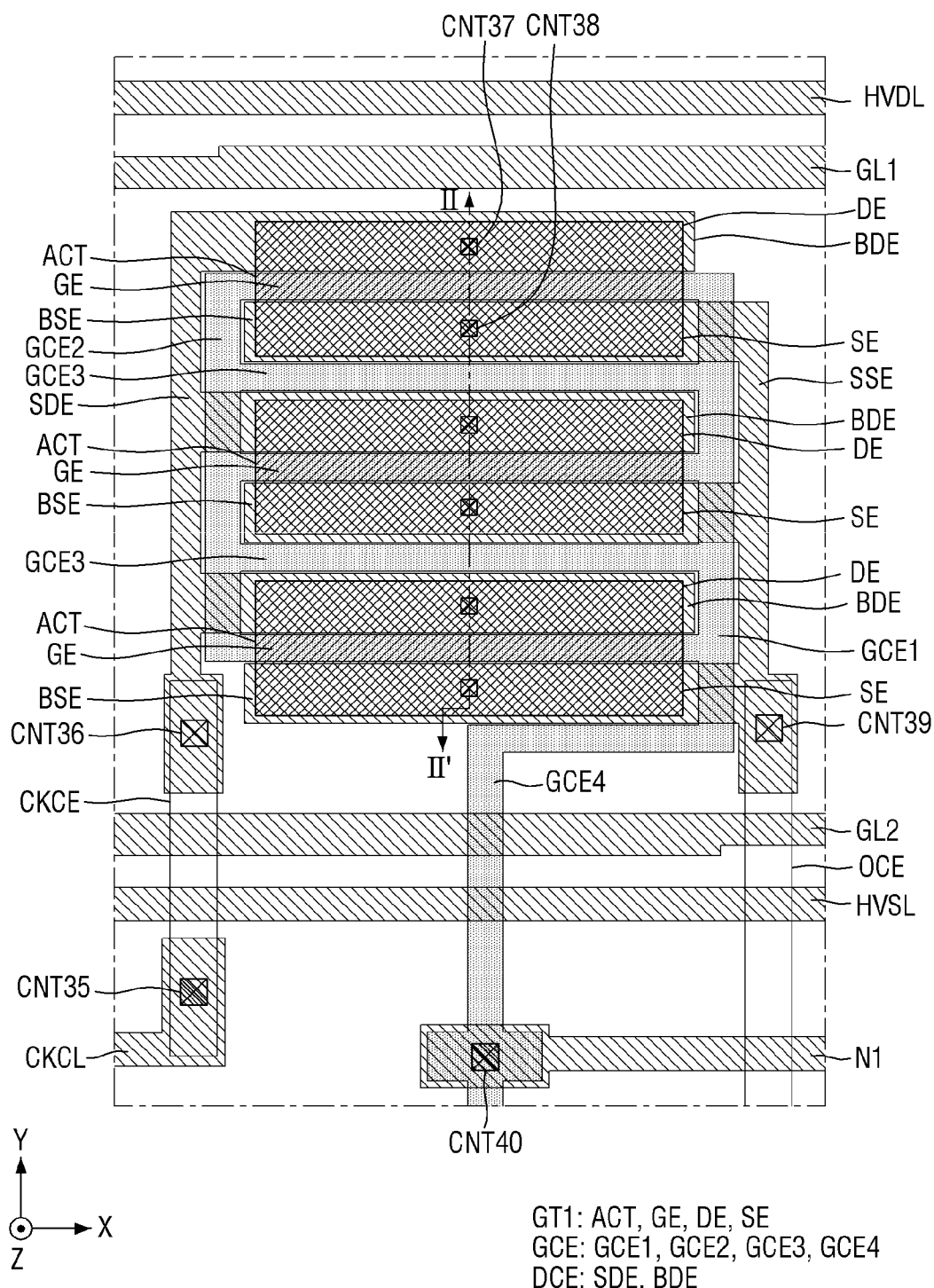
FIG. 14 is a layout diagram showing a first gate transistor of FIG. 7.
Figure 15:
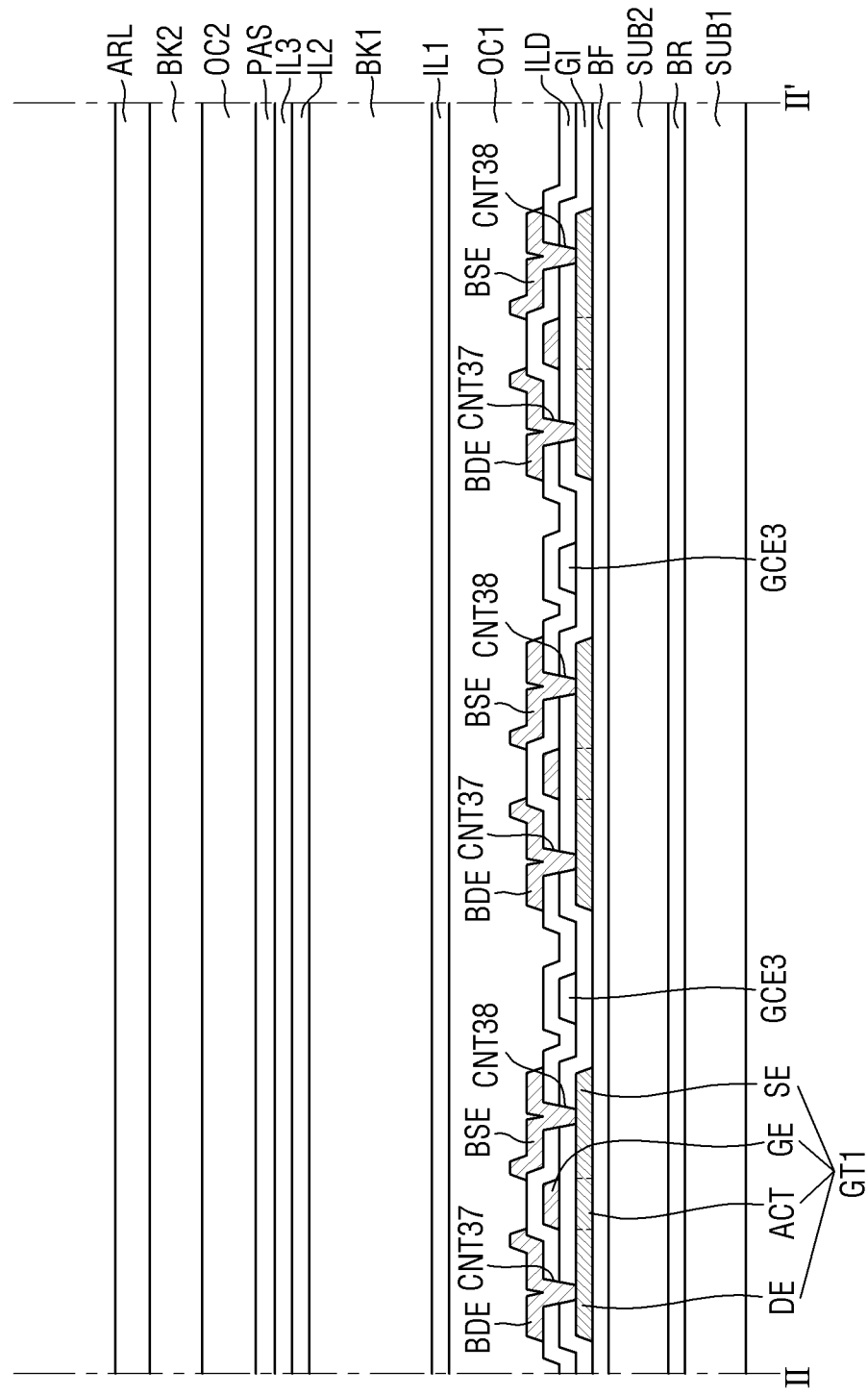
FIG. 15 is a cross-sectional view, taken along the line II-II' of FIG. 14.

FIG. 14 is a layout diagram showing a first gate transistor of FIG. 7. FIG. 15 is a cross-sectional view, taken along the line II-II' of FIG. 14.

Referring to FIGS. 14 and 15, the first gate transistor GT1 may be disposed between the first and second gate lines GL1 and GL2 in the second direction (y-axis direction). A plurality of first gate transistors GT1 may be formed and may be arranged along the second direction (y-axis direction). Each of the plurality of first gate transistors GT1 may include a semiconductor region ACT, a drain electrode DE, a source electrode SE, and a gate electrode GE. Gate connection electrodes GCE may include first to fourth gate connection electrodes GCE1, GCE2, GCE3, and GCE4.

The semiconductor region ACT may overlap with the gate electrode GE in the thickness direction of the first substrate SUB1 (z-axis direction). The semiconductor region ACT may not overlap with the third gate connection electrode GCE3 in the thickness direction of the first substrate SUB1 (z-axis direction).

Each of the plurality of drain electrodes DE may be disposed on the upper side of the semiconductor region ACT, and each of the plurality of source electrodes SE may be disposed on the lower side of the semiconductor region ACT. For example, the drain electrode DE and the source electrode SE forming a single first gate transistor GT1 may be spaced from each other with the semiconductor region ACT therebetween. The drain electrode DE and the source electrode SE forming a first gate transistor GT1 may be spaced from those of another first gate transistor GT1, with the third gate connection electrode GCE3 therebetween when viewed from the top. The plurality of drain electrodes DE may be connected to a drain connection electrodes DCE through thirty-seventh contact holes CNT37. The plurality of source electrodes SE may be connected to a source connection electrode SCE through thirty-eighth contact holes CNT38.

The drain connection electrode DCE may include a stem drain connection electrode SDE and branch drain connection electrodes BDE. The stem drain connection electrode SDE may be extended in the second direction (y-axis direction), and the branch drain connection electrodes BDE may branch off from the stem drain connection electrode SDE and may be extended in the first direction (x-axis direction). The branch drain connection electrodes BDE and branch source connection electrodes BSE may be alternately arranged along the second direction (y-axis direction). The plurality of drain electrodes DE may be connected to the branch drain connection electrodes BDE through the thirty-seventh contact holes CNT37.

The stem drain connection electrode SDE may be connected to a clock connection electrode CKCE through a thirty-sixth contact hole CNT36. The clock connection electrode CKCE may be extended in the second direction (y-axis direction) to cross the second gate line GL2 and the second horizontal voltage line HVSL. The clock connection electrode CKCE may be connected to the scan clock connection line CKCL connected to the first scan clock line SCKL1 through a thirty-fifth contact hole CNT35.

The source connection electrode SCE may include a stem source connection electrode SSE and branch source connection electrodes BSE. The stem source connection electrode SSE may be extended in the second direction (y-axis direction), and the branch source connection electrodes BSE may branch off from the stem source connection electrode SSE and may be extended in the opposite direction to the first direction (x-axis direction). The plurality of source electrodes SE may be connected to the branch source connection electrodes BSE through the thirty-eighth contact holes CNT38.

The stem source connection electrode SSE may be connected to an output connection electrode OCE through a thirty-ninth contact hole CNT39. The output connection electrode OCE may be extended in the second direction (y-axis direction) to cross the second gate line GL2, the second horizontal voltage line HVSL, and the first node N1. The output connection electrode OCE may be electrically connected to the gate signal output unit GOUT. Accordingly, the first gate transistor GT1 may be turned on based on the voltage at the first node N1 to provide the first scan clock signal SCK1 as a gate signal to the gate signal output unit GOUT.

The gate electrode GE may be extended in the first direction (x-axis direction). The gate electrode GE may be connected between the first and second gate connection electrodes GCE1 and GCE2. The first and second gate connection electrodes GCE1 and GCE2 may be extended in the second direction (y-axis direction), and the third gate connection electrode GCE3 may be extended in the first direction (x-axis direction). One end of the gate electrode GE may be connected to the first gate connection electrode GCE1, and the other end of the gate electrode GE may be connected to the second gate connection electrode GCE2. One end of the third gate connection electrode GCE3 may be connected to the first gate connection electrode GCE1, and the other end of the third gate connection electrode GCE3 may be connected to the second gate connection electrode GCE2. The fourth gate connection electrode GCE4 may be connected to the first gate connection electrode GCE1, and may be connected to the first node N1 through a fortieth contact hole CNT40.

In the example shown in FIG. 15, there may be a plurality of first gate transistors GT1. Each of the plurality of first gate transistors GT1 may include a semiconductor region ACT, a drain electrode DE, a source electrode SE, and a gate electrode GE.

The semiconductor region ACT, the drain electrode DE, and the source electrode SE of each of the first gate transistors GT1 may be disposed on the buffer layer BF. The semiconductor region ACT of the first gate transistor GT1 may overlap the gate electrode GE in the thickness direction of the first substrate SUB1 (z-axis direction) and may be insulated from the gate electrode GE by the gate insulator GI. The drain electrode DE and the source electrode SE may be formed by making the material of the semiconductor region ACT conductive. The plurality of drain electrodes DE may be connected to the branch drain connection electrodes BDE through the thirty-seventh contact holes CNT37. The plurality of source electrodes SE may be connected to the branch source connection electrodes BSE through the thirty-eighth contact holes CNT38. The gate electrode GE may be disposed on the gate insulator GI.

The third gate connection electrode BE3 may be disposed on the gate insulator GI such that it is spaced apart from the gate electrode GE. The third gate connection electrode BE3 may be made of the same material on the same layer as the first, second and fourth gate connection electrodes GCE1, GCE2, and GCE4.

The branch drain connection electrodes BDE and the branch source connection electrodes BSE may be spaced from one another on the interlayer dielectric film ILD. The branch drain connection electrodes BDE may be inserted into the thirty-seventh contact holes CNT37 penetrating the interlayer dielectric film ILD and the gate insulator GI to be connected to the drain electrode DE. The branch source connection electrodes BSE may be inserted into the thirty-eighth contact holes CNT38 penetrating the interlayer dielectric film ILD and the gate insulator GI to be connected to the source electrode SE.

Figure 16:
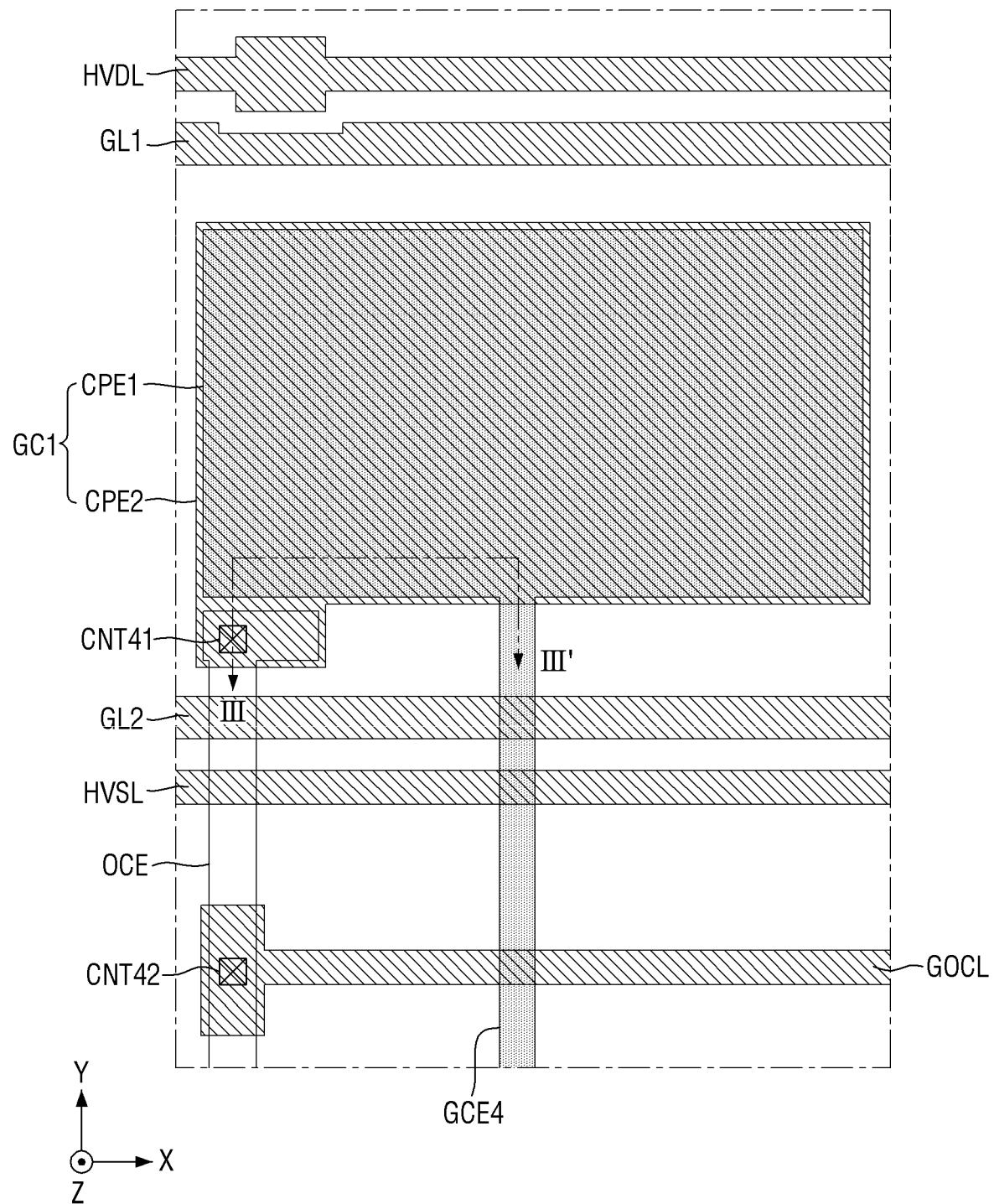
FIG. 16 is a layout diagram showing the first gate capacitor of FIG. 7.
Figure 17:
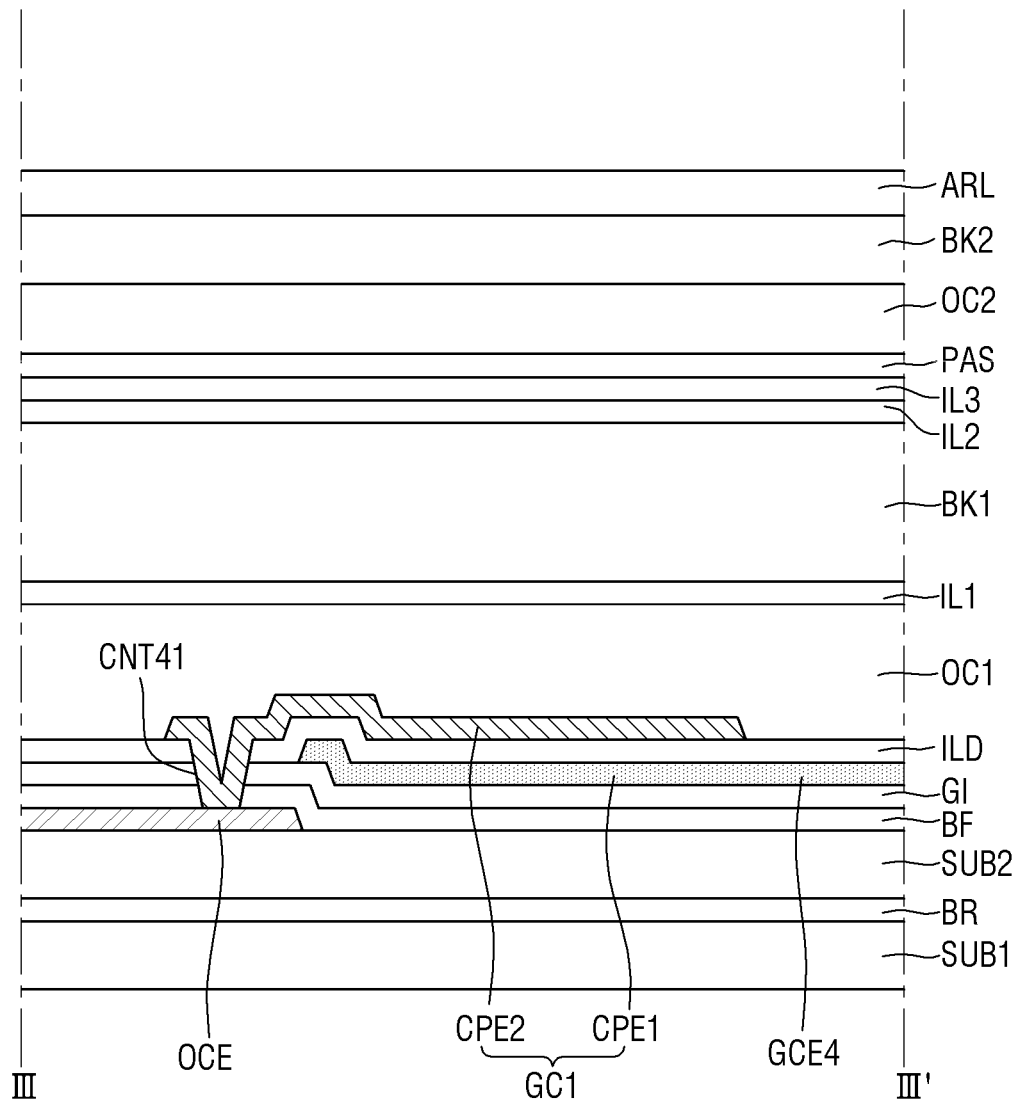
FIG. 17 is a cross-sectional view, taken along the line III-III' of FIG. 16.

FIG. 16 is a layout diagram showing the first gate capacitor of FIG. 7. FIG. 17 is a cross-sectional view, taken along the line III-III' of FIG. 16.

Referring to FIGS. 16 and 17, the first gate capacitor GC1 may be disposed between the first and second gate lines GL1 and GL2 in the second direction (y-axis direction). The first gate capacitor GC1 may include first and second gate capacitor electrodes CPE1 and CPE2.

The first gate capacitor electrode CPE1 may be disposed on the gate insulator GI. The first gate capacitor electrode CPE1 may be made of the same material at the same layer as the fourth gate connection electrode GCE4. The first gate capacitor electrode CPE1 may be connected to the fourth gate connection electrode GCE4.

The second gate capacitor electrode CPE2 may be disposed on the interlayer dielectric film ILD. The second gate capacitor electrode CPE2 may overlap the first gate capacitor electrode CPE1 in the thickness direction of the first substrate SUB1 (z-axis direction). Accordingly, the first gate capacitor GC1 may be formed between the first and second gate capacitor electrodes CPE1 and CPE2. The second gate capacitor electrode CPE2 may be inserted into a forty-first contact hole CNT41 penetrating the interlayer dielectric film ILD, the gate insulator GI, and the buffer layer BF to be connected to the output connection electrode OCE.

The output connection electrode OCE may be disposed on the second substrate SUB2. The output connection electrode OCE may be connected to an output connection line GOCL through a forty-second contact hole CNT42. The output connection line GOCL may be electrically connected to the gate signal output unit GOUT.

Figure 18:
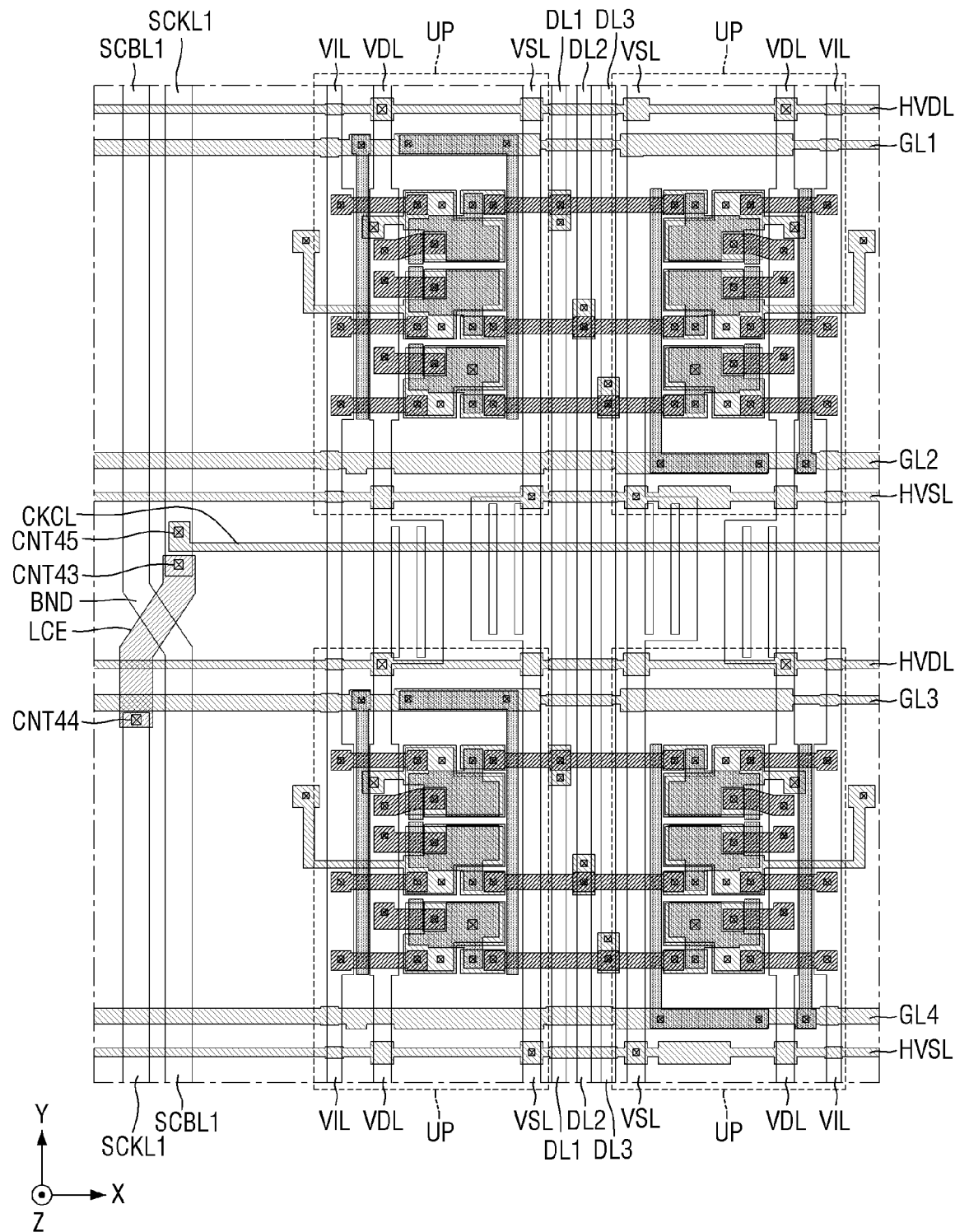
FIG. 18 is a layout diagram showing a plurality of unit pixels and gate input lines of a display device according to one or more embodiments of the present disclosure.
Figure 19:
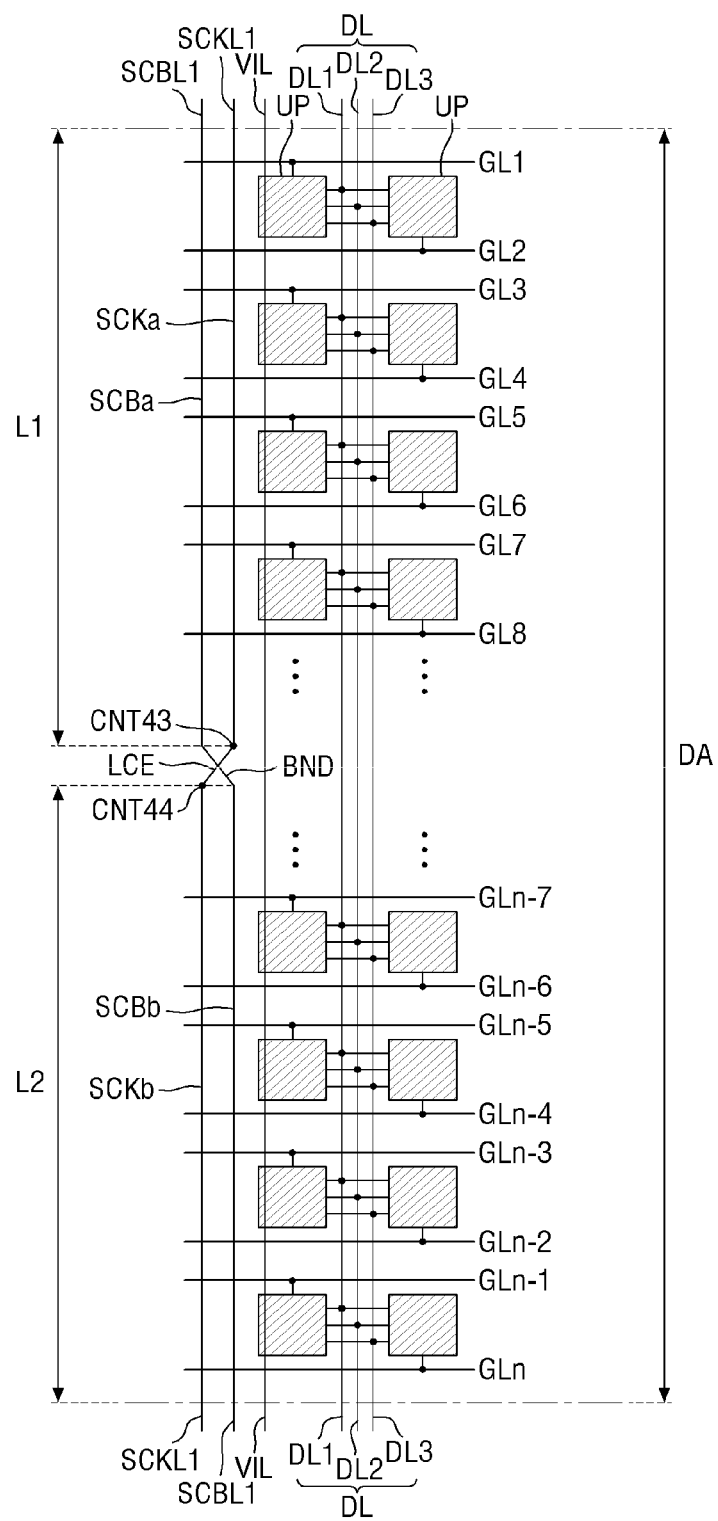
FIG. 19 is a diagram illustrating an example of a first scan clock line and a first scan clock bar line in a display device according to one or more embodiments.

FIG. 18 is a layout diagram showing a plurality of unit pixels and gate input lines of a display device according to one or more embodiments of the present disclosure. FIG. 19 is a diagram illustrating an example of a first scan clock line and a first scan clock bar line in a display device according to one or more embodiments.

Referring to FIGS. 18 and 19, the first scan clock line SCKL1 and the first scan clock bar line SCBL1 may be extended in the second direction (y-axis direction). The first scan clock line SCKL1 and the first scan clock bar line SCBL1 may be disposed on one side of the unit pixel UP. The first scan clock line SCKL1 and the first scan clock bar line SCBL1 may cross at least once. The first scan clock bar line SCBL1 may be bent at least once.

The first scan clock line SCKL1 may include a first portion SCKa, a line connection electrode LCE, and a second portion SCKb. The first and second portions SCKa and SCKb of the first scan clock line SCKL1 may be extended in the second direction (y-axis direction) and may be connected through the line connection electrode LCE. The first portion SCKa of the first scan clock line SCKL1 may be connected to one end of the line connection electrode LCE through a forty-third contact hole CNT43, and the second portion SCKb of the first scan clock line SCKL1 may be connected to the other end of the line connection electrode LCE through a forty-fourth contact hole CNT44. The first scan clock line SCKL1 may be connected to the scan clock connection line CKCL through a forty-fifth contact hole CNT45.

The first scan clock bar line SCBL1 may include a first portion SCBa, a bent portion BND, and a second portion SCBb. The first and second portions SCBa and SCBb of the first scan clock bar line SCBL1 may correspond to the first and second portions SCKa and SCKb of the first scan clock line SCKL1, respectively, and the bent portion BND may correspond to the line connection electrode LCE. The first and second portions SCKa and SCKb of the first scan clock line SCKL1 may be extended in the second direction (y-axis direction) and may be connected through the bent portion BND crossing the line connection electrode LCE. In one or more embodiments, the first and second portions SCKa and SCKb of the first scan clock line SCKL1 may be connected through the line connection electrode LCE crossing the bent portion BND.

The line connection electrode LCE may overlap the bent portion BND of the first scan clock bar line SCBL1 in the thickness direction of the first substrate SUB1 (z-axis direction). The line connection electrode LCE may be disposed at the same layer as the gate electrode GE2 of the second transistor ST2 or the gate electrode GE3 of the third transistor ST3. The first scan clock line SCKL1 and the first scan clock bar line SCBL1 may be disposed at the same layer as at least one of the data line DL, the initialization voltage line VIL, the first voltage line VDL, and the second voltage line VSL. Accordingly, the line connection electrode LCE and the bent portion BND of the first scan clock bar line SCBL1 may be insulated from each other.

Coordinates of the first and second portions SCKa and SCKb of the first scan clock line SCKL1 in the first direction (x-axis direction) may be different from each other. For example, the first portion SCKa of the first scan clock line SCKL1 may be colinear and spaced from the second portion SCBb of the first scan clock bar line SCBL1. The second portion SCKb of the first scan clock line SCKL1 may be colinear and spaced from the first portion SCBa of the first scan clock bar line SCBL1. The line connection electrode LCE may be extended in a diagonal direction between the first direction (x-axis direction) and the second direction (y-axis direction), and may be connected between the first and second portions SCKa and SCKb of the first scan clock line SCKL1.

The first portion SCKa of the first scan clock line SCKL1 may be disposed on the right side of the first portion SCBa of the first scan clock bar line SCBL1. The first portion SCKa of the first scan clock line SCKL1 may be closer to the unit pixel UP than the first portion SCBa of the first scan clock bar line SCBL1 is. When the initialization voltage line VIL is disposed at the leftmost position of the unit pixel UP, the first portion SCKa of the first scan clock line SCKL1 may be disposed closer to the initialization voltage line VIL than the first portion SCBa of the first scan clock bar line SCBL1 is.

The second portion SCBb of the first scan clock bar line SCBL1 may be disposed on the right side of the second portion SCKb of the first scan clock line SCKL1. The second portion SCBb of the first scan clock bar line SCBL1 may be closer to the unit pixel UP than the second portion SCKb of the first scan clock line SCKL1 is. When the initialization voltage line VIL is disposed at the leftmost position of the unit pixel UP, the second portion SCBb of the first scan clock bar line SCBL1 may be disposed closer to the initialization voltage line VIL than the second portion SCKb of the first scan clock line SCKL1 is.

The length L1 of the first portion SCKa of the first scan clock line SCKL1 may be substantially equal to the length L2 of the second portion SCBb of the first scan clock bar line SCBL1 (L1=L2). The length L1 of a portion of the first scan clock line SCKL1 adjacent to the initialization voltage line VIL may be substantially equal to the length L2 of a portion of the first scan clock bar line SCBL1 adjacent to the initialization voltage line VIL. The length L1 by which the initialization voltage line VIL and the first scan clock line SCKL1 face each other directly may be substantially equal to the length L2 by which the initialization voltage line VIL and the first scan clock bar line SCBL1 face each other directly. The initialization voltage line VIL may be coupled with the first scan clock line SCKL1 to generate a rising or falling ripple, and may be coupled with the first scan clock bar line SCBL1 to generate a falling or rising ripple. Accordingly, the ripple of the initialization voltage line VIL by the first scan clock line SCKL1 and the ripple of the initialization voltage line VIL by the first scan clock bar line SCBL1 may cancel each other, and thus the initialization voltage line VIL can hold a constant initialization voltage. The display device 10 can supply a constant initialization voltage to the unit pixel UP by including the first scan clock line SCKL1 and the first scan clock bar line SCBL1 that cross at least once.

In one or more embodiments, when the first voltage line VDL is disposed at the leftmost position of the unit pixel UP, the length of a portion of the first scan clock line SCKL1 that is adjacent to the first voltage line VDL may be substantially equal to the length of a portion of the first scan clock bar line SCBL1 that is adjacent to the first voltage line VDL. Accordingly, the ripple of the first voltage line VDL by the first scan clock line SCKL1 and the ripple of the first voltage line VDL by the first scan clock bar line SCBL1 may cancel each other, and thus the first voltage line VDL can hold a constant driving voltage. The display device 10 can supply a constant driving voltage to the unit pixel UP by including the first scan clock line SCKL1 and the first scan clock bar line SCBL1 that cross at least once.

In one or more embodiments, when the second voltage line VSL is disposed at the leftmost position of the unit pixel UP, the length of a portion of the first scan clock line SCKL1 that is adjacent to the second voltage line VSL may be substantially equal to the length of a portion of the first scan clock bar line SCBL1 that is adjacent to the second voltage line VSL. Accordingly, the ripple of the second voltage line VSL by the first scan clock line SCKL1 and the ripple of the second voltage line VSL by the first scan clock bar line SCBL1 may cancel each other, and thus the second voltage line VSL can hold a constant low-level voltage. The display device 10 can supply a constant low-level voltage to the unit pixel UP by including the first scan clock line SCKL1 and the first scan clock bar line SCBL1 that cross at least once.

Figure 20:
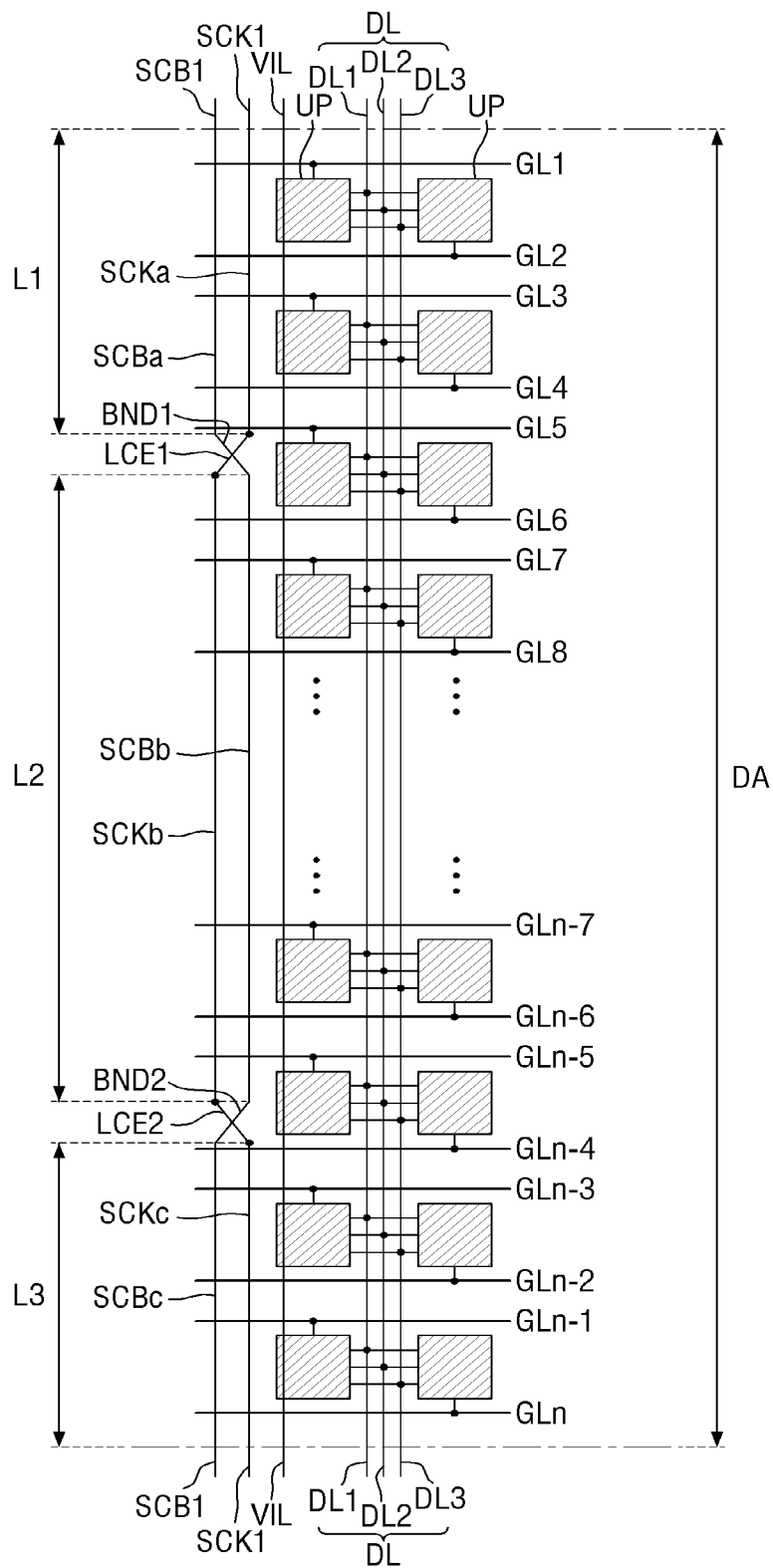
FIG. 20 is a diagram illustrating another example of a first scan clock line and a first scan clock bar line in a display device according to one or more embodiments.

FIG. 20 is a diagram illustrating another example of a first scan clock line and a first scan clock bar line in a display device according to an exemplary embodiment.

Referring to FIG. 20, the first scan clock line SCKL1 and the first scan clock bar line SCBL1 may be extended in the second direction (y-axis direction). The first scan clock line SCKL1 and the first scan clock bar line SCBL1 may be disposed on one side of the unit pixel UP. The first scan clock line SCKL1 and the first scan clock bar line SCBL1 may cross at least once. The first scan clock bar line SCBL1 may be bent at least once.

The first scan clock line SCKL1 may include a first portion SCKa, a first line connection electrode LCE1, a second portion SCKb, a second line connection electrode LCE2, and a third portion SCKc. The first to third portions SCKa, SCKb, and SCKc of the first scan clock line SCKL1 may be extended in the second direction (y-axis direction). The first and second portions SCKa and SCKb of the first scan clock line SCKL1 may be connected through the first line connection electrode LCE1, and the second and third portions SCKb and SCKc of the first scan clock line SCKL1 may be connected through the second line connection electrode LCE2.

The first scan clock bar line SCBL1 may include a first portion SCBa, a first bent portion BND1, a second portion SCBb, a second bent portion BND2, and a third portion SCBc. The first to third portions SCBa, SCBb, and SCBc of the first scan clock bar line SCBL1 may correspond to the first to third portions SCKa, SCKb, and SCKc of the first scan clock line SCKL1, respectively. The first bent portion BND1 may correspond to the first line connection electrode LCE1, and the second bent portion BND2 may correspond to the second line connection electrode LCE2. The first to third portions SCBa, SCBb, and SCBc of the first scan clock bar line SCBL1 may be extended in the second direction (y-axis direction). The first and second portions SCBa and SCBb of the first scan clock bar line SCBL1 may be connected through the first bent portion BND1 crossing the first line connection electrode LCE1, and the second and third portions SCBb and SCBc of the first scan clock bar line SCBL1 may be connected through the second bent portion BND2 crossing the second line connection electrode LCE2.

The first line connection electrode LCE1 may overlap the first bent portion BND1 of the first scan clock bar line SCBL1 in the thickness direction of the first substrate SUB1 (z-axis direction). The first line connection electrode LCE1 may be disposed at the same layer as the gate electrode GE2 of the second transistor ST2 or the gate electrode GE3 of the third transistor ST3. The first scan clock line SCKL1 and the first scan clock bar line SCBL1 may be disposed at the same layer as at least one of the data line DL, the initialization voltage line VIL, the first voltage line VDL, and the second voltage line VSL. Accordingly, the first line connection electrode LCE1 and the first bent portion BND1 of the first scan clock bar line SCBL1 may be insulated from each other.

The second line connection electrode LCE2 may overlap the second bent portion BND2 of the first scan clock bar line SCBL1 in the thickness direction of the first substrate SUB1 (z-axis direction). The second line connection electrode LCE2 may be disposed at the same layer as the gate electrode GE2 of the second transistor ST2 or the gate electrode GE3 of the third transistor ST3. The first scan clock line SCKL1 and the first scan clock bar line SCBL1 may be disposed at the same layer as at least one of the data line DL, the initialization voltage line VIL, the first voltage line VDL, and the second voltage line VSL. Accordingly, the second line connection electrode LCE2 and the second bent portion BND2 of the first scan clock bar line SCBL1 may be insulated from each other.

Coordinates of the first and second portions SCKa and SCKb of the first scan clock line SCKL1 in the first direction (x-axis direction) may be different from each other. For example, the first portion SCKa of the first scan clock line SCKL1 may be colinear and spaced from the second portion SCBb of the first scan clock bar line SCBL1. The second portion SCKb of the first scan clock line SCKL1 may be colinear and spaced from the first portion SCBa of the first scan clock bar line SCBL1. The first line connection electrode LCE1 may be extended in a diagonal direction between the first direction (x-axis direction) and the second direction (y-axis direction), and may be connected between the first and second portions SCKa and SCKb of the first scan clock line SCKL1.

The coordinates of the third portion SCKc of the first scan clock line SCKL1 in the first direction (x-axis direction) may be different from the coordinates of the second portion SCKb in the first direction (x-axis direction), and may be the same as the coordinates of the first portion SCKa in the first direction (x-axis direction). For example, the first portion SCKa of the first scan clock line SCKL1, the second portion SCBb of the first scan clock bar line SCBL1, and the third portion SCKc of the first scan clock line SCKL1 may be colinear and spaced from one another. The first portion SCBa of the first scan clock bar line SCBL1, the second portion SCKb of the first scan clock line SCKL1, and the third portion SCBc of the first scan clock bar line SCBL1 may be colinear and spaced from one another. The first line connection electrode LCE1 may be extended in a diagonal direction between the first direction (x-axis direction) and the second direction (y-axis direction), and may be connected between the first and second portions SCKa and SCKb of the first scan clock line SCKL1. The second line connection electrode LCE2 may be extended in a diagonal direction between the opposite direction to the first direction (x-axis direction) and the second direction (y-axis direction), and may be connected between the second and third portions SCKb and SCKc of the first scan clock line SCKL1.

The first portion SCKa of the first scan clock line SCKL1 may be disposed on the right side of the first portion SCBa of the first scan clock bar line SCBL1. The first portion SCKa of the first scan clock line SCKL1 may be disposed closer to the unit pixel UP than the first portion SCBa of the first scan clock bar line SCBL1. When the initialization voltage line VIL is disposed at the leftmost position of the unit pixel UP, the first portion SCKa of the first scan clock line SCKL1 may be disposed closer to the initialization voltage line VIL than the first portion SCBa of the first scan clock bar line SCBL1 is.

The second portion SCBb of the first scan clock bar line SCBL1 may be disposed on the right side of the second portion SCKb of the first scan clock line SCKL1. The second portion SCBb of the first scan clock bar line SCBL1 may be closer to the unit pixel UP than the second portion SCKb of the first scan clock line SCKL1 is. When the initialization voltage line VIL is disposed at the leftmost position of the unit pixel UP, the second portion SCBb of the first scan clock line SCBL1 may be disposed closer to the initialization voltage line VIL than the second portion SCKb of the first scan clock line SCKL1 is.

The third portion SCKc of the first scan clock line SCKL1 may be disposed on the right side of the third portion SCBc of the first scan clock bar line SCBL1. The third portion SCKc of the first scan clock line SCKL1 may be closer to the unit pixel UP than the third portion SCBc of the first scan clock bar line SCBL1 is. When the initialization voltage line VIL is disposed at the leftmost position of the unit pixel UP, the third portion SCKc of the first scan clock line SCKL1 may be disposed closer to the initialization voltage line VIL than the third portion SCBc of the first scan clock bar line SCBL1 is.

The sum of the length L1 of the first portion SCKa of the first scan clock line SCKL1 and the length L3 of the third portion SCKc of the first scan clock line SCKL1 may be substantially equal to the length L2 of the second portion SCBb of the first scan clock bar line SCBL1 (L1+L3=L2). The lengths L1+L3 of the portions of the first scan clock line SCKL1 adjacent to the initialization voltage line VIL may be substantially equal to the length L2 of a portion of the first scan clock bar line SCBL1 adjacent to the initialization voltage line VIL. The lengths L1+L3 by which the initialization voltage line VIL and the first scan clock line SCKL1 face each other directly may be substantially equal to the length L2 by which the initialization voltage line VIL and the first scan clock bar line SCBL1 face each other directly. The initialization voltage line VIL may be coupled with the first scan clock line SCKL1 to generate a rising or falling ripple, and may be coupled with the first scan clock bar line SCBL1 to generate a falling or rising ripple. Accordingly, the ripple of the initialization voltage line VIL by the first scan clock line SCKL1 and the ripple of the initialization voltage line VIL by the first scan clock bar line SCBL1 may cancel each other, and thus the initialization voltage line VIL can hold a constant initialization voltage. The display device 10 can supply a constant initialization voltage to the unit pixel UP by including the first scan clock line SCKL1 and the first scan clock bar line SCBL1 that cross at least once.

Figure 21:
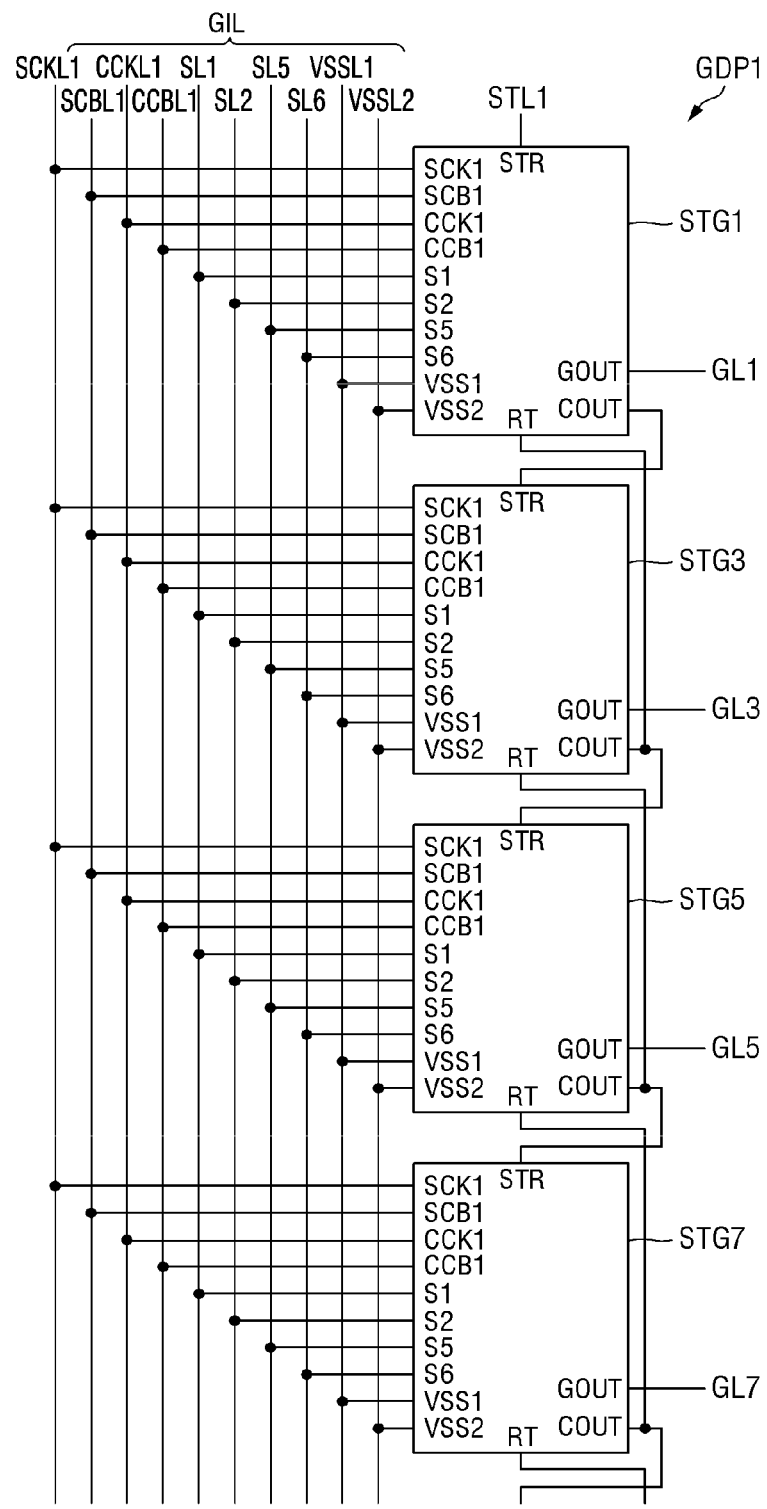
FIG. 21 is a diagram showing a plurality of stages of a first gate driver in a display device according to one or more embodiments.

FIG. 21 is a diagram showing a plurality of stages of a first gate driver in a display device according to one or more embodiments. A display device of FIG. 21 is substantially identical to the display device of FIG. 4 except that the former further includes a first carry clock bar line CCBL1; and, therefore, the redundant descriptions will be omitted.

Referring to FIG. 21, a plurality of gate input lines GIL may be extended in the second direction (y-axis direction) and may be spaced from one another along the first direction (x-axis direction). The gate input lines GIL may be connected between the first display driver DIC1 and the first gate driver GDP1. The first gate driver GDP1 may include a plurality of odd stages STG1, STG3, STG5, STG7, .... The gate input lines GIL may supply gate input signals to the plurality of odd stages STG1, STG3, STG5, STG7, .... The plurality of gate input lines GIL may include a first scan clock line SCKL1, a first scan clock bar line SCBL1, a first carry clock line CCKL1, a first carry clock bar line CCBL1, a first signal line SL1, a second signal line SL2, a fifth signal line SL5, a sixth signal line SL6, a first low-level line VSSL1, and a second low-level line VSSL2. The gate input signals may include a first scan clock signal SCK1, a first scan clock bar signal SCB1, a first carry clock signal CCK1, a first carry clock bar signal CCB1, a first input signal S1, a second input signal S2, a fifth input signal S5, a sixth input signal S6, a first low-level voltage VSS1, and a second low-level voltage VSS2, which are associated with the plurality of gate input lines GIL, respectively. It should be noted that the first scan clock signal SCK1 and the first scan clock bar signal SCB1 may be in anti-phase. The first carry clock signal CCK1 and the first carry clock bar signal CCB1 may be in anti-phase. Accordingly, the plurality of gate input lines GIL may supply the first scan clock signal SCK1, the first scan clock bar signal SCB1, the first carry clock signal CCK1, the first carry clock bar signal CCB1, the first input signal S1, the second input signal S2, the fifth input signal S5, the sixth input signal S6, the first low-level potential voltage VSS1, and the second low-level voltage VSS2 to a plurality of odd stages STG1, STG3, STG5, STG7, ....

Figure 22:
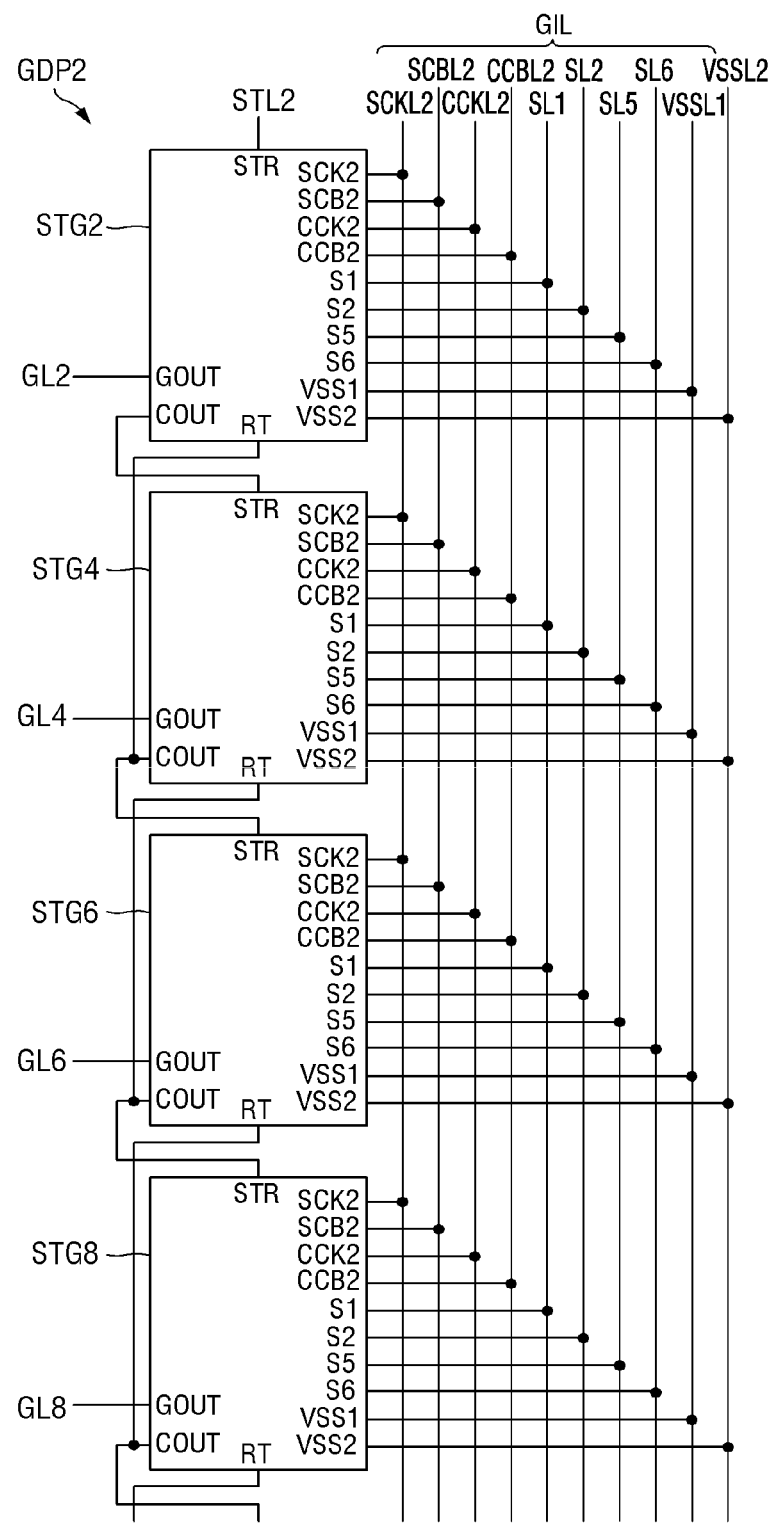
FIG. 22 is a diagram showing a plurality of stages of a second gate driver in a display device according to one or more embodiments.

FIG. 22 is a diagram showing a plurality of stages of a second gate driver in a display device according to one or more embodiments of the present disclosure. A display device of FIG. 22 is substantially identical to the display device of FIG. 5 except that the former further includes a second carry clock bar line CCBL2, and, therefore, the redundant descriptions will be omitted.

Referring to FIG. 22, a plurality of gate input lines GIL may be extended in the second direction (y-axis direction)

and may be spaced from one another along the first direction (x-axis direction). The gate input lines GIL may be connected between the second display driver DIC2 and the second gate driver GDP2. The second gate driver GDP2 may include a plurality of even stages STG2, STG4, STG6, STG8, . . . . The gate input lines GIL may supply gate input signals to the plurality of even stages STG2, STG4, STG6, STG8, . . . . The plurality of gate input lines GIL may include a second scan clock line SCKL2, a second scan clock bar line SCBL2, a second carry clock line CCKL2, a second carry clock bar line CCBL2, a first signal line SL1, a second signal line SL2, a fifth signal line SL5, a sixth signal line SL6, a first low-level line VSSL1, and a second low-level line VSSL2. The gate input signals may include a second scan clock signal SCK2, a second scan clock bar signal SCB2, a second carry clock signal CCK2, a second carry clock bar signal CCB2, a first input signal S1, a second input signal S2, a fifth input signal S5, a sixth input signal S6, a first low-level voltage VSS1, and a second low-level voltage VSS2, which are associated with the plurality of gate input lines GIL, respectively. It should be noted that the second scan clock signal SCK2 and the second scan clock bar signal SCB2 may be in anti-phase. The second carry clock signal CCK2 and the second carry clock bar signal CCB2 may be in anti-phase. Accordingly, the plurality of gate input lines GIL may supply the second scan clock signal SCK2, the second scan clock bar signal SCB2, the second carry clock signal CCK2, the second carry clock bar signal CCB2, the first input signal S1, the second input signal S2, the fifth input signal S5, the sixth input signal S6, the first low-level potential voltage VSS1 and the second low-level voltage VSS2 to a plurality of even stages STG2, STG4, STG6, STG8, . . . .

Figure 23:
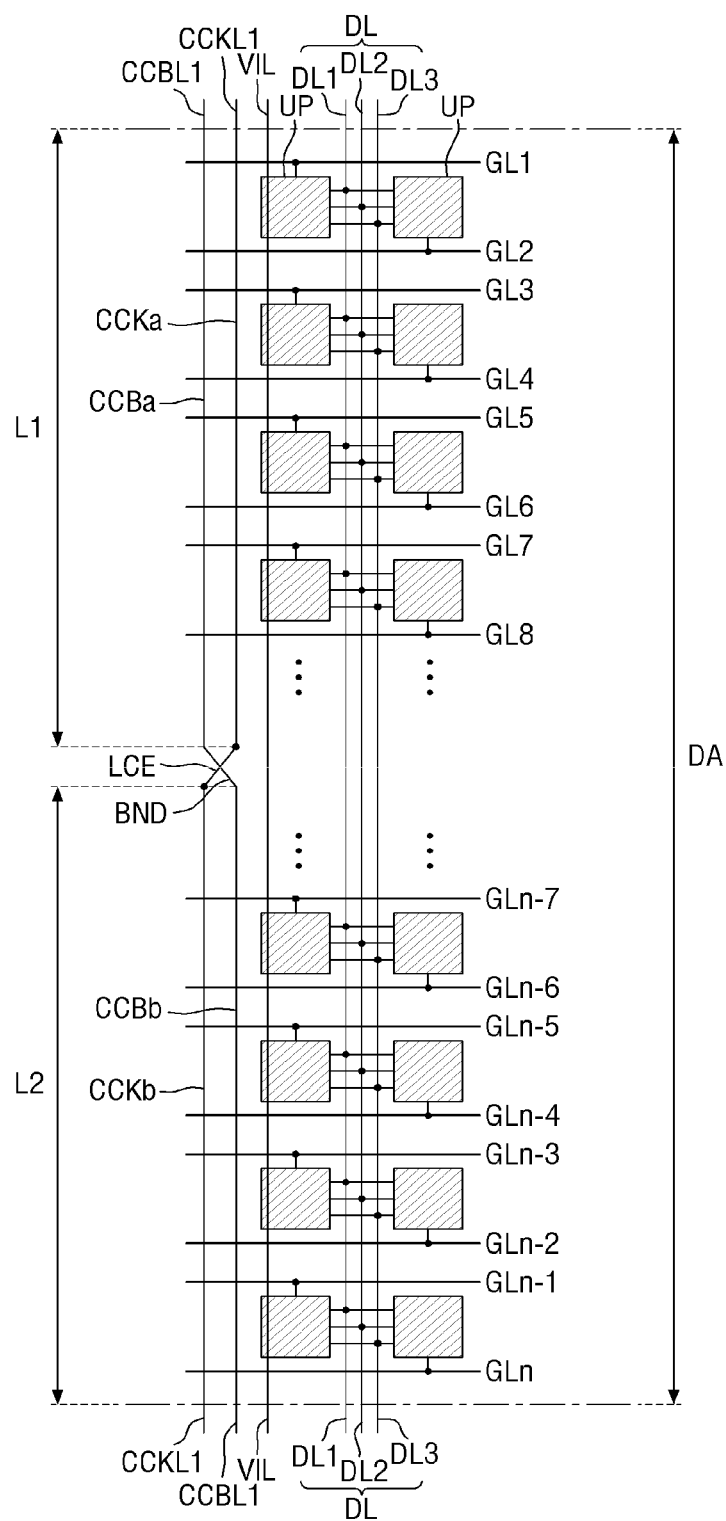
FIG. 23 is a diagram illustrating an example of a first carry clock line and a first carry clock bar line in a display device according to one or more embodiments.

FIG. 23 is a diagram illustrating an example of a first carry clock line and a first carry clock bar line in a display device according to one or more embodiments.

Referring to FIG. 23, the first carry clock line CCKL1 and the first carry clock bar line CCBL1 may be extended in the second direction (y-axis direction). The first carry clock line CCKL1 and the first carry clock bar line CCBL1 may be disposed on one side of the unit pixel UP. The first carry clock line CCKL1 and the first carry clock bar line CCBL1 may cross at least once. The first carry clock bar line CCBL1 may be bent at least once.

The first carry clock line CCKL1 may include a first portion CCKa, a line connection electrode LCE, and a second portion CCKb. The first and second portions CCKa and CCKb of the first carry clock line CCKL1 may be extended in the second direction (y-axis direction) and may be connected through the line connection electrode LCE.

The first carry clock bar line CCBL1 may include a first portion CCBa, a bent portion BND, and a second portion CCBb. The first and second portions CCBa and CCBb of the first carry clock bar line CCBL1 may correspond to the first and second portions CCKa and CCKb of the first carry clock line CCKL1, respectively, and the bent portion BND may correspond to the line connection electrode LCE. The first and second portions CCBa and CCBb of the first carry clock bar line CCBL1 may be extended in the second direction (y-axis direction) and may be connected through the bent portion BND crossing the line connection electrode LCE.

The line connection electrode LCE may overlap the bent portion BND of the first carry clock bar line CCBL1 in the thickness direction of the first substrate SUB1 (z-axis direction). The line connection electrode LCE may be disposed at the same layer as the gate electrode GE2 of the second transistor ST2 or the gate electrode GE3 of the third transistor ST3. The first carry clock line CCKL1 and the first carry clock bar line CCBL1 may be disposed at the same layer as at least one of the data line DL, the initialization voltage line VIL, the first voltage line VDL, and the second voltage line VSL. Accordingly, the line connection electrode LCE and the bent portion BND of the first carry clock bar line CCBL1 may be insulated from each other.

Coordinates of the first and second portions CCKa and CCKb of the first carry clock line CCKL1 in the first direction (x-axis direction) may be different from each other. For example, the first portion CCKa of the first carry clock line CCKL1 may be colinear and spaced from the second portion CCBb of the first carry clock bar line CCBL1. The second portion CCKb of the first carry clock line CCKL1 may be colinear and spaced from the first portion CCBa of the first carry clock bar line CCBL1. The line connection electrode LCE may be extended in a diagonal direction between the first direction (x-axis direction) and the second direction (y-axis direction), and may connect the first and second portions CCKa and CCKb of the first carry clock line CCKL1.

The first portion CCKa of the first carry clock line CCKL1 may be disposed on the right side of the first portion CCBa of the first carry clock bar line CCBL1. The first portion CCKa of the first carry clock line CCKL1 may be disposed closer to the unit pixel UP than the first portion CCBa of the first carry clock bar line CCBL1 is. When the initialization voltage line VIL is disposed at the leftmost position of the unit pixel UP, the first portion CCKa of the first carry clock line CCKL1 may be disposed closer to the initialization voltage line VIL than the first portion CCBa of the first carry clock bar line CCBL1 is.

The second portion CCBb of the first carry clock bar line CCBL1 may be disposed on the right side of the second portion CCKb of the first carry clock line CCKL1. The second portion CCBb of the first carry clock bar line CCBL1 may be disposed closer to the unit pixel UP than the second portion CCKb of the first carry clock line CCKL1 is. When the initialization voltage line VIL is disposed at the leftmost position of the unit pixel UP, the second portion CCBb of the first carry clock bar line CCBL1 may be disposed closer to the initialization voltage line VIL than the second portion CCKb of the first carry clock line CCKL1 is.

The length L1 of the first portion CCKa of the first carry clock line CCKL1 may be substantially equal to the length L2 of the second portion CCBb of the first carry clock bar line CCBL1 (L1=L2). The length L1 of a portion of the first carry clock line CCKL1 adjacent to the initialization voltage line VIL may be substantially equal to the length L2 of a portion of the first carry clock bar line CCBL1 adjacent to the initialization voltage line VIL. The length L1 by which the initialization voltage line VIL and the first carry clock line CCKL1 face each other directly may be substantially equal to the length L2 by which the initialization voltage line VIL and the first carry clock bar line CCBL1 face each other directly. The initialization voltage line VIL may be coupled with the first carry clock line CCKL1 to generate a rising or falling ripple, and may be coupled with the first carry clock bar line CCBL1 to generate a falling or rising ripple. Accordingly, the ripple of the initialization voltage line VIL by the first carry clock line CCKL1 and the ripple of the initialization voltage line VIL by the first carry clock bar line CCBL1 may cancel each other, and thus the initialization voltage line VIL can hold a constant initialization voltage. The display device 10 can supply a constant initialization voltage to the unit pixel UP by including the first carry clock line CCKL1 and the first carry clock bar line CCBL1 that cross at least once.

In one or more embodiments, when the first voltage line VDL is disposed at the leftmost position of the unit pixel UP, the length of a portion of the first carry clock line CCKL1 that is adjacent to the first voltage line VDL may be substantially equal to the length of a portion of the first carry clock bar line CCBL1 that is adjacent to the first voltage line VDL. Accordingly, the ripple of the first voltage line VDL by the first carry clock line CCKL1 and the ripple of the first voltage line VDL by the first carry clock bar line CCBL1 may cancel each other, and thus the first voltage line VDL can hold a constant driving voltage. The display device 10 can supply a constant driving voltage to the unit pixel UP by including the first carry clock line CCKL1 and the first carry clock bar line CCBL1 that cross at least once.

In one or more embodiments, when the second voltage line VSL is disposed at the leftmost position of the unit pixel UP, the length of a portion of the first carry clock line CCKL1 that is adjacent to the second voltage line VSL may be substantially equal to the length of a portion of the first carry clock bar line CCBL1 that is adjacent to the second voltage line VSL. Accordingly, the ripple of the second voltage line VSL by the first carry clock line CCKL1 and the ripple of the second voltage line VSL by the first carry clock bar line CCBL1 may cancel each other, and thus the second voltage line VSL can hold a constant low-level voltage. The display device 10 can supply a constant low-level voltage to the unit pixel UP by including the first carry clock line CCKL1 and the first carry clock bar line CCBL1 that cross at least once.

Figure 24:
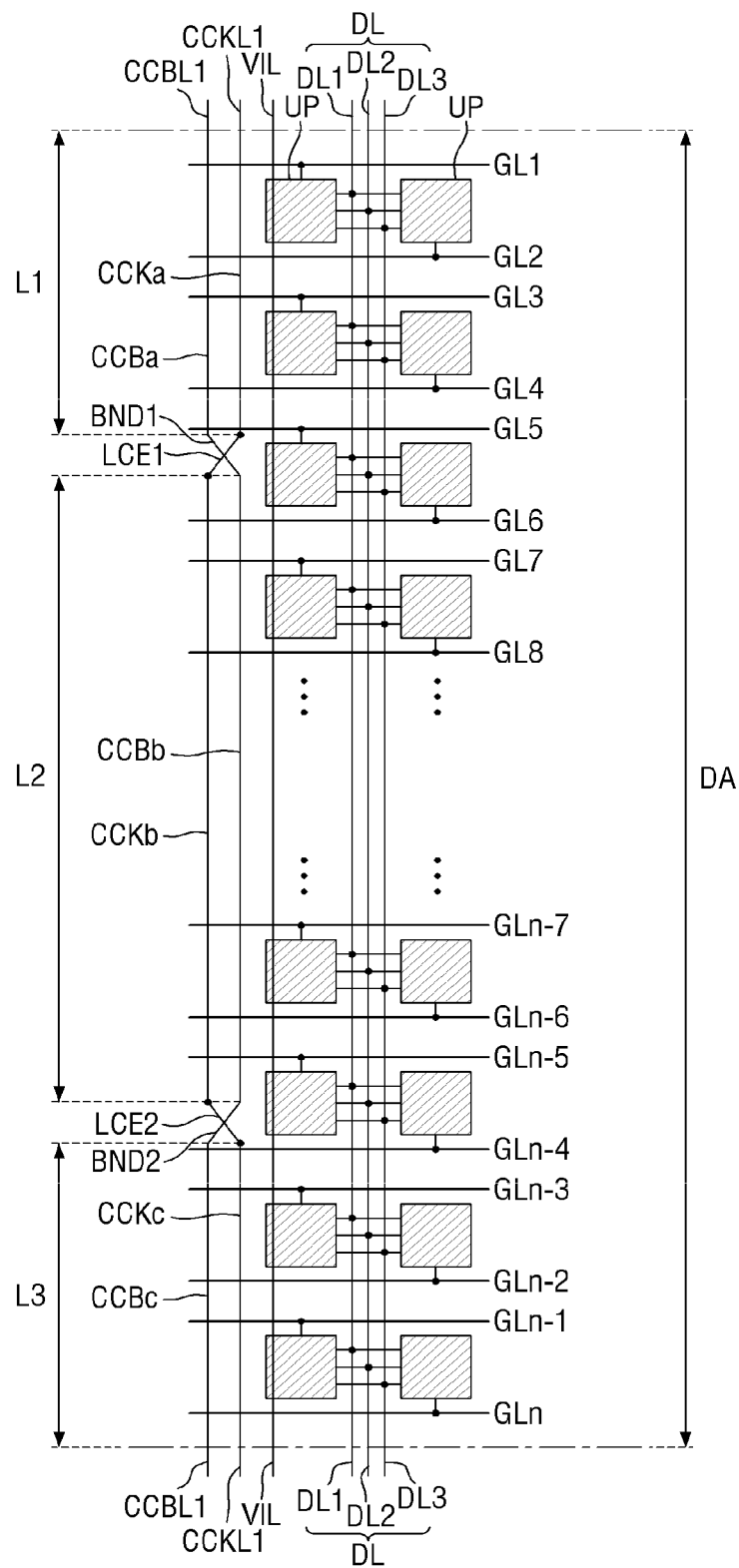
FIG. 24 is a diagram illustrating another example of a first carry clock line and a first carry clock bar line in a display device according to one or more embodiments.

FIG. 24 is a diagram illustrating one or more embodiments of a first carry clock line and a first carry clock bar line in a display device according to one or more embodiments.

Referring to FIG. 24, the first carry clock line CCKL1 and the first carry clock bar line CCBL1 may be extended in the second direction (y-axis direction). The first carry clock line CCKL1 and the first carry clock bar line CCBL1 may be disposed on one side of the unit pixel UP. The first carry clock line CCKL1 and the first carry clock bar line CCBL1 may cross at least once. The first carry clock bar line CCBL1 may be bent at least once.

The first carry clock line CCKL1 may include a first portion CCKa, a first line connection electrode LCE1, a second portion CCKb, a second line connection electrode LCE2, and a third portion CCKc. The first to third portions CCKa, CCKb, and CCKc of the first carry clock line CCKL1 may be extended in the second direction (y-axis direction). The first and second portions CCKa and CCKb of the first carry clock line CCKL1 may be connected through the first line connection electrode LCE1, and the second and third portions CCKb and CCKc of the first carry clock line CCKL1 may be connected through the second line connection electrode LCE2.

The first carry clock bar line CCBL1 may include a first portion CCBa, a first bent portion BND1, a second portion CCBb, a second bent portion BND2, and a third portion CCBc. The first to third portions CCBa, CCBb, and CCBc of the first carry clock bar line CCBL1 may correspond to the first to third portions CCKa, CCKb, and CCKc of the first carry clock line CCKL1, respectively. The first bent portion BND1 may correspond to the first line connection electrode LCE1, and the second bent portion BND2 may correspond to the second line connection electrode LCE2. The first to third portions CCBa, CCBb, and CCBc of the first carry clock bar line CCBL1 may be extended in the second direction (y-axis direction). The first and second portions CCBa and CCBb of the first carry clock bar line CCBL1 may be connected through the first bent portion BND1 crossing the first line connection electrode LCE1, and the second and third portions CCBb and CCBc of the first carry clock bar line CCBL1 may be connected through the second bent portion BND2 crossing the second line connection electrode LCE2.

The first line connection electrode LCE1 may overlap the first bent portion BND1 of the first carry clock bar line CCBL1 in the thickness direction of the first substrate SUB1 (z-axis direction). The first line connection electrode LCE1 may be disposed at the same layer as the gate electrode GE2 of the second transistor ST2 or the gate electrode GE3 of the third transistor ST3. The first carry clock line CCKL1 and the first carry clock bar line CCBL1 may be disposed at the same layer as at least one of the data line DL, the initialization voltage line VIL, the first voltage line VDL, and the second voltage line VSL. Accordingly, the first line connection electrode LCE1 and the first bent portion BND1 of the first carry clock bar line CCBL1 may be insulated from each other.

The second line connection electrode LCE2 may overlap the second bent portion BND2 of the first carry clock bar line CCBL1 in the thickness direction of the first substrate SUB1 (z-axis direction). The second line connection electrode LCE2 may be disposed at the same layer as the gate electrode GE2 of the second transistor ST2 or the gate electrode GE3 of the third transistor ST3. The first carry clock line CCKL1 and the first carry clock bar line CCBL1 may be disposed at the same layer as at least one of the data line DL, the initialization voltage line VIL, the first voltage line VDL, and the second voltage line VSL. Accordingly, the second line connection electrode LCE2 and the second bent portion BND2 of the first carry clock bar line CCBL1 may be insulated from each other.

Coordinates of the first and second portions CCKa and CCKb of the first carry clock line CCKL1 in the first direction (x-axis direction) may be different from each other. For example, the first portion CCKa of the first carry clock line CCKL1 may be colinear and spaced from the second portion CCBb of the first carry clock bar line CCBL1. The second portion CCKb of the first carry clock line CCKL1 may be colinear and spaced from the first portion CCBa of the first carry clock bar line CCBL1. The first line connection electrode LCE1 may be extended in a diagonal direction between the first direction (x-axis direction) and the second direction (y-axis direction), and may be connected between the first and second portions CCKa and CCKb of the first carry clock line CCKL1.

The coordinates of the third portion CCKc of the first carry clock line CCKL1 in the first direction (x-axis direction) may be different from the coordinates of the second portion CCKb in the first direction (x-axis direction), and may be the same as the coordinates of the first portion CCKa in the first direction (x-axis direction). For example, the first portion CCKa of the first carry clock line CCKL1, the second portion CCBb of the first carry clock bar line CCBL1, and the third portion CCKc of the first carry clock line CCKL1 may be colinear and spaced from one another. The first portion CCBa of the first carry clock bar line CCBL1, the second portion CCKb of the first carry clock line CCKL1, and the third portion CCBc of the first carry clock bar line CCBL1 may be colinear and spaced from one another. The first line connection electrode LCE1 may be extended in a diagonal direction between the first direction (x-axis direction) and the second direction (y-axis direction), and may be connected between the first and second portions CCKa and CCKb of the first carry clock line CCKL1. The second line connection electrode LCE2 may be extended in a diagonal direction between the opposite direction to the first direction (x-axis direction) and the second direction (y-axis direction), and may be connected between the second and third portions CCKb and CCKc of the first carry clock line CCKL1.

The first portion CCKa of the first carry clock line CCKL1 may be disposed on the right side of the first portion CCBa of the first carry clock bar line CCBL1. The first portion CCKa of the first carry clock line CCKL1 may be disposed closer to the unit pixel UP than the first portion CCBa of the first carry clock bar line CCBL1 is. When the initialization voltage line VIL is disposed at the leftmost position of the unit pixel UP, the first portion CCKa of the first carry clock line CCKL1 may be disposed closer to the initialization voltage line VIL than the first portion CCBa of the first carry clock bar line CCBL1 is.

The second portion CCBb of the first carry clock bar line CCBL1 may be disposed on the right side of the second portion CCKb of the first carry clock line CCKL1. The second portion CCBb of the first carry clock bar line CCBL1 may be disposed closer to the unit pixel UP than the second portion CCKb of the first carry clock line CCKL1 is. When the initialization voltage line VIL is disposed at the leftmost position of the unit pixel UP, the second portion CCBb of the first carry clock bar line CCBL1 may be disposed closer to the initialization voltage line VIL than the second portion CCKb of the first carry clock line CCKL1 is.

The third portion CCKc of the first carry clock line CCKL1 may be disposed on the right side of the third portion CCBc of the first carry clock bar line CCBL1. The third portion CCKc of the first carry clock line CCKL1 may be disposed closer to the unit pixel UP than the third portion CCBc of the first carry clock bar line CCBL1 is. When the initialization voltage line VIL is disposed at the leftmost position of the unit pixel UP, the third portion CCKc of the first carry clock line CCKL1 may be disposed closer to the initialization voltage line VIL than the third portion CCBc of the first carry clock bar line CCBL1 is.

The sum of the length L1 of the first portion CCKa of the first carry clock line CCKL1 and the length L3 of the third portion CCKc of the first carry clock line CCKL1 may be substantially equal to the length L2 of the second portion CCBb of the first carry clock bar line CCBL1 (L1+L3=L2). The length (L1+L3) of a portion of the first carry clock line CCKL1 adjacent to the initialization voltage line VIL may be substantially equal to the length L2 of a portion of the first carry clock bar line CCBL1 adjacent to the initialization voltage line VIL. The length (L1+L3) by which the initialization voltage line VIL and the first carry clock line CCKL1 face each other directly may be substantially equal to the length L2 by which the initialization voltage line VIL and the first carry clock bar line CCBL1 face each other directly. The initialization voltage line VIL may be coupled with the first carry clock line CCKL1 to generate a rising or falling ripple, and may be coupled with the first carry clock bar line CCBL1 to generate a falling or rising ripple. Accordingly, the ripple of the initialization voltage line VIL by the first carry clock line CCKL1 and the ripple of the initialization voltage line VIL by the first carry clock bar line CCBL1 may cancel each other, and thus the initialization voltage line VIL can hold a constant initialization voltage. The display device 10 can supply a constant initialization voltage to the unit pixel UP by including the first carry clock line CCKL1 and the first carry clock bar line CCBL1 that cross at least once.

What is claimed is:

1. A display device comprising:
a display area comprising a pixel;
a non-display area around the display area; and
a display driver electrically connected to the non-display area,
wherein the display area comprises:
a data line extending in a first direction and configured to supply data voltage received from the display driver to the pixel;
a power line at one side of the pixel and extending in the first direction to supply a supply voltage received from the display driver to the pixel;
a gate input line electrically connected to the display driver and extending in the first direction, the gate input line comprising a scan clock line comprising a first portion and a second portion each extending in the first direction, and a scan clock bar line comprising a first portion and a second portion each extending in the first direction; and
a gate driver connected to the gate input line and configured to receive a gate input signal from the gate input line,
wherein the scan clock line and the scan clock bar line cross at least once between the first portions and the second portions of the scan clock line and the scan clock bar line.

2. The display device of claim 1, wherein the scan clock line is configured to supply a scan clock signal to the gate driver, wherein the scan clock bar line is configured to supply a scan clock bar signal to the gate driver, and wherein the scan clock signal and the scan clock bar signal have opposing phases.

3. The display device of claim 2, wherein the gate driver comprises:
a first gate transistor configured to provide the scan clock signal to a gate signal output unit based on a voltage at a first node; and
a second gate transistor configured to discharge the gate signal output unit based on the scan clock bar signal.

4. The display device of claim 1, wherein the scan clock line comprises the first portion, a line connection electrode, and the second portion,
wherein the scan clock bar line comprises:
the first portion corresponding to the first portion of the scan clock line;
a bent portion crossing the line connection electrode; and
the second portion corresponding to the second portion of the scan clock line, and
wherein the line connection electrode is at a layer different from the scan clock bar line and the first and second portions of the scan clock line.

5. The display device of claim 4, wherein the first portion of the scan clock line is located closer to the power line than the first portion of the scan clock bar line is to the power line, and
wherein the second portion of the scan clock bar line is located closer to the power line than the second portion of the scan clock line is to the power line.

6. The display device of claim 4, wherein a length of the first portion of the scan clock line is equal to a length of the second portion of the scan clock bar line.

7. The display device of claim 4, wherein the power line comprises an initialization voltage line located at an outermost position of the pixel, and wherein a length of a portion of the scan clock line that directly faces the initialization voltage line is equal to a length of a portion of the scan clock bar line that directly faces the initialization voltage line.

8. The display device of claim 4, wherein the first portion of the scan clock line is colinear to the second portion of the scan clock bar line, and
wherein the second portion of the scan clock line is colinear to the first portion of the scan clock bar line.

9. The display device of claim 1, wherein the scan clock line comprises the first portion, a first line connection electrode, the second portion, a second line connection electrode, and a third portion,
wherein the scan clock bar line comprises:
the first portion corresponding to the first portion of the scan clock line;
a first bent portion crossing the first line connection electrode;
the second portion corresponding to the second portion of the scan clock line;
a second bent portion crossing the second line connection electrode; and
a third portion corresponding to the third portion of the scan clock line, and
wherein the first and second line connection electrodes are at a different layer from the scan clock bar line.

10. The display device of claim 9, wherein the first portion and the third portion of the scan clock line are located closer to the power line than the first portion and the third portion of the scan clock bar line are to the power line, and
wherein the second portion of the scan clock bar line is located closer to the power line than the second portion of the scan clock line is to the power line.

11. The display device of claim 9, wherein a sum of lengths of the first portion and the third portion of the scan clock line is equal to a length of the second portion of the scan clock bar line.

12. The display device of claim 9, wherein the power line comprises an initialization voltage line located at an outermost position of the pixel, and
wherein a sum of lengths of portions of the scan clock line that directly face the initialization voltage line is equal to a length of a portion of the scan clock bar line that faces the initialization voltage line.

13. The display device of claim 9, wherein the first portion and the third portion of the scan clock line are colinear to the second portion of the scan clock bar line, and
wherein the second portion of the scan clock line is colinear to the first portion and the third portion of the scan clock bar line.

14. The display device of claim 1, wherein the gate input line further comprises:
a carry clock line configured to supply a carry clock signal to the gate driver; and
a carry clock bar line configured to supply a carry clock bar signal to the gate driver,
wherein the carry clock signal and the carry clock bar signal have opposing phases.

15. A display device comprising:
a display area comprising a pixel;
a non-display area around the display area; and
a display driver electrically connected to the non-display area,
wherein the display area comprises:
a data line extending in a first direction and configured to supply data voltage received from the display driver to the pixel;
a power line at one side of the pixel and extending in the first direction to supply a supply voltage received from the display driver to the pixel;
a gate input line electrically connected to the display driver and extending in the first direction, the gate input line comprising a scan clock line and a scan clock bar line; and
a gate driver connected to the gate input line and configured to receive a gate input signal from the gate input line,
wherein the scan clock line and the scan clock bar line cross at least once, and
wherein the gate input line further comprises:
a carry clock line configured to supply a carry clock signal to the gate driver; and
a carry clock bar line configured to supply a carry clock bar signal to the gate driver,
wherein the carry clock signal and the carry clock bar signal have opposing phases,
wherein the carry clock line comprises a first portion, a line connection electrode, and a second portion,
wherein the carry clock bar line comprises:
a first portion corresponding to the first portion of the carry clock line;
a bent portion crossing the line connection electrode; and
a second portion corresponding to the second portion of the carry clock line, and
wherein the line connection electrode is at a layer different from the carry clock bar line and the first and second portions of the carry clock line.

16. The display device of claim 15, wherein the first portion of the carry clock line is located closer to the power line than the first portion of the carry clock bar line is to the power line, and
wherein the second portion of the carry clock bar line is located closer to the power line than the second portion of the carry clock line is to the power line.

17. The display device of claim 15, wherein a length of the first portion of the carry clock line is equal to a length of the second portion of the carry clock bar line.

18. The display device of claim 14, wherein the carry clock line comprises a first portion, a first line connection electrode, a second portion, a second line connection electrode, and a third portion,
wherein the carry clock bar line comprises:
a first portion corresponding to the first portion of the carry clock line;
a first bent portion crossing the first line connection electrode;
a second portion corresponding to the second portion of the carry clock line;
a second bent portion crossing the second line connection electrode; and
a third portion corresponding to the third portion of the carry clock line, and
wherein the first and second line connection electrodes are at a different layer from the carry clock bar line.

19. The display device of claim 18, wherein the first portion and the third portion of the carry clock line is located closer to the power line than the first portion and the third portion of the carry clock bar line are to the power line, and
wherein the second portion of the carry clock bar line is located closer to the power line than the second portion of the carry clock line is to the power line.

20. The display device of claim 18, wherein a sum of lengths of the first portion and the third portion of the carry clock line is equal to a length of the second portion of the carry clock bar line.

21. A tiled display comprising:
a plurality of display devices, each of the plurality of display devices comprising a display area comprising pixels, a non-display area around the display area, and a display driver electrically connected to the non-display area; and
a coupling member coupling the plurality of display devices with one another,
wherein the display area comprises:
a data line extending in a first direction and configured to supply data voltage received from the display driver to the pixel;
a power line at one side of the pixel and extending in the first direction to supply a supply voltage received from the display driver to the pixel;
a gate input line electrically connected to the display driver and extending in the first direction, the gate input line comprising a scan clock line comprising a first portion and a second portion each extending in the first direction, and a scan clock bar line comprising a first portion and a second portion each extending in the first direction; and
a gate driver configured to receive a gate input signal from the gate input line, and
wherein the scan clock line and the scan clock bar line cross at least once between the first portions and the second portions of the scan clock line and the scan clock bar line.

\* \* \* \* \*